(12) United States Patent
Kanna et al.

(10) Patent No.: US 10,207,481 B2
(45) Date of Patent: Feb. 19, 2019

(54) TRANSFER FILM, METHOD FOR MANUFACTURING LAMINATE, LAMINATE, ELECTROSTATIC CAPACITANCE-TYPE INPUT DEVICE, AND IMAGE DISPLAY DEVICE

(71) Applicant: FUJIFILM Corporation, Tokyo (JP)

(72) Inventors: Shinichi Kanna, Fujinomiya (JP); Shinichi Yoshinari, Fujinomiya (JP)

(73) Assignee: FUJIFILM Corporation, Tokyo (JP)

( * ) Notice: Subject to any disclaimer, the term of this patent is extended or adjusted under 35 U.S.C. 154(b) by 13 days.

(21) Appl. No.: 15/433,623

(22) Filed: Feb. 15, 2017

(65) Prior Publication Data

US 2017/0157899 A1 Jun. 8, 2017

Related U.S. Application Data

(63) Continuation of application No. PCT/JP2015/073078, filed on Aug. 18, 2015.

(30) Foreign Application Priority Data

Aug. 28, 2014 (JP) .................................. 2014-173606

(51) Int. Cl.
*C09D 4/06* (2006.01)
*B32B 17/10* (2006.01)
(Continued)

(52) U.S. Cl.
CPC .......... *B32B 17/10743* (2013.01); *B32B 3/10* (2013.01); *B32B 3/30* (2013.01);
(Continued)

(58) Field of Classification Search
CPC .......... B41M 2205/40; B32B 2307/412; B32B 2457/208; G06F 3/044
(Continued)

(56) References Cited

U.S. PATENT DOCUMENTS

2014/0375912 A1 12/2014 Gotoh et al.
2015/0251393 A1 9/2015 Kanna et al.

FOREIGN PATENT DOCUMENTS

JP 2005-121811 A 5/2005
JP 2008-018645 A 1/2008
(Continued)

OTHER PUBLICATIONS

International Preliminary Report on Patentability dated Mar. 9, 2017 issued from the International Bureau in counterpart International Application No. PCT/JP2015/073078 with English Translation of Written Opinion.

(Continued)

*Primary Examiner* — Bruce H Hess
(74) *Attorney, Agent, or Firm* — Sughrue Mion, PLLC

(57) ABSTRACT

In a transfer film including a temporary support having a thickness of 38 μm or less; and a curable transparent resin layer disposed on the temporary support in a direct-contact manner, in which a thickness of the curable transparent resin layer is 5 μm or more, the curable transparent resin layer includes a binder polymer, a polymerizable compound, and a polymerization initiator, and a melt viscosity ηc of the curable transparent resin layer measured at 100° C. is $1.0 \times 10^3$ Pa·s or more, the temporary support and the curable transparent resin layer are in direct contact with each other, and it is possible to prevent the incorporation of air bubbles during lamination on base materials having an elevation difference; a method for manufacturing a laminate; a laminate; an electrostatic capacitance-type input device; and an image display device.

16 Claims, 10 Drawing Sheets

(51) Int. Cl.
- C08F 2/44 (2006.01)
- G06F 3/044 (2006.01)
- B32B 3/30 (2006.01)
- B32B 7/02 (2006.01)
- B32B 27/30 (2006.01)
- B32B 27/40 (2006.01)
- B32B 37/00 (2006.01)
- C09D 135/02 (2006.01)
- G03F 7/031 (2006.01)
- G03F 7/033 (2006.01)
- G03F 7/095 (2006.01)
- B32B 17/06 (2006.01)
- B32B 27/06 (2006.01)
- B32B 27/08 (2006.01)
- B32B 27/32 (2006.01)
- B32B 27/36 (2006.01)
- B32B 3/10 (2006.01)
- G03F 7/00 (2006.01)
- G03F 7/027 (2006.01)
- C08F 2/50 (2006.01)

(52) U.S. Cl.
CPC .............. *B32B 7/02* (2013.01); *B32B 17/064* (2013.01); *B32B 17/10807* (2013.01); *B32B 27/06* (2013.01); *B32B 27/08* (2013.01); *B32B 27/308* (2013.01); *B32B 27/32* (2013.01); *B32B 27/325* (2013.01); *B32B 27/36* (2013.01); *B32B 27/365* (2013.01); *B32B 27/40* (2013.01); *B32B 37/025* (2013.01); *C08F 2/44* (2013.01); *C08F 2/50* (2013.01); *C09D 4/06* (2013.01); *C09D 135/02* (2013.01); *G03F 7/0007* (2013.01); *G03F 7/027* (2013.01); *G03F 7/031* (2013.01); *G03F 7/033* (2013.01); *G03F 7/0955* (2013.01); *G06F 3/044* (2013.01); *B32B 2264/102* (2013.01); *B32B 2264/105* (2013.01); *B32B 2307/202* (2013.01); *B32B 2307/412* (2013.01); *B32B 2307/418* (2013.01); *B32B 2307/732* (2013.01); *B32B 2309/02* (2013.01); *B32B 2309/04* (2013.01); *B32B 2309/105* (2013.01); *B32B 2315/08* (2013.01); *B32B 2333/08* (2013.01); *B32B 2457/16* (2013.01); *B32B 2457/208* (2013.01); *B41M 2205/40* (2013.01); *G06F 2203/04103* (2013.01); *G06F 2203/04111* (2013.01)

(58) Field of Classification Search
USPC ........................................ 428/32.86
See application file for complete search history.

(56) References Cited

FOREIGN PATENT DOCUMENTS

| JP | 2010-072589 A | 4/2010 |
| JP | 2013-218313 A | 10/2013 |
| JP | 2014-108541 A | 6/2014 |
| JP | 2014-142834 A | 8/2014 |

OTHER PUBLICATIONS

Office Action dated Apr. 17, 2018, from the Japanese Patent Office in counterpart Japanese Application No. 2016-545447.
International Search Report of PCT/JP2015/073078 dated Nov. 10, 2015 [PCT/ISA/210].
Written Opinion of PCT/JP2015/073078 dated Nov. 10, 2015 [PCT/ISA/237].
Office Action dated May 3, 2018, from the State Intellectual Property Office of People's Republic of China in counterpart Chinese Application No. 201580045515.6.
Office Action dated Nov. 29, 2018, from the Intellectual Property Office of Taiwan in Taiwanese Application No. 104127433.
Office Action dated Dec. 11, 2018, from the Japanese Patent Office in Japanese Application No. 2016-545447.

TRANSFER FILM, METHOD FOR MANUFACTURING LAMINATE, LAMINATE, ELECTROSTATIC CAPACITANCE-TYPE INPUT DEVICE, AND IMAGE DISPLAY DEVICE

CROSS-REFERENCE TO RELATED APPLICATIONS

This application is a Continuation of PCT International Application No. PCT/JP2015/073078, filed on Aug. 18, 2015, which claims priority under 35 U.S.C. Section 119(a) to Japanese Patent Application No. 2014-173606 filed on Aug. 28, 2014. Each of the above applications is hereby expressly incorporated by reference, in its entirety, into the present application.

BACKGROUND OF THE INVENTION

1. Field of the Invention

The present invention relates to a transfer film, a method for manufacturing a laminate, a laminate, an electrostatic capacitance-type input device, and an image display device. In detail, the present invention relates to an electrostatic capacitance-type input device capable of detecting locations touched by fingers using changes in electrostatic capacitance, a laminate that can be used for the electrostatic capacitance-type input device, a transfer film that is used to manufacture the laminate, a method for manufacturing laminates using the transfer film, and an image display device including the electrostatic capacitance-type input device as a constituent element.

2. Description of the Related Art

Recently, in some of the electronic devices such as mobile phones, car navigations, personal computers, ticket vending machines, and bank terminals, a tablet-type input device is disposed on the surface of a liquid crystal display or the like, and, with reference to command images displayed on image display regions of the liquid crystal display, information corresponding to the command images can be input by touching places in which the command images are displayed with a finger, a stylus, or the like.

As the above-described input devices (touch panels), there are resistance film-type input devices, electrostatic capacitance-type input devices, and the like. However, resistance film-type input devices have a structure in which films are pressed down and shorted using a bilayer structure of a film and glass and thus have a disadvantage of a narrow operation temperature range or weakness to temporal changes.

In contrast, electrostatic capacitance-type input devices have an advantage since, simply, it is necessary to form a translucent conductive film on one substrate. As such electrostatic capacitance-type input devices, for example, there are electrostatic capacitance-type input devices in which electrode patterns are extended in mutually intersecting directions and input locations are detected by sensing changes in the electrostatic capacitance between electrodes when a finger or the like touches the input devices (for example, refer to JP2014-108541A).

In electrostatic capacitance-type input devices, a transparent film such as a transparent insulating layer or a transparent protective film for covering electrodes is formed.

Here, as smartphones or tablet PCs including an electrostatic capacitance-type touch panel on a liquid crystal or organic EL display, smartphones or tablet PCs in which reinforced glass represented by Corning's GORILLA glass is used for the front plate (the surface which a finger directly touches) have been developed and announced. In addition, smartphones or tablet PCs in which opening portions for installing pressure-sensitive (in which not electrostatic capacitance changes but pressure-sensitive mechanical mechanisms) switches are formed in a part of the front plate are commercially available. The reinforced glass has a high strength and is not easily processed, and thus, in order to form the opening portions, it is usual to form opening portions before a reinforcement treatment and then carry out the reinforcement treatment.

JP2014-108541A describes that, when a method for transferring a transparent film such as a transparent insulating layer or a transparent protective film which is intended to cover electrodes onto the electrodes from a transfer film is employed during the formation of the transparent film on a reinforced substrate having the above-described opening portions, it is possible to further prevent leakage or escape through the opening portions than cases in which a transparent film such as a transparent insulating layer or a transparent protective film for covering electrodes is formed using a coating method.

The transfer film described in JP2014-108541A is a transfer film having a temporary support, a first curable transparent resin layer, and a second curable transparent resin layer disposed adjacent to the first curable transparent resin layer in this order, in which the refractive index of the second curable transparent resin layer is higher than the refractive index of the first curable transparent resin layer and the refractive index of the second curable transparent resin layer is 1.6 or higher.

In addition, JP2014-108541A describes that the transfer film is preferably provided with a thermoplastic resin layer between the temporary support and the first curable transparent resin layer. Furthermore, JP2014-108541A describes the thermoplastic resin layer and describes that, for example, when a transparent laminate is formed by transferring the first curable transparent resin layer and the second curable transparent resin layer using the transfer film having the thermoplastic resin layer, air bubbles are not easily generated in individual elements formed by transferring the curable transparent resin layers, image unevenness and the like are not easily caused in image display devices, and excellent display characteristics can be obtained. In addition, the thermoplastic resin layer plays a role of a cushion material so as to be capable of absorbing protrusions and recesses (also including protrusions and recesses caused by images and the like which have been previously formed) on the base surface and preferably has a property of being capable of transforming in accordance with protrusions and recesses on subject surfaces. In addition, it is described that, in a case in which the layer thickness of the thermoplastic resin layer is less than 3 µm, the thermoplastic resin is not capable of sufficiently following protrusions and recesses during lamination and, in some cases, is not capable of fully absorbing protrusions and recesses on the base surface.

JP2013-218313A also describes in the same tone as JP2014-108541A that photosensitive films are preferably provided with a thermoplastic resin layer between a temporary support and a colored photosensitive resin layer (curable transparent resin layer).

SUMMARY OF THE INVENTION

The present inventors studied methods for forming a transparent film such as a transparent insulating layer or a transparent protective film using the transfer film described in JP2014-108541A or JP2013-218313A in a case in which there is an elevation difference on the base surface due to electrodes and the like and consequently found that, depending on the lamination conditions such as the height of the elevation difference, transfer films need to be provided with a thermoplastic resin layer between a temporary support and a curable transparent resin layer in order to prevent incorporation of air bubbles during lamination.

In contrast, after transfer, the thermoplastic resin layer needs to be removed from the transfer films by means of a development treatment or the like and thus, from the viewpoint of process simplification, there is a practical demand for the temporary support and the curable transparent resin layer being in direct contact with each other without providing any thermoplastic resin layers between the temporary support and the curable transparent resin layer.

An object that the present invention attempts to achieve is to provide a transfer film which includes a temporary support and a curable transparent resin layer in direct contact with each other and is capable of preventing the incorporation of air bubbles when being laminated on base materials having an elevation difference.

The present inventors found that, when the thickness of a temporary support is controlled in a specific range, the thickness of a curable transparent resin layer is controlled in a specific range, and the composition of the curable transparent resin layer and the melt viscosity ηc measured at 100° C. are controlled in specific ranges, the temporary support and the curable transparent resin layer are in direct contact with each other and it is possible to prevent the incorporation of air bubbles when transfer films are laminated on base materials having an elevation difference.

The present invention which is specific means for achieving the above-described object is as described below.

[1] A transfer film comprising: a temporary support having a thickness of 38 μm or less; and a curable transparent resin layer disposed on the temporary support in a direct-contact manner, in which a thickness of the curable transparent resin layer is 5 μm or more, the curable transparent resin layer includes a binder polymer, a polymerizable compound, and a polymerization initiator, and a melt viscosity ηc of the curable transparent resin layer measured at 100° C. is $1.0 \times 10^3$ Pa·s or more.

[2] In the transfer film according to [1], the melt viscosity ηc of the curable transparent resin layer measured at 100° C. is preferably $1.0 \times 10^3$ Pa·s to $1.0 \times 10^6$ Pa·s.

[3] In the transfer film according to [1] or [2], the melt viscosity ηc of the curable transparent resin layer measured at 100° C. is preferably $3.0 \times 10^3$ Pa·s to $1.0 \times 10^6$ Pa·s.

[4] In the transfer film according to any one of [1] to [3], the melt viscosity ηc of the curable transparent resin layer measured at 100° C. is preferably $4.0 \times 10^3$ Pa·s to $1.0 \times 10^5$ Pa·s.

[5] The transfer film according to any one of [1] to [4] preferably further comprises a second transparent resin layer on the curable transparent resin layer, in which a refractive index of the second transparent resin layer is higher than a refractive index of the curable transparent resin layer.

[6] A method for manufacturing a laminate, comprising: a step of laminating the curable transparent resin layer of the transfer film according to any one of [1] to [5] on a base material having an elevation difference so as to continuously cover at least an upper portion of an elevation constituting the elevation difference and a lower portion of the elevation, in which a thickness of the elevation constituting the elevation difference is 100 nm or more.

[7] The method for manufacturing a laminate according to [6] preferably further comprises: a step of continuously laminating the curable transparent resin layer from one direction of the base material constituting the elevation difference toward on the upper portion of the elevation constituting the elevation difference and the lower portion of the elevation; an elevation difference-ascending step of laminating the curable transparent resin layer from the lower portion of the elevation constituting the elevation difference to the upper portion of the elevation in this order; and an elevation difference-descending step of laminating the curable transparent resin layer from the upper portion of the elevation constituting the elevation difference to the lower portion of the elevation in this order.

[8] In the method for manufacturing a laminate according to [6] or [7], it is preferable that a side portion of the elevation constituting the elevation difference has an inclined structure in which the upper portion of the elevation is narrower than the lower portion of the elevation, and an angle formed by the side portion of the elevation constituting the elevation difference and the base material is 5° to 90°.

[9] In the method for manufacturing a laminate according to any one of [6] to [8], it is preferable that the elevation constituting the elevation difference includes a conductive element.

[10] In the method for manufacturing a laminate according to [9], it is preferable that the upper portion of the elevation constituting the elevation difference is an upper portion of the conductive element and the lower portion of the elevation constituting the elevation difference is the base material.

[11] In the method for manufacturing a laminate according to any one of [6] to [10], it is preferable that the base material having the elevation difference includes a transparent electrode pattern and the method further comprises a step of laminating the curable transparent resin layer on the transparent electrode pattern.

[12] In the method for manufacturing a laminate according to [11], it is preferable that, in addition to the transparent electrode pattern, an additional conductive element is included and the elevation constituting the elevation difference is the additional conductive element.

[13] In the method for manufacturing a laminate according to [11] or [12], it is preferable that the elevation constituting the elevation difference is the transparent electrode pattern.

[14] In the method for manufacturing a laminate according to any one of [11] to [13], it is preferable that the transfer film further has a second transparent resin layer on the curable transparent resin layer, a refractive index of the second transparent resin layer is higher than a refractive index of the curable transparent resin layer, and the method further comprises a step of laminating the second transparent resin layer and the curable transparent resin layer of the transfer film on the transparent electrode pattern in this order.

[15] A laminate manufactured using the method for manufacturing a laminate according to any one of [6] to [14].

[16] An electrostatic capacitance-type input device comprising: the laminate according to [15].

[17] An image display device comprising: the electrostatic capacitance-type input device according to [16] as a constituent element.

According to the present invention, it is possible to provide a transfer film which includes a temporary support and a curable transparent resin layer in direct contact with each other and is capable of preventing the incorporation of air bubbles when being laminated on base materials having an elevation difference.

BRIEF DESCRIPTION OF THE DRAWINGS

FIG. 14 is a schematic view illustrating an example of a state in which the transfer film of the present invention having first and second transparent resin layers is laminated on the transparent electrode patterns in the electrostatic capacitance-type input device by means of lamination and is yet to be cured by means of exposure or the like.

DESCRIPTION OF THE PREFERRED EMBODIMENTS

Figure 1A:
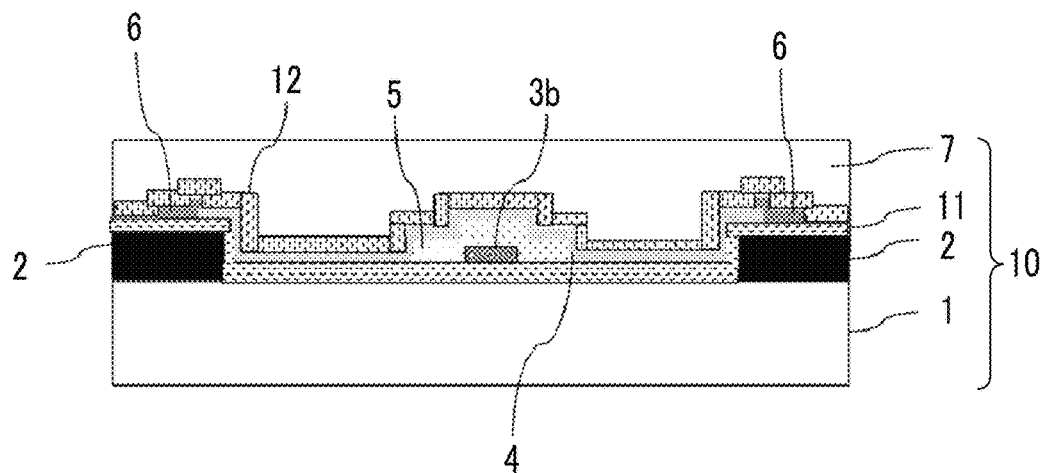
FIG. 1A is a schematic cross-sectional view illustrating an example of the constitution of an electrostatic capacitance-type input device of the present invention.

Hereinafter, a transfer film, a method for manufacturing a laminate, a laminate, an electrostatic capacitance-type input device, and an image display device of the present invention will be described. Hereinafter, constituent requirements will be described on the basis of typical embodiments or specific examples of the present invention, but the present invention is not limited to these embodiments or specific examples. Meanwhile, in the present specification, numerical ranges expressed using "to" includes numerical values before and after the "to" as the lower limit value and the upper limit value.

[Transfer Film]

A transfer film of the present invention has a temporary support having a thickness of 38 μm or less and a curable transparent resin layer disposed on the temporary support in a direct-contact manner, the thickness of the curable transparent resin layer is 5 μm or more, the curable transparent resin layer includes a binder polymer, a polymerizable compound, and a polymerization initiator, and the melt viscosity ηc of the curable transparent resin layer measured at 100° C. is $1.0 \times 10^3$ Pa·s or more.

When the above-described constitution is provided, the transfer film of the present invention has the temporary support and the curable transparent resin layer in direct contact with each other and is capable of preventing the incorporation of air bubbles when being laminated on base materials having an elevation difference. While not restricted to any theories, as long as the transfer film has a temporary support having a thickness in the above-described range and a curable transparent resin layer which is disposed on the temporary support in a direct-contact manner and has the above-described thickness, composition, and melt viscosity, in a case in which the transfer film is laminated so as to cover an elevation difference of a base material having the elevation difference of 100 nm or more, the curable transparent resin layer of the transfer film is capable of following the elevation difference within a desired range. As a result, when the transfer film of the present invention is used, it is possible to prevent the incorporation of air bubbles when the transfer film is laminated on base materials having an elevation difference.

Furthermore, the transfer film of the present invention has no problem of transparent electrode patterns being visible and is preferred since the transfer film is capable of forming laminates having a favorable patterning property. The transfer film of the present invention preferably further has a second transparent resin layer in addition to the curable transparent resin layer. When the refractive index difference between transparent electrode patterns (preferably ITO) and the second transparent resin layer and the refractive index difference between the second transparent resin layer and the curable transparent resin layer are decreased using the above-described transfer film, light reflection is alleviated and thus the transparent electrode patterns become barely visible, and it is possible to improve the visibility of the transparent electrode patterns. In addition, in a case in which any one of the first and second transparent resin layers is a water-soluble layer and the other layer is a water-insoluble layer, even when the curable transparent resin layer is laminated and then the second transparent resin layer is laminated without curing the curable transparent resin layer, layer division becomes favorable, the visibility of the transparent electrode patterns can be improved with the above-described mechanism, and, even after the refractive index-adjusted layers (that is, the first and second transparent resin layers) are transferred onto the transparent electrode patterns from the transfer film, it is possible to develop the refractive index-adjusted layers in desired patterns by means of photolithography.

Furthermore, in the transfer film of the present invention, layer division is preferably favorable.

Hereinafter, a preferred aspect of the transfer film of the present invention will be described.

Meanwhile, the transfer film of the present invention is preferably for transparent insulating layers or transparent protective layers in electrostatic capacitance-type input devices. In more detail, the transfer film of the present invention can be preferably used as a transfer film for forming the lamination patterns of the refractive index-adjusted layers and overcoat layers (transparent protective layers) on the transparent electrode patterns by means of photolithography.

<Constitution>

Figure 12:
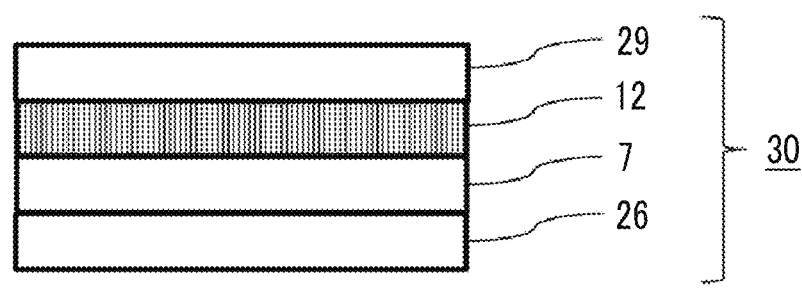
FIG. 12 is a schematic cross-sectional view illustrating an example of the constitution of a transfer film of the present invention.

FIG. 12 illustrates an example of a preferred constitution of the transfer film of the present invention. FIG. 12 is a schematic view of a transfer film 30 of the present invention in which a temporary support 26, a curable transparent resin layer 7, a second transparent resin layer 12, and a protective peeling layer (protective film) 29 are laminated together adjacent to each other in this order.

Figure 16:
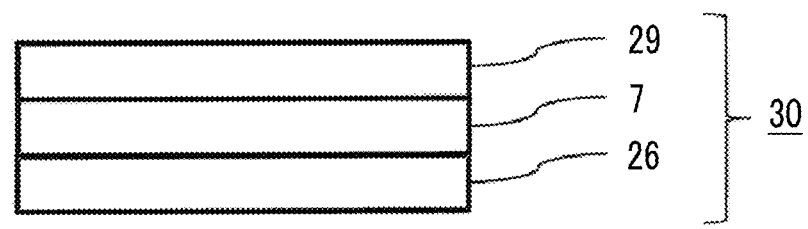
FIG. 16 is a schematic cross-sectional view illustrating another example of the constitution of the transfer film of the present invention.

FIG. 16 illustrates another example of the preferred constitution of the transfer film of the present invention. FIG. 16 is a schematic view of the transfer film 30 of the present invention in which the temporary support 26, the curable transparent resin layer 7, and the protective peeling layer (protective film) 29 are laminated together adjacent to each other in this order.

In the transfer film of the present invention, the total thickness of all of the layers is preferably 18 to 60 µm, more preferably 21 to 54 µm, and particularly preferably 24 to 50 µm. The transfer film of the present invention is capable of preventing the incorporation of air bubbles when being laminated on base materials having an elevation difference even in a case in which the total thickness of all of the layers is thin. Therefore, it becomes possible to reduce the thickness of the transfer film more than in an aspect of JP2014-108541A in which a thermoplastic resin layer having a certain thickness is provided between a temporary support and a curable transparent resin layer.

<Temporary Support>

The transfer film of the present invention has a temporary support having a thickness of 38 µm or less.

The thickness of the temporary support is preferably in a range of 5 to 35 µm and more preferably in a range of 10 to 30 µm.

Generally, since the bending stiffness of a film per unit length ($N/mm^2$) is expressed by the modulus of vertical elasticity (MPa)×the film thickness $(mm)^3/12$, thickness reduction decreases stiffness. When the bending stiffness is low, films are easily bent, and thus, in a method for manufacturing a laminate described below, a property of the temporary support following an elevation difference on base materials having the elevation difference improves, and it is possible to effectively reduce the incorporation of air bubbles.

The bending stiffness of the temporary support is preferably 0.5 to $9\times10^{-2}$ ($N/mm^2$), more preferably 1 to $8\times10^{-2}$ ($N/mm^2$), and particularly preferably 2 to $5\times10^{-2}$ ($N/mm^2$).

The modulus of vertical elasticity (the modulus of elasticity in the film longitudinal direction) of the temporary support is preferably $1\times10^3$ to $7\times10^3$ MP, more preferably $2\times10^3$ to $6\times10^3$ MP, and particularly preferably $3\times10^3$ to $6\times10^3$ MP.

In the case of a film having a modulus of vertical elasticity of $4\times10^3$ to $6\times10^3$ (MPa), when the thickness is set to 38 µm or less, the bending stiffness reaches approximately preferably $2.0\times10^{-2}$ ($N/mm^2$), and the film is easily bent.

As a material of the temporary support, it is possible to use a material which is flexible but does not significantly deform, shrink, or elongate under pressure and heat. Examples of the above-described temporary support include a polyethylene terephthalate film (hereinafter also referred to as PET), a triacetyl cellulose film, a polystyrene film, a polycarbonate film, and the like, and, among these, a biaxially stretched polyethylene terephthalate film is particularly preferred since it is easy to control the modulus of vertical elasticity to $4\times10^3$ to $6\times10^3$ (MPa).

In addition, the temporary support may be transparent and may contain a dyed silicon, an alumina sol, a chromium salt, a zirconium salt, or the like.

In addition, to the temporary support, it is possible to impart a conductive property using the method described in JP2005-221726A.

<Curable Transparent Resin Layer>

The transfer film of the present invention has a curable transparent resin layer disposed on the temporary support in a direct-contact manner, the thickness of the curable transparent resin layer is 5 µm or more, the curable transparent resin layer includes a binder polymer, a polymerizable compound, and a polymerization initiator, and the melt viscosity ηc of the curable transparent resin layer measured at 100° C. is $1.0\times10^3$ Pa·s or more.

The curable transparent resin layer may be light-curable or heat-curable and light-curable. Among these, the curable transparent resin layer is preferably a heat-curable transparent resin layer and a light-curable transparent resin layer since films are easily manufactured by transferring and then light-curing the layers and it is possible to impart reliability to films by heat-curing the layers after the manufacturing of the films.

Meanwhile, in the present specification, for the convenience in description, in a case in which the curable transparent resin layer of the transfer film of the present invention and a second transparent resin layer described below are transferred onto transparent electrode patterns and these layers lose the light-curing property after being light-cured, the layers will be continuously referred to as the curable transparent resin layer and the second transparent resin layer respectively regardless of whether or not these layer have a heat-curing property. Furthermore, there are cases in which these layers are light-cured and then heat-cured; however, even in those cases, these layers will be continuously referred to as the curable transparent resin layer and the second transparent resin layer respectively regardless of whether or not the layer have a curing property. Similarly, even in a case in which the curable transparent resin layer and the second transparent resin layer of the transfer film of the present invention are transferred onto transparent electrode patterns and these layers lose the heat-curing property after being heat-cured, the layers will be continuously referred to as the curable transparent resin layer and the second transparent resin layer respectively regardless of whether or not these layer have a light-curing property.

(Thickness)

In the transfer film of the present invention, the thickness of the curable transparent resin layer is 5 µm or more and is more preferably 5 to 16 µm, particularly preferably 5 to 13 µm, more particularly preferably 5 to 10 µm since a sufficient surface protection function is exhibited when transparent protective layers in electrostatic capacitance-type input devices are formed using the curable transparent resin layer.

In the transfer film of the present invention, the ratio of the thickness of the temporary support to the thickness of the curable transparent resin layer (the thickness of the temporary support/the thickness of the curable transparent resin layer) is preferably 0.1 to 10 times, more preferably 1 to 8 times, and particularly preferably 2 to 5 times.

(Melt Viscosity)

In the transfer film of the present invention, the melt viscosity $\eta c$ of the curable transparent resin layer measured at 100° C. is $1.0 \times 10^3$ Pa·s or more, preferably $1.0 \times 10^3$ Pa·s to $1.0 \times 10^6$ Pa·s, more preferably $3.0 \times 10^3$ Pa·s to $1.0 \times 10^6$ Pa·s, and particularly preferably $4.0 \times 10^3$ Pa·s to $1.0 \times 10^5$ Pa·s.

(Refractive Index)

In the transfer film of the present invention, the refractive index of the curable transparent resin layer is preferably 1.50 to 1.53, more preferably 1.50 to 1.52, and particularly preferably 1.51 to 1.52.

(Composition)

In the transfer film of the present invention, the curable transparent resin layer includes a binder polymer, a polymerizable compound, and a polymerization initiator.

The transfer film of the present invention may be a negative-type material or a positive-type material.

In a case in which the transfer film of the present invention is a negative-type material, the curable transparent resin layer preferably includes metal oxide particles, a binder polymer (preferably an alkali-soluble resin), a polymerizable compound, and a polymerization initiator. Furthermore, additives and the like can be used, but components in the composition are not limited thereto.

In the transfer film of the present invention, the curable transparent resin layer is a transparent resin layer. The method for controlling the refractive index of the curable transparent resin layer is not particularly limited, and it is possible to singly use a transparent resin layer having a desired refractive index, use a transparent resin layer to which particles such as metal particles or metal oxide particles are added, or use a complex of a metal salt and a high molecule.

Furthermore, in the curable transparent resin layer, additives may be used. Examples of the additives include the surfactants described in Paragraph "0017" of JP4502784B and Paragraphs "0060" to "0071" of JP2009-237362A, the thermal polymerization initiators described in Paragraph "0018" of JP4502784B, and, furthermore, other additives described in Paragraphs "0058" to "0071" of JP2000-310706A.

Hitherto, a case in which the transfer film of the present invention is a negative-type material has been mainly described, but the transfer film of the present invention may be a positive-type material. In a case in which the transfer film of the present invention is a positive-type material, for example, the material and the like described in JP2005-221726A are used in the curable transparent resin layer, but components are not limited thereto.

—Binder Polymer—

As the binder polymer included in the curable transparent resin layer, it is possible to use an arbitrary polymer component without any particular limitations; however, from the viewpoint of being used as transparent protective films in electrostatic capacitance-type input devices, a polymer component having high surface hardness and high heat resistance is preferred, and an alkali-soluble resin is more preferred, and, among alkali-soluble resins, well-known curable siloxane resin materials, acrylic resin materials, and the like are preferably used. In methods for manufacturing the transfer film, a binder polymer included in an organic solvent-based resin composition that is used to form the curable transparent resin layer preferably contains an acrylic resin, and both a binder polymer included in an organic solvent-based resin composition that is used to form the curable transparent resin layer and a resin or a binder polymer having an acid group which is included in a water-based resin composition that is used to form the second transparent resin layer described below more preferably contain an acrylic resin from the viewpoint of improving the interlaminar adhesion before and after the curable transparent resin layer and the second transparent resin layer are transferred. A preferred range of the binder polymer in the curable transparent resin layer will be specifically described.

A resin which is used for the curable transparent resin layer and is soluble in organic solvents (referred to as a binder polymer) is not particularly limited within the scope of the gist of the present invention, can be appropriately selected from well-known binder polymers, and is preferably an alkali-soluble resin, and, as the alkali-soluble resin, it is possible to use the polymers described in Paragraph "0025" of JP2011-95716A and Paragraphs "0033" to "0052" of JP2010-237589A.

In addition, the curable transparent resin layer may include polymer latex. The polymer latex mentioned herein refers to latex obtained by dispersing the fine particles of a water-insoluble polymer in water. The polymer latex is described in, for example, "Chemistry of high-molecular-weight latex (published by Kobunshi Kankokai (1973))" by Muroi Soichi.

The polymer particles that can be used are preferably polymer particles of a polymer such as an acrylic polymer, a vinyl acetate-based polymer, a rubber-based (for example, styrene-butadiene-based or chloroprene-based) polymer, an olefin-based polymer, a polyester-based polymer, a polyurethane-based polymer, or a polystyrene-based polymer or a copolymer thereof.

It is preferable to strengthen the mutual bonding force between polymer chains that constitute the polymer particles. Examples of means for strengthening the mutual bonding force between polymer chains include means for using an interaction by a hydrogen bond and methods for generating a covalent bond. Means for imparting a hydrogen bonding force is preferably the introduction of a monomer having a polar group into a polymer chain by means of copolymerization or graft polymerization. Examples of the polar group include carboxyl groups (acrylic acid, methacrylic acid, itaconic acid, fumaric acid, maleic acid, crotonic acid, partially-esterified maleic acid, and the like), primary, secondary, and tertiary amino groups, ammonium salt groups, sulfonic acid groups (styrene sulfonate), and the like, and carboxyl groups and sulfonic acid groups are particularly preferred.

A preferred range of the copolymerization proportion of the monomer having the polar group is in a range of 5% to 35% by mass, more preferably 5% to 20% by mass, and still more preferably 15% to 20% by mass with respect to 100% by mass of the polymer. Meanwhile, examples of means for generating a covalent bond include methods in which an epoxy compound, a blocked isocyanate, an isocyanate, a vinylsulfone compound, an aldehyde compound, a methylol compound, a carboxy anhydride, or the like is reacted with a hydroxyl group, a carboxyl group, a primary or secondary amino group, an acetoacetyl group, a sulfonic acid, or the like.

Among polymers for which the above-described reaction is used, polyurethane derivatives obtained by a reaction between polyols and a polyisocyanate compound are preferred, polymers for which a polyvalent amine is jointly used as a chain extender are more preferred, and, furthermore, polymers which are turned into an ionomer by introducing the polar group into a polymer chain are particularly preferred.

The mass-average molecular weight of the polymer is preferably 10,000 or more and more preferably 20,000 to 100,000. Examples of a polymer preferable for the present invention include ethylene ionomers and polyurethane ionomers which are copolymers between ethylene and methacrylic acid.

The polymer latex that can be used in the present invention may be polymer latex obtained by emulsification polymerization or polymer latex obtained by emulsification. Methods for preparing the polymer latex are described in, for example, "Emulsion Latex Handbook" (edited by the emulsion latex handbook editorial committee, published by Taiseisha Ltd. (1975)).

Examples of the polymer latex that can be used in the present invention include polymer latex obtained by ammonia-neutralizing and emulsifying an aqueous dispersion of a polyethylene ionomer (trade name: CHEMIPEARL S120, manufactured by Mitsui Chemicals, Inc., the solid content: 27%), CHEMIPEARL S100 manufactured by Mitsui Chemicals, Inc. the solid content: 27%), CHEMIPEARL S111 manufactured by Mitsui Chemicals, Inc. the solid content: 27%), CHEMIPEARL S200 manufactured by Mitsui Chemicals, Inc. the solid content: 27%), CHEMIPEARL S300 manufactured by Mitsui Chemicals, Inc. the solid content: 35%), CHEMIPEARL S650 manufactured by Mitsui Chemicals, Inc. the solid content: 27%), and CHEMIPEARL S75N manufactured by Mitsui Chemicals, Inc. the solid content: 24%), an aqueous dispersion of a polyether-based polyurethane (trade name: HYDRAN WLS-201, manufactured by DIC Corporation, the solid content: 35%, Tg-50° C.), (trade name: HYDRAN WLS-202, manufactured by DIC Corporation, the solid content: 35%, Tg-50° C.), (trade name: HYDRAN WLS-221, manufactured by DIC Corporation, the solid content: 35%, Tg-30° C.), (trade name: HYDRAN WLS-210, manufactured by DIC Corporation, the solid content: 35%, Tg-15° C.), (trade name: HYDRAN WLS-213, manufactured by DIC Corporation, the solid content: 35%, Tg-15° C.), (trade name: HYDRAN WLI-602, manufactured by DIC Corporation, the solid content: 39.5%, Tg-50° C.), (trade name: HYDRAN WLI-611, manufactured by DIC Corporation, the solid content: 39.5%, Tg-15° C.), alkyl acrylate copolymer-ammonium (trade name: JURYMER AT-210, manufactured by Nippon Kayaku Co., Ltd.), alkyl acrylate copolymer-ammonium (trade name: JURYMER ET-410, manufactured by Nippon Kayaku Co., Ltd.), alkyl acrylate copolymer-ammonium (trade name: JURYMER AT-510, manufactured by Nippon Kayaku Co., Ltd.), or polyacrylic acid (trade name: JURYMER AC-10L, manufactured by Nippon Kayaku Co., Ltd.).

—Polymerizable Compound—

The curable transparent resin layer includes a polymerizable compound. The polymerizable compound may be a photopolymerizable compound or a heat-polymerizable compound.

The curable transparent resin layer preferably has a photopolymerizable compound. Photopolymerizable groups in the photopolymerizable compound are not particularly limited, and examples thereof include ethylenic unsaturated groups, epoxy groups, and the like. The transfer film of the present invention preferably includes, as the photopolymerizable compound in the curable transparent resin layer, a compound having an ethylenic unsaturated group and more preferably includes a compound having a (meth)acryloyl group.

As the photopolymerizable compound used in the transfer film of the present invention, only one compound may be used or a combination of two or more compounds may be used, but a combination of two or more compounds is preferably used from the viewpoint of improving the heat and humid resistance after the transferred curable transparent resin layer is exposed and then imparted with saline water. As the photopolymerizable compound used in the transfer film of the present invention, a combination of a tri- or higher-functional photopolymerizable compound and a difunctional photopolymerizable compound is preferably used from the viewpoint of improving the heat and humid resistance after the transferred curable transparent resin layer is exposed and then imparted with saline water. The proportion of the difunctional photopolymerizable compound used in all of the photopolymerizable compounds is preferably in a range of 10% to 90% by mass, more preferably in a range of 20% to 85% by mass, and particularly preferably in a range of 30% to 80% by mass. The proportion of the tri- or higher-functional photopolymerizable compound used in all of the photopolymerizable compounds is preferably in a range of 10% to 90% by mass, more preferably in a range of 15% to 80% by mass, and particularly preferably in a range of 20% to 70% by mass. The transfer film of the present invention preferably includes, as the photopolymerizable compounds, at least a compound having two ethylenic unsaturated groups and a compound having at least three ethylenic unsaturated groups and more preferably includes at least a compound having two (meth)acryloyl groups and a compound having at least three ethylenic (meth)acryloyl groups.

In addition, the transfer film of the present invention preferably includes, as the photopolymerizable compound, an urethane (meth)acrylate compound. The amount of the urethane (meth)acrylate compound mixed is preferably 10% by mass or more and more preferably 20% by mass or more of all of the photopolymerizable compounds. In the urethane (meth)acrylate compound, the number of functional groups as the photopolymerizable groups is preferably three or more and more preferably four or more.

The photopolymerizable compound having a difunctional ethylenic unsaturated group is not particularly limited as long as the compound has two ethylenic unsaturated groups in the molecule, and commercially available (meth)acrylate compounds can be used. For example, it is possible to preferably use tricyclodecane dimethanol diacrylate (A-DCP, manufactured by Shin-Nakamura Chemical Co., Ltd.), tricyclodecane dimethanol dimethacrylate (DCP, manufactured by Shin-Nakamura Chemical Co., Ltd.), 1,9- nonanediol diacrylate (A-NOD-N, manufactured by Shin-Nakamura Chemical Co., Ltd.), 1,6-hexanediol diacrylate (A-HD-N, manufactured by Shin-Nakamura Chemical Co., Ltd.), and the like.

The photopolymerizable compound having a tri- or higher-functional ethylenic unsaturated group is not particularly limited as long as the compound has three or more ethylenic unsaturated groups in the molecule, and, for example, it is possible to use (meth)acrylate compounds having a skeleton such as dipentaerythritol (tri/tetra/penta/hexa)acrylates, pentaerythritol (tri/tetra)acrylates, trimethylolpropane triacrylate, ditrimethylolpropane tetraacrylate, and isocyanurate acrylate, and (meth)acrylate compounds having a long span length between (meth)acrylates are preferred. Specifically, it is possible to preferably use the caprolactone-modified compounds (KAYARAD DPCA manufactured by Nippon Kayaku Co., Ltd., A-9300-1CL manufactured by Shin-Nakamura Chemical Co., Ltd., and the like) and the alkylene oxide-modified compounds (KAYARAD RP-1040 manufactured by Nippon Kayaku Co., Ltd., ATM-35E and A-9300 manufactured by Shin-Nakamura Chemical Co., Ltd., EBECRYL 135 manufactured by Daicel-Allnex Ltd., and the like) of the above-described (meth)acrylate compounds having a skeleton such as dipentaerythritol (tri/tetra/penta/hexa)acrylates, pentaerythritol (tri/tetra)acrylates, trimethylolpropane triacrylate, ditrimethylolpropane tetraacrylate, and isocyanurate acrylate. In addition, it is possible to preferably use carboxyl group-containing polybasic acid-modified (meth)acrylate monomers (ARONIX M-510 and M-520 manufactured by Toagosei Co., Ltd. and the like). In addition, it is preferable to use tri- or higher-functional urethane (meth)acrylates. As the tri- or higher-functional urethane (meth)acrylates, it is possible to preferably use 8UX-015A (manufactured by Taisei Fine Chemical Co., Ltd.), UA-32P (manufactured by Shin-Nakamura Chemical Co., Ltd.), UA-1100H (manufactured by Shin-Nakamura Chemical Co., Ltd.), and the like.

The average molecular weight of the photopolymerizable compound used in the transfer film of the present invention is preferably 200 to 3,000, more preferably 250 to 2,600, and particularly preferably 280 to 2,200.

As the heat-polymerizable compound, it is possible to preferably use, out of the photopolymerizable compounds, a compound which is also a heat-polymerizable compound.

In the curable transparent resin layer, the ratio of the polymerizable compound to the binder polymer (the content M of the polymerizable compound/the content B of the binder polymer) is 0.1 to 2 times, more preferably 0.2 to 1.5 times, and particularly preferably 0.3 to 1 time.

—Polymerization Initiator—

The curable transparent resin layer includes a polymerization initiator. The polymerization initiator may be a photopolymerization initiator or a heat-polymerization initiator.

The curable transparent resin layer preferably has a photopolymerization initiator. When the curable transparent resin layer includes the photopolymerizable compound and the photopolymerization initiator, it is possible to facilitate the formation of the patterns of the curable transparent resin layer.

As the photopolymerization initiator that is used in organic solvent-based resin compositions, it is possible to use the photopolymerization initiators described in Paragraphs "0031" to "0042" of JP2011-95716A. For example, it is possible to preferably use 1,2-octane dione, 1-[4-(phenylthio)-, 2-(O-benzoyloxime)] (trade name: IRGACURE OXE-01, manufactured by BASF), additionally, ethanone, 1-[9-ethyl-6-(2-methylbenzoyl)-9H-carvazole-3-yl]-, 1-(O-acetyloxime) (trade name: IRGACURE OXE-02, manufactured by BASF), 2-[dimethylamino]-2-[(4-methylphenyl)methyl]-1-[4-(4-morpholinyl)phenyl]-1-butanone (trade name: IRGACURE 379EG, manufactured by BASF), 2-methyl-1-(4-methylthiophenyl)-2-methyl-propane-1-on (trade name: IRGACURE 907, manufactured by BASF), 2-hydroxy-1-{4-[4-(2-hydroxy-2-methyl-propionyl)-benzyl]phenyl}-2-methyl-propane-1-on (trade name: IRGACURE 127, manufactured by BASF), 2-benzyl-2-dimethylamino-1-(4-morpholinophenyl)-butanone-1 (trade name: IRGACURE 369, manufactured by BASF), 2-hydroxy-2-methyl-1-phenyl-erypropane-1-on (trade name: IRGACURE 1173, manufactured by BASF), 1-hydroxy-cyclohexyl-phenyl-ketone (trade name: IRGACURE 184, manufactured by BASF), 2,2-dimethoxy-1,2-diphenyl ethane-1-on (trade name: IRGACURE 651, manufactured by BASF), oxime ester-based polymerization initiators (trade name: Lunar 6, manufactured by DKSH Japan K.K.), and the like.

As the heat-polymerization initiator, it is possible to preferably use the heat-polymerization initiators described in Paragraphs "0193" to "0195" of JP2011-32186A, and the content of the publication can be incorporated into the present specification.

In the curable transparent resin layer, the content of the polymerization initiator is 1% by mass or more and more preferably 2% by mass or more of the curable transparent resin layer. In the curable transparent resin layer, the content of the polymerization initiator is 10% by mass or less and more preferably 5% by mass or less of the curable transparent resin layer from the viewpoint of improving the patterning property and substrate adhesiveness of a transparent laminate of the present invention.

—Metal Oxide Particles—

The curable transparent resin layer may or may not include particles (preferably metal oxide particles) for the purpose of adjusting the refractive index or the light transmittance. In order to control the refractive index of the curable transparent resin layer in the above-described range, it is possible to add metal oxide particles in an arbitrary proportion depending on the kind of the polymer or the polymerizable compound being used. In the curable transparent resin layer, the content of the metal oxide particles is preferably 0% to 35% by mass, more preferably 0% to 10% by mass, and particularly preferably 0% by mass of the curable transparent resin layer.

Since the metal oxide particles are highly transparent and light-transmissible, it is possible to obtain positive-type curable resin compositions having a high refractive index and excellent transparency.

The refractive index of the metal oxide particles is preferably higher than the refractive index of a composition made of a material obtained by removing the particles from the curable transparent resin layer.

Meanwhile, the metal of the above-described metal oxide particles may also be a semi-metal such as B, Si, Ge, As, Sb, or Te.

The metal oxide particles which are light-transmissible and have a high refractive index are preferably oxide particles including atoms such as Be, Mg, Ca, Sr, Ba, Sc, Y, La, Ce, Gd, Tb, Dy, Yb, Lu, Ti, Zr, Hf, Nb, Mo, W, Zn, B, Al, Si, Ge, Sn, Pb, Sb, Bi, and Te, more preferably titanium oxide, a titanium complex oxide, zinc oxide, zirconium oxide, indium/tin oxides, or antimony/tin oxide, still more preferably titanium oxide, a titanium complex oxide, or zirconium oxide, particularly preferably titanium oxide or zirconium oxide, and most preferably titanium dioxide. Particularly, rutile-type titanium dioxide having a high refractive index is preferred. The surfaces of these metal oxide particles can also be treated with an organic material in order to impart dispersion stability.

From the viewpoint of the transparency of the curable transparent resin layer, the average primary particle diameter of the metal oxide particles is preferably 1 to 200 nm and particularly preferably 3 to 80 nm. Here, the average primary particle diameter of particles refers to the arithmetic average of the particles obtained by measuring the particle diameters of 200 arbitrary particles using an electronic microscope. In a case in which the shape of the particle is not spherical, the longest side is considered as the diameter.

In addition, only one kind of the metal oxide particles may be used or two or more kinds of the metal oxide particles can be jointly used.

In the transfer film of the present invention, the curable transparent resin layer preferably has at least one of $ZrO_2$ particles, $Nb_2O_5$ particles, or $TiO_2$ particles from the viewpoint of controlling the refractive index in the range of the refractive index of the curable transparent resin layer and more preferably has $ZrO_2$ particles and $Nb_2O_5$ particles.

<Second Transparent Resin Layer>

The transfer film of the present invention preferably further has a second transparent resin layer on the curable transparent resin layer and more preferably has a second transparent resin layer disposed adjacent to the curable transparent resin layer.

It is preferable that the transfer film of the present invention further has a second transparent resin layer on the curable transparent resin layer and the refractive index of the second transparent resin layer is higher than the refractive index of the curable transparent resin layer.

The second transparent resin layer may be heat-curable, light-curable, or heat-curable and light-curable. Among these, the second transparent resin layer is preferably at least a heat-curable transparent resin layer since the second transparent resin layer is heat-cured after being transferred and thus is capable of imparting the reliability of films and more preferably a heat-curable transparent resin layer and a light-curable transparent resin layer since the second transparent resin layer is light-cured after being transferred and thus facilitates film production and is heat-cured after film production and thus is capable of imparting the reliability of films.

(Refractive Index)

In the transfer film of the present invention, the refractive' index of the second transparent resin layer is more preferably higher than the refractive index of the curable transparent resin layer.

When the refractive index difference between transparent electrode patterns (preferably ITO) and the second transparent resin layer and the refractive index difference between the second transparent resin layer and the curable transparent resin layer are decreased, light reflection is alleviated and thus the transparent electrode patterns become barely visible, and it is possible to improve the visibility of the transparent electrode patterns. In addition, even when the curable transparent resin layer is laminated and then the second transparent resin layer is laminated without curing the curable transparent resin layer, layer division becomes favorable, the visibility of the transparent electrode patterns can be improved with the above-described mechanism, and, after the refractive index-adjusted layers (that is, the curable transparent resin layer and the second transparent resin layer) are transferred onto the transparent electrode patterns from the transfer film, it is possible to develop the refractive index-adjusted layers in desired patterns by means of photolithography. Meanwhile, the layer division between the curable transparent resin layer and the second transparent resin layer is favorable, the refractive index adjustment effect of the above-described mechanism is likely to be sufficient, and the improvement of the visibility of the transparent electrode patterns is likely to be sufficient.

In the transfer film of the present invention, the refractive index of the second transparent resin layer is preferably 1.60 or higher.

Meanwhile, the refractive index of the second transparent resin layer needs to be adjusted using the refractive indexes of the transparent electrode patterns, and the upper limit value of the values is not particularly limited, but is preferably 2.1 or lower and more preferably 1.78 or lower, and may be 1.74 or lower.

Particularly, in a case in which the refractive indexes of the transparent electrode patterns exceed 2.0 as in the case of an oxide of In and Zn (IZO), the refractive index of the second transparent resin layer is preferably 1.7 or higher and 1.85 or lower.

(Thickness)

In the transfer film of the present invention, the film thickness of the second transparent resin layer is 500 nm or less and is more preferably 110 nm or less. The film thickness of the second transparent resin layer is preferably 20 nm or more. The film thickness of the second transparent resin layer is particularly preferably 55 to 100 nm, more particularly preferably 60 to 100 nm, and still more particularly preferably 70 to 100 nm.

(Composition)

The transfer film of the present invention may be a negative-type material or a positive-type material.

In a case in which the transfer film of the present invention is a negative-type material, the second transparent resin layer preferably includes metal oxide particles, a binder polymer (preferably an alkali-soluble resin), a polymerizable compound, and a polymerization initiator. Furthermore, additives and the like can be used, but components in the composition are not limited thereto.

In the transfer film of the present invention, the second transparent resin layer preferably includes a binder polymer, a photopolymerizable compound, and a photopolymerization initiator.

In the transfer film of the present invention, the second transparent resin layer is a transparent resin layer. The method for controlling the refractive index of the second transparent resin layer is not particularly limited, and it is possible to singly use a transparent resin layer having a desired refractive index, use a transparent resin layer to which particles such as metal particles or metal oxide particles are added, or use a complex of a metal salt and a high molecule.

Furthermore, in the second transparent resin layer, additives may be used. Examples of the additives include the surfactants described in Paragraph "0017" of JP4502784B and Paragraphs "0060" to "0071" of JP2009-237362A, the thermal polymerization initiators described in Paragraph "0018" of JP4502784B, and, furthermore, other additives described in Paragraphs "0058" to "0071" of JP2000-310706A.

Hitherto, a case in which the transfer film of the present invention is a negative-type material has been mainly described, but the transfer film of the present invention may be a positive-type material. In a case in which the transfer film of the present invention is a positive-type material, for example, the material and the like described in JP2005-221726A are used in the second transparent resin layer, but components are not limited thereto.

—Ammonium Salt of Monomer Having Acid Group or Ammonium Salt of Resin Having Acid Group—

The second transparent resin layer preferably includes an ammonium salt of a monomer having an acid group or an ammonium salt of a resin having an acid group.

The ammonium salt of a monomer having an acid group or the ammonium salt of a resin having an acid group is not particularly limited.

The ammonium salt of a monomer having an acid group or the ammonium salt of a resin having an acid group in the second transparent resin layer is preferably an acrylic monomer having an acid group or an ammonia salt of an acrylic resin.

It is preferable to include a step of preparing a water-based resin composition including a monomer having an acid group or a resin having an acid group in which the monomer or the resin is dissolved in an ammonia aqueous solution and at least some of the acid groups are turned into ammonium salts.

—Resin Having Acid Group—

The monomer having an acid group or the resin having an acid group is preferably a resin having an acid group and more preferably a resin having a monovalent acid group (a carboxyl group or the like). The binder polymer in the second transparent resin layer is particularly preferably a binder polymer having a carboxyl group.

A resin which is used for the second transparent resin layer and is soluble in water-based solvents (preferably water or a solvent mixture of a lower alcohol having 1 to 3 carbon atoms and water) is not particularly limited within the scope of the gist of the present invention and can be appropriately selected from well-known binder polymers.

A resin having an acid group which is used for the second transparent resin layer is preferably an alkali-soluble resin. The alkali-soluble resin can be appropriately selected from alkali-soluble resins having at least one group that accelerates the alkali solubility (that is, an acid group: for example, a carboxyl group, a phosphate group, a sulfonate group, or the like) in a molecule (preferably a molecule having an acrylic copolymer or a styrene-based copolymer as the main chain) which are linear organic high-molecular-weight polymers. Among these, alkali-soluble resins which are soluble in organic solvents and can be developed using a weak alkaline aqueous solution are more preferred. The acid group is preferably a carboxyl group.

To the manufacturing of the alkali-soluble resin, it is possible to apply, for example, a method in which a well-known radical polymerization method is used. The polymerization conditions such as the temperature, the pressure, the kind and amount of radical initiators, and the kind of solvents for manufacturing the alkali-soluble resin using a radical polymerization method can be easily designed by persons skilled in the art, and it is also possible to experimentally specify the conditions.

The linear organic high-molecular-weight polymer is preferably a polymer having a carboxylic acid in the side chain. Examples thereof include poly(meth)acrylates, methacrylic acid copolymers, acrylic acid copolymers, itaconic acid copolymers, crotonic acid copolymers, maleic acid copolymers such as styrene/maleic acid, partially-esterified maleic acid copolymers, and the like, which are described in individual publications of JP1984-44615A (JP-S59-44615A), JP1979-34327B (JP-S54-34327B), JP1983-12577B (JP-S58-12577B), JP1979-25957B (JP-S54-25957B), JP1984-53836A (JP-S59-53836A), JP1984-71048A (JP-S59-71048A), JP1971-2121A (JP-S46-2121A), and JP1981-40824B (JP-S56-40824B) and, furthermore, acidic cellulose derivatives having a carboxylic acid in the side chain such as carboxyalkyl cellulose and carboxyalkyl starch, polymers obtained by adding an acid anhydride to a polymer having a hydroxyl group, and the like, and, furthermore, high-molecular-weight polymers having a reactive functional group such as a (meth)acryloyl group in the side chain are also preferred.

Among these, particularly, benzyl (meth)acrylate/(meth)acrylate copolymers or multicomponent compolymers made of benzyl (meth)acrylate/(meth)acrylic acid/other monomers are preferred.

Additionally, polymers obtained by copolymerizing 2-hydroxyethylmethacrylate are also useful. An arbitrary amount of the polymer can be mixed and used.

Additionally, examples thereof include 2-hydroxypropyl (meth)acrylate/polystyrene macromonomer/benzyl methacrylate/methacrylate copolymers, 2-hydroxy-3-phenoxypropyl acrylate/polymethyl methacrylate macromonomer/benzyl methacrylate/methacrylate copolymers, 2-hydroxyethyl methacrylate/polystyrene macromonomer/methyl methacrylate/methacrylate copolymers, 2-hydroxyethyl methacrylate/polystyrene macromonomer/benzyl methacrylate/methacrylate copolymers, and the like which are described in JP1995-140654A (JP-H07-140654A).

Regarding the specific constitutional unit of the alkali-soluble resin, particularly, copolymers of (meth)acrylic acid and an additional monomer capable of being copolymerized with (meth)acrylic acid are preferred.

Examples of the additional monomer capable of being copolymerized with (meth)acrylic acid include alkyl (meth)acrylates, aryl (meth)acrylates, vinyl compounds, and the like. Here, hydrogen atoms in alkyl groups and aryl groups may be substituted with substituents.

Specific examples of alkyl (meth)acrylate and aryl (meth)acrylate include methyl (meth)acrylates, ethyl (meth)acrylates, propyl (meth)acrylates, butyl (meth)acrylates, isobutyl (meth)acrylates, pentyl (meth)acrylates, hexyl (meth)acrylates, octyl (meth)acrylates, phenyl (meth)acrylates, benzyl acrylates, tolyl acrylates, naphthyl acrylates, cyclohexyl acrylates, and the like.

In addition, examples of the vinyl compounds include styrene, α-methyl styrene, vinyl toluene, glycidyl methacrylate, acrylonitrile, vinyl acetate, N-vinyl pyrrolidone, tetrahydrofurfuryl methacrylate, polystyrene macromonomers, polymethyl methacrylate macromonomers, $CH_2=CR^1R^2$, $CH_2=C(R^1)(COOR^3)$ [here, $R^1$ represents a hydrogen atom or an alkyl group having 1 to 5 carbon atoms, $R^2$ represents an aromatic hydrocarbon ring having 6 to 10 carbon atoms, and $R^3$ represents an alkyl group having 1 to 8 carbon atoms or an aralkyl group having 6 to 12 carbon atoms.], and the like.

The additional monomer capable of being copolymerized with (meth)acrylic acid can be used singly or a combination of two or more monomers capable of being copolymerized with (meth)acrylic acid can be used. A preferred monomer capable of being copolymerized with (meth)acrylic acid is at least one selected from $CH_2=CR^1R^2$, $CH_2=C(R^1)(COOR^3)$, phenyl (meth)acrylates, benzyl (meth)acrylates, and styrene and particularly preferably $CH_2=CR^1R^2$ and/or $CH_2=C(R^1)(COOR^3)$.

Additionally, examples thereof include resins having an ethylenic unsaturated double bond introduced into a linear high molecule which are obtained by reacting a (meth)acrylic compound having a reactive functional group, cinnamic acid, or the like with the linear high molecule having a substituent capable of reacting with this reactive functional group. Examples of the reactive functional group include a hydroxyl group, a carboxyl group, an amino group, and the like, and examples of the substituent capable of reacting with this reactive functional group include an isocyanate group, an aldehyde group, an epoxy group, and the like.

Among these, acrylic resins having an acid group are preferred as the resin having an acid group. Meanwhile, in the present specification, acrylic resins refer to both methacrylic resins and acrylic resins, and, similarly, (meth)acrylic resins refers to methacrylic resins and acrylic resins.

—Monomer Having Acid Group—

As the monomer having an acid group, it is possible to preferably use an acrylic monomer such as (meth)acrylic acid, a derivative thereof, or the following monomer.

Examples thereof include tri- or tetrafunctional radical polymerizable monomers (monomers obtained by introducing a carboxylic acid group into a pentaerythritol tri- and tetraacrylates [PETA] skeleton (acid value=80 to 120 mgKOH/g)), octa- or hexafunctional radical polymerizable monomers (monomers obtained by introducing a carboxylic acid group into a dipentaerythritol penta- and hexaacrylates [DPHA] skeleton (acid value=25 to 70 mgKOH/g)), and the like. Specific titles are not described; however, as necessary, bifunctional alkali-soluble radical polymerizable monomers may also be used.

Additionally, it is possible to preferably use the monomers having an acid group described in "0025" to "0030" of JP2004-239942A, the content of which is incorporated into the present invention.

Among these, acrylic monomers such as (meth)acrylic acids or derivatives thereof can be more preferably used. Meanwhile, in the present specification, acrylic monomers refer to both methacrylic monomers and acrylic monomers.

—Other Binder Polymers—

Other binder polymers having no acid group which can be used in the second transparent resin layer are not particularly limited, and it is possible to use binder polymers that can be used in organic solvent-based resin compositions which are used to form the curable transparent resin layer.

—Polymerizable Compound—

The second transparent resin layer preferably includes a polymerizable compound such as the above-described photopolymerizable compound or heat-polymerizable compound since the second transparent resin layer is cured and thus increases the strength or the like of films. The second transparent resin layer more preferably includes a photopolymerizble compound other than the above-described monomer having an acid group.

As the polymerizable compound that can be used for the second transparent resin layer, it is possible to use the polymerizble compounds described in Paragraphs "0023" and "0024" of JP4098550B. Among these, pentaerythritol tetraacrylate, pentaerythritol triacrylate, and tetraacryaltes of a pentaerythritol ethylene oxide (EO) adduct can be preferably used. These polymerizable compounds may be singly used or multiple polymerizable compounds may be jointly used. In a case in which a mixture of pentaerythritol tetraacrylate and pentaerythritol triacrylate is used, the percentage of pentaerythritol triacrylate is preferably 0% to 80% and more preferably 10% to 60% in terms of the mass ratio.

Specific examples of the photopolymerizable compound that can be used for the second transparent resin layer include water-soluble polymerizable compounds represented by Structural Formula 1 below, pentaerythritol tetraacrylate mixtures (NK ester A-TMMT manufactured by Shin-Nakamura Chemical Co., Ltd., containing approximately 10% of triacrylate as an impurity), mixtures of pentaerythritol tetraacrylate and triacrylate (NK ester A-TMM3LM-N manufactured by Shin-Nakamura Chemical Co., Ltd., 37% triacrylate), mixtures of pentaerythritol tetraacrylate and triacrylate (NK ester A-TMM-3L manufactured by Shin-Nakamura Chemical Co., Ltd., 55% triacrylate), mixtures of pentaerythritol tetraacrylate and triacrylate (NK ester A-TMM3 manufactured by Shin-Nakamura Chemical Co., Ltd., 57% triacrylate), tetraacrylates of a pentaerythritol ethylene oxide (EO) adduct (KAYARAD RP-1040 manufactured by Nippon Kayaku Co., Ltd.), and the like.

Among these, as the polymerizable compound that can be used for the second transparent resin layer, it is possible to preferably use water-soluble polymerizable compounds represented by Structural Formula 1 below, pentaerythritol tetraacrylate mixtures (NK ester A-TMMT manufactured by Shin-Nakamura Chemical Co., Ltd., containing approximately 10% of triacrylate as an impurity), mixtures of pentaerythritol tetraacrylate and triacrylate (NK ester A-TMM3LM-N manufactured by Shin-Nakamura Chemical Co., Ltd., 37% triacrylate), and mixtures of pentaerythritol tetraacrylate and triacrylate (NK ester A-TMM-3L manufactured by Shin-Nakamura Chemical Co., Ltd., 55% triacrylate) from the viewpoint of improving the reticulation of the transfer film.

Structural Formula 1

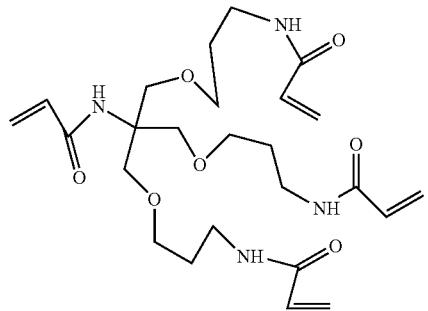

Additionally, regarding the photopolymerizable compound that can be used for the second transparent resin layer, as polymerizable compounds that are soluble in water or solvent mixture of a lower alcohol having 1 to 3 carbon atoms and water, it is possible to preferably use monomers having a hydroxyl group and monomers having an ethylene oxide or a polypropylene oxide and a phosphate group in the molecule.

Examples of the heat-polymerizable compound that can be used for the second transparent resin layer are the same as the examples of the heat-polymerizable compounds that can be used for the curable transparent resin layer.

—Polymerization Initiator—

The second transparent resin layer preferably includes a polymerization initiator. The polymerization initiator may be a photopolymerization initiator or a heat-polymerization initiator.

The second transparent resin layer preferably has a photopolymerization initiator. As the photopolymerization initiator which can be used for the second transparent resin layer and is soluble in water or solvent mixtures of a lower alcohol having 1 to 3 carbon atoms and water, it is possible to use IRGACURE 2959 or initiators represented by Structural Formula 2 below.

Examples of the heat-polymerizable compound that can be used for the second transparent resin layer are the same as the examples of the heat-polymerizable compounds that can be used for the curable transparent resin layer.

Structural Formula 2

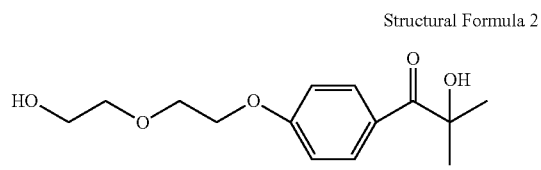 [SMILES: CC(C)(O)C(=O)c1ccc(OCCOCCO)cc1]

—Metal Oxide Particles—

The second transparent resin layer may or may not include particles (preferably metal oxide particles) for the purpose of adjusting the refractive index or the light transmittance, but preferably includes metal oxide particles from the viewpoint of controlling the refractive index of the second transparent resin layer in the above-described range. To the second transparent resin layer, it is possible to add metal oxide particles in an arbitrary proportion depending on the kind of the polymer or the polymerizable compound being used, and, in the second transparent resin layer, the content of the metal oxide particles is preferably 40% to 95% by mass, more preferably 55% to 95% by mass, particularly preferably 62% to 90% by mass from the viewpoint of improving cracks in the transfer film, more particularly preferably 62% to 75% by mass from the viewpoint of further improving cracks in the transfer film and improving the substrate adhesiveness of the transparent laminate of the present invention, and still more particularly preferably 62% to 70% by mass of the second transparent resin layer.

The refractive index of the metal oxide particles is preferably higher than the refractive index of a composition made of a material obtained by removing the particles from the second transparent resin layer. Specifically, in the transfer film of the present invention, the second transparent resin layer more preferably contains particles having a refractive index of 1.50 or higher, still more preferably contains particles having a refractive index of 1.55 or higher, particularly preferably contains particles having a refractive index of 1.70 or higher, and most preferably contains particles having a refractive index of 1.90 or higher with respect to light rays having wavelengths of 400 to 750 nm.

Here, the refractive index being 1.50 or higher with respect to light rays having wavelengths of 400 to 750 nm means that the average refractive index is 1.50 or higher with respect to light having wavelengths in the above-described range, and the refractive index are not necessarily 1.50 or higher with respect to all of the light rays having wavelengths in the above-described range. In addition, the average refractive index refers to a value obtained by dividing the total of the measurement values of the refractive indexes of individual light rays having wavelengths in the above-described range by the number of measurement points.

In addition, only one kind of the metal oxide particles may be used or two or more kinds of the metal oxide particles can be jointly used.

In the transfer film of the present invention, the second transparent resin layer preferably has at least one of $ZrO_2$ particles, $Nb_2O_5$ particles, or $TiO_2$ particles from the viewpoint of controlling the refractive index in the range of the refractive index of the second transparent resin layer and more preferably has $ZrO_2$ particles and $Nb_2O_5$ particles.

<Third Curable Transparent Resin Layer>

The transfer film of the present invention may be further provided with a third curable transparent resin layer on the second transparent resin layer.

In a case in which the second transparent resin layer is water-soluble, the third curable transparent resin layer is preferably water-insoluble, and, in a case in which the second transparent resin layer is water-insoluble, the third curable transparent resin layer is preferably water-soluble.

The refractive index of the third curable transparent resin layer is preferably 1.60 or higher.

Meanwhile, the upper limit value of the refractive index of the third curable transparent resin layer is not particularly limited, but is practically preferably 1.78 or less and may be 1.74 or less.

In the transfer film of the present invention, the film thickness of the third curable transparent resin layer is 500 nm or less and is more preferably 110 nm or less. The thickness of the third curable transparent resin layer is preferably 55 to 100 nm, more particularly preferably 60 to 100 nm, and still more particularly preferably 70 to 100 nm.

In the transfer film of the present invention, the third curable transparent resin layer preferably includes the above-described polymerizable compound since the third curable transparent resin layer is cured and thus increases the strength or the like of films.

The third curable transparent resin layer may or may not include particles, but preferably includes metal oxide particles from the viewpoint of controlling the refractive index of the third curable transparent resin layer in the above-described range. To the third curable transparent resin layer, it is possible to add metal oxide particles in an arbitrary proportion depending on the kind of the polymer or the polymerizable compound being used, and, in the third curable transparent resin layer, the content of the metal oxide particles is preferably 40 to 95% by mass, more preferably 55 to 95% by mass, particularly preferably 82 to 90% by mass of the solid content of the third curable transparent resin layer.

[Protective Film]

The transfer film of the present invention is preferably further provided with a protective film (hereinafter, also referred to as the "protective peeling layer") on the surface of the second transparent resin layer.

As the protective film, it is possible to appropriately use the protective film described in Paragraphs "0083" to "0087" and "0093" of JP2006-259138A.

<Method for Manufacturing Transfer Film>

The transfer film of the present invention can be produced according to the method for producing a curable transfer material described in Paragraphs "0094" to "0098" of JP2006-259138A. The transfer film of the present invention is preferably manufactured using a method for manufacturing a transfer film described below.

The method for manufacturing a transfer film has a step of forming a curable transparent resin layer on a temporary support and a step of directly forming a second transparent resin layer on the curable transparent resin layer, and it is preferable that any one of the curable transparent resin layer and the second transparent resin layer is formed by applying a coating fluid including water or a solvent mixture in which the content ratio of water to an alcohol having 1 to 3 carbon atoms is 58/42 to 100/0 in terms of the mass ratio, the other layer is formed by applying a coating fluid including an organic solvent, the refractive index of the second transparent resin layer is higher than the refractive index of the curable transparent resin layer, and the refractive index of the second transparent resin layer is 1.6 or higher.

The above-described constitution clarifies the interface between the curable transparent resin layer and the second transparent resin layer and thus is capable of further improving the visibility of transparent electrode patterns. In addition, any one of the first and second transparent resin layers is formed by applying a coating fluid including water or a solvent mixture in which the content ratio of water to an alcohol having 1 to 3 carbon atoms is 58/42 to 100/0 in terms of the mass ratio, and the other layer is formed by applying a coating fluid including an organic solvent, whereby, even when the curable transparent resin layer is laminated and then the second transparent resin layer is laminated without curing the curable transparent resin layer, layer division becomes favorable, the visibility of the transparent electrode patterns can be improved, and, even after the refractive index-adjusted layers (that is, the first and second transparent resin layers) are transferred onto the transparent electrode patterns from the transfer film, it is possible to develop the refractive index-adjusted layers in desired patterns by means of photolithography.

The method for manufacturing a transfer film preferably further includes a step of forming a thermoplastic resin layer before the formation of the curable transparent resin layer on the temporary support.

The method for manufacturing a transfer film preferably further includes a step of forming an interlayer between the thermoplastic resin layer and the curable transparent resin layer after the step of forming the thermoplastic resin layer. Specifically, in a case in which the above-described photosensitive film having an interlayer is formed, a solution obtained by dissolving additives together with a thermoplastic organic high molecule (a coating fluid for the thermoplastic resin layer) is applied and dried on a temporary support, thereby providing a thermoplastic resin layer, then, a preparation solution prepared by adding a resin or additives to a solvent that does not dissolve the thermoplastic resin layer (a coating solution for the interlayer) is applied and dried on the thermoplastic resin layer, thereby laminating an interlayer, and furthermore, a coating fluid for a colored photosensitive resin layer prepared using a solvent that does not dissolves the interlayer is applied and dried on the interlayer, thereby laminating a colored photosensitive resin layer, whereby a transfer film can be preferably produced.

[Method for Manufacturing Laminate]

A method for manufacturing a laminate of the present invention includes a step of laminating the curable transparent resin layer of the transfer film of the present invention on a base material having an elevation difference so as to continuously cover at least the upper portion of the elevation constituting the elevation difference and the lower portion of the elevation, and the thickness of the elevation constituting the elevation difference is 100 nm or more.

Figure 17:
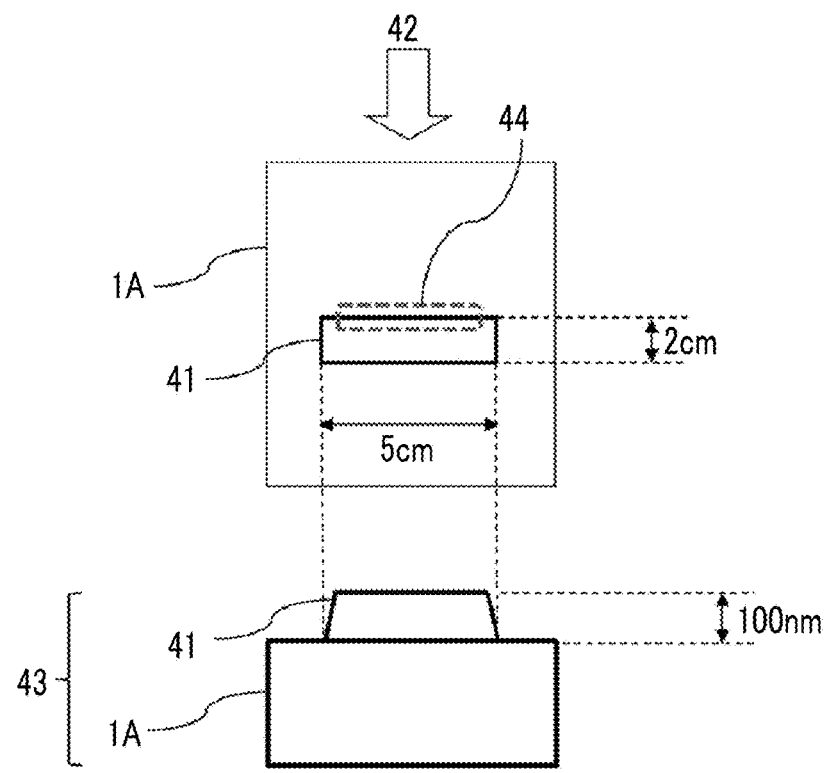
FIG. 17 is a schematic view of an example of a step of laminating the curable transparent resin layer in a method for manufacturing a laminate of the present invention.

In the method for manufacturing a laminate of the present invention, due to the above-described constitution, it is possible to prevent the incorporation of air bubbles when the transfer film is laminated on a base material having an elevation difference and, particularly, prevent the incorporation of air bubbles when the transfer film is laminated on a base material having an elevation difference in a region along the elevation difference (44 in FIG. 17).

<Preparation of Base Material Having Elevation Difference>

In the method for manufacturing a laminate of the present invention, a base material having an elevation difference is used, and the thickness of an elevation constituting the elevation difference is 100 nm or more.

The method for preparing a base material having the above-described elevation is not particularly limited.

As a base material that can be used as the base material having an elevation difference, it is possible to use base materials described below, and transparent base materials are preferred.

(Surface Treatment of Base Material)

In addition, in order to improve the adhesiveness between individual layers by means of lamination in the subsequent transfer step, it is possible to carry out a surface treatment on a non-touch surface of the base material (particularly, in a case in which the base material is a transparent substrate (the front plate)) in advance. As the surface treatment, it is preferable to carry out a surface treatment using a radical compound (silane coupling treatment). A silane coupling agent preferably has a functional group that interacts with a photosensitive resin. For example, a silane coupling liquid (a 0.3% by mass aqueous solution of N-β(amionethyl)γ-aminopropyltrimethoxysilane, trade name: KBM603, manufactured by Shin-Etsu Chemical Co., Ltd.) is blown by means of showering for 20 seconds and is washed with pure water by means of showering. After that, the silane coupling liquid is reacted by means of heating. A heating tank may be used, and the reaction can also be accelerated by substrate preliminary heating using a laminator.

In addition, in a case in which the lower portion of the elevation constituting the elevation difference is not the base material but a different member, a step of providing the different member on the base material may be provided.

(Elevation Difference)

The thickness of the elevation constituting the elevation difference is 100 nm or more, preferably 100 nm to 500 nm, and more preferably 100 nm to 300 nm. The upper limit value of the thickness of the elevation constituting the elevation difference is preferably in the above-described range from the viewpoint of the following property along the elevation difference in a case in which the transfer film is a dry film rarely including a solvent.

Figure 19:
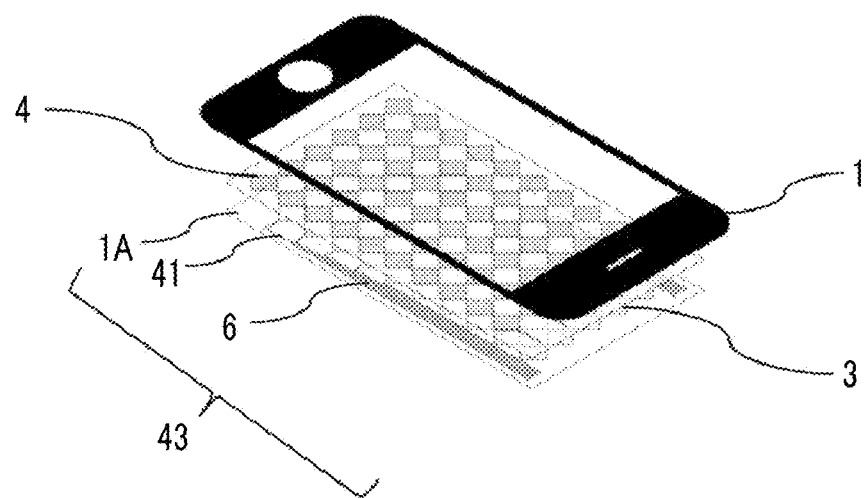
FIG. 19 is a schematic cross-sectional view of another example of the base material having an elevation difference which can be used in the method for manufacturing a laminate of the present invention.
Figure 20:
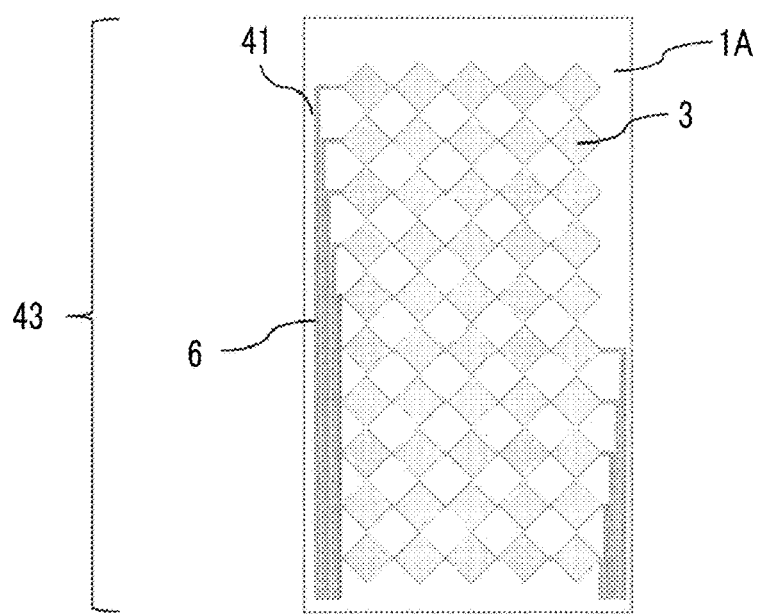
FIG. 20 is a schematic cross-sectional view of still another example of the base material having an elevation difference which can be used in the method for manufacturing a laminate of the present invention.

The base material having an elevation difference which is used in the method for manufacturing a laminate of the present invention will be described on the basis of the drawings. An example of a base material having an elevation difference which can be used in the method for manufacturing a laminate of the present invention is illustrated in FIGS. 18 to 20.

Figure 18:
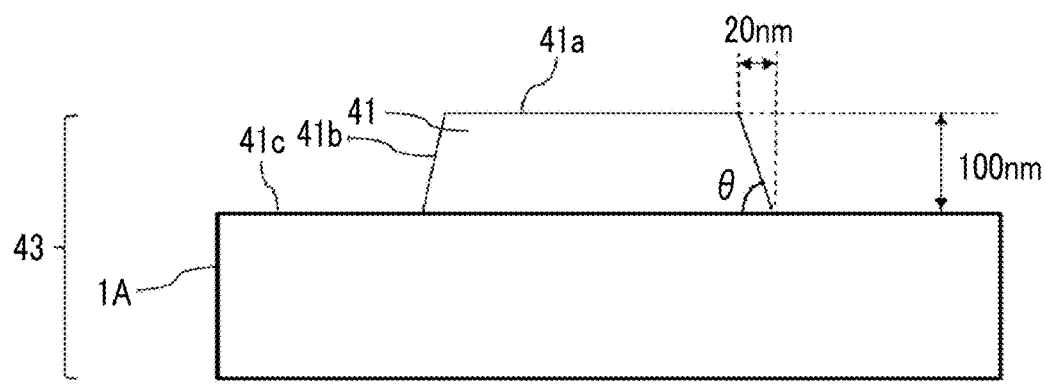
FIG. 18 is a schematic cross-sectional view of an example of a base material having an elevation difference which can be used in the method for manufacturing a laminate of the present invention.

A base material 43 having an elevation difference illustrated in FIG. 18 has an elevation 41 constituting the elevation difference on a film base material 1A. The thickness of the elevation 41 constituting the elevation difference corresponds to the height (distance) of an upper portion 41a of the elevation constituting the elevation difference and a lower portion 41c of the elevation constituting the elevation difference. In FIG. 18, the thickness of the elevation 41 constituting the elevation difference is illustrated to be 100 mm, but base materials having an elevation difference which can be used in the method for manufacturing a laminate of the present invention are not limited to the above-described aspect.

The lower portion of the elevation constituting the elevation difference may be not the base material (the film base material) but a different member, but is preferably the base material. In the base material 43 having an elevation difference illustrated in FIG. 18, the lower portion of the elevation constituting the elevation difference is the film base material 1A.

In addition, the upper portion of the elevation constituting the elevation difference may be not a flat surface but a curved surface.

A side portion (41*b* in FIG. 18) of the elevation constituting the elevation difference has an inclined structure in which the upper portion of the elevation is narrower than the lower portion of the elevation (a so-called taper shape), and the angle (θ in FIG. 18) formed by the side portion (41*b* in FIG. 18) of the elevation constituting the elevation difference and the lower portion 41*c* of the elevation constituting the elevation difference is preferably 5° to 90°.

In the method for manufacturing a laminate of the present invention, it is preferable that the side portion (41*b* in FIG. 18) of the elevation constituting the elevation difference has an inclined structure in which the upper portion of the elevation is narrower than the lower portion of the elevation (a so-called taper shape), and the angle (θ in FIG. 18) formed by the side portion (41*b* in FIG. 18) of the elevation constituting the elevation difference and the base material (1A in FIG. 18) is preferably 5° to 90°.

FIG. 18 illustrates an aspect in which θ is approximately 78°.

In FIG. 18, the width of the inclined structure (the so-called taper shape) of the side portion 41*b* of the elevation constituting the elevation difference is 20 nm, but the base material having an elevation difference which is used in the method for manufacturing a laminate of the present invention is not limited to the above-described aspect. The width of the inclined structure (the so-called taper shape) of the side portion 41*b* of the elevation is preferably 10 nm to 1,000 nm and more preferably 20 nm to 500 nm. Meanwhile, the width of the inclined structure (the so-called taper shape) of the side portion 41*b* of the elevation can be obtained using (the thickness of the elevation constituting the elevation difference)×cot θ.

—Production of Transparent Electrode Pattern and Additional Conductive Element—

In the method for manufacturing a laminate of the present invention, the elevation constituting the elevation difference preferably includes a conductive element and is more preferably a conductive element. Examples of the conductive element include transparent electrode patterns, electrode patterns, additional conductive elements, and the like, and a transparent electrode pattern or an additional conductive element is more preferred, and an additional conductive element is particularly preferred.

In a case in which the elevation constituting the elevation difference includes a conductive element, in the method for manufacturing a laminate of the present invention, the upper portion (41*a* in FIG. 18) of the elevation constituting the elevation difference is the upper portion of the above-described conductive element, and the lower portion (41*c* in FIG. 18) of the elevation constituting the elevation difference is preferably the above-described base material.

In the method for manufacturing a laminate of the present invention, in addition to the above-described transparent electrode pattern, an additional conductive element is provided, and the elevation constituting the elevation difference is preferably the additional conductive element. In addition, in the method for manufacturing a laminate of the present invention, the elevation constituting the elevation difference is preferably the transparent electrode pattern. However, in the method for manufacturing a laminate of the present invention, the thickness of the transparent electrode pattern may be less than 100 nm, and, in this case, the elevation constituting the elevation difference is preferably the additional conductive element.

As an example of the base material having an elevation difference which can be used in the method for manufacturing a laminate of the present invention, an aspect in which the elevation constituting the elevation difference is the additional conductive element is illustrated in FIGS. 19 and 20. In FIG. 20, the base material 43 having an elevation difference has the film base material 1A, an additional conductive element 6, and a transparent electrode pattern 3 (a first transparent electrode pattern), and the elevation 41 constituting the elevation difference is the additional conductive element 6. Only one additional conductive element 6 may constitute the elevation 41 constituting the elevation difference as illustrated in FIG. 20 or multiple additional conductive elements arranged adjacent to each other may constitute the elevation 41 constituting the elevation difference (not illustrated).

FIG. 19 illustrates an aspect in which the base material 43 having the elevation difference which includes the transparent electrode pattern 3 (the first transparent electrode pattern) illustrated in FIG. 20, a film base material including the additional transparent electrode pattern 4 (a second transparent electrode pattern), and a transparent substrate 1 (a front plate) are laminated together. Meanwhile, when the respective members illustrated in FIG. 19 are integrated together, it is possible to produce an electrostatic capacitance-type input device of the present invention described below.

The transparent electrode patterns and the additional conductive element can be produced on an arbitrary base material such as a film base material or a transparent substrate using a method for forming the first transparent electrode pattern 3, the second transparent electrode pattern 4, and the additional conductive element 6 described in the section of the electrostatic capacitance-type input device below, and a method in which a photosensitive film is used is preferred.

<Protective Film Removal Step>

In a case in which the transfer film of the present invention includes a protective film, the method for manufacturing a laminate preferably includes a protective film removal step of removing the protective film from the transfer film of the present invention before the step of laminating the curable transparent resin layer.

<Step of Lamination Curable Transparent Resin Layer>

The method for manufacturing a laminate of the present invention includes a step of laminating the curable transparent resin layer of the transfer film of the present invention on the base material having the elevation difference so as to continuously cover at least the upper portion of the elevation constituting the elevation difference and the lower portion of the elevation.

In the method for manufacturing a laminate of the present invention, it is preferable to continuously laminate the curable transparent resin layer from one direction of the base material constituting the elevation difference toward on the upper portion of the elevation constituting the elevation difference and the lower portion of the elevation.

The method for manufacturing a laminate of the present invention preferably has an elevation difference-ascending step of laminating the curable transparent resin layer from the lower portion (41*c* in FIG. 18) of the elevation constituting the elevation difference to the upper portion (41*a* in FIG. 18) of the elevation in this order and an elevation difference-descending step of laminating the curable transparent resin layer from the upper portion (41a in FIG. 18) of the elevation constituting the elevation difference to the lower portion (41c in FIG. 18) of the elevation in this order. Even in a case in which the manufacturing method includes the elevation difference-ascending step and the elevation difference-descending step as described above, according to the method for manufacturing a laminate of the present invention, it is possible to prevent the incorporation of air bubbles particularly in a region 44 along the elevation difference in FIG. 17 during lamination on base materials having an elevation difference. The elevation difference-ascending step is carried out in the elevation difference on the side close to a lamination direction 42 in FIG. 17 when the curable transparent resin layer runs over the elevation. The elevation difference-descending step is carried out in the elevation difference on the side far from the lamination direction 42 in FIG. 17 when the curable transparent resin layer runs beyond the elevation.

The step of laminating the curable transparent resin layer on the base material having the elevation difference is preferably a transfer (attachment) step. The transfer step refers to the fact that the curable transparent resin layer is laminated from the transfer film on the base material having the elevation difference and consequently is attached to the base material. At this time, a method including a step of removing the temporary support after laminating the curable transparent resin layer of the transfer film of the present invention on the base material having the elevation difference (the additional conductive element or the transparent electrode pattern) is preferred.

The step of laminating the curable transparent resin layer on the base material having the elevation difference is preferably carried out by superimposing the curable transparent resin layer (preferably the second transparent resin layer) on the surface of the base material having the elevation difference and pressurizing and heating the curable transparent resin layer.

In the step of laminating the curable transparent resin layer on the base material having the elevation difference, it is possible to use well-known laminators such as a laminator, a vacuum laminator, and an auto-cut laminator capable of further improving productivity. The laminator includes an arbitrary roller that can be heated such as a comb roller and can be preferably pressurized and heated.

The temperature when the curable transparent resin layer and the base material having the elevation difference are attached together in the step of laminating the curable transparent resin layer is preferably 60° C. to 150° C., more preferably 65° C. to 130° C., and particularly preferably 70° C. to 100° C.

In the step of laminating the curable transparent resin layer, the linear pressure applied between the curable transparent resin layer and the base material having the elevation difference is preferably 60 to 200 N/cm, more preferably 70 to 160 N/cm, and particularly preferably 80 to 120 N/cm.

In the step of laminating the curable transparent resin layer, the transportation speed of the curable transparent resin layer is preferably 2.0 m/min or more, more preferably 3.0 m/min or more, and still more preferably 4.0 m/min or more. The method for manufacturing a laminate of the present invention is capable of preventing the incorporation of air bubbles during lamination on base materials having an elevation difference even during the above-described high-speed lamination.

The step of laminating the curable transparent resin layer in the method for manufacturing a laminate of the present invention will be described on the basis of the drawings. A schematic view of an example of the step of laminating the curable transparent resin layer in the method for manufacturing a laminate of the present invention is illustrated in FIG. 17.

The base material 43 having the elevation difference illustrated in FIG. 17 has a conductive element having a thickness of 100 nm and a rectangular shape (with a vertical length of 2 cm and a horizontal length of 5 cm) when seen from the above (the upward direction in FIG. 17) of the film base material 1A in a case in which the lamination direction 42 is considered as the machine direction as the elevation 41 constituting the elevation difference on the film base material 1A. In the base material 43 having the elevation difference illustrated in FIG. 17, the side portion of the elevation constituting the elevation difference has an inclined structure in which the upper portion of the elevation is narrower than the lower portion of the elevation (a so-called taper shape), and the angle formed by the side portion of the elevation constituting the elevation difference and the substrate is approximately 78°. In addition, when seen from the above of the film base material 1A, the width of the side portion of the elevation constituting the elevation difference is as long as 20 nm.

For the transfer film of the preset invention, the curable transparent resin layer is continuously laminated from the lamination direction 42 illustrated in FIG. 17 so as to cover the entire elevation difference 41, and the curable transparent resin layer is laminated on the base material 43 having the elevation difference. At this time, it is preferable to laminate the curable transparent resin layer using a laminator, not illustrated, while transporting the curable transparent resin layer and pressing the curable transparent resin layer under a linear pressure at a high temperature.

The method for manufacturing a laminate of the present invention is preferably a method in which the curable transparent resin layer and the second transparent resin layer are formed on the transparent electrode patterns from the transfer film having the curable transparent resin layer and the second transparent resin layer.

In the method for manufacturing a laminate of the present invention, it is preferable that the base material having the elevation difference includes a transparent electrode pattern and a step of laminating the curable transparent resin layer on the transparent electrode pattern is provided.

In the method for manufacturing a laminate of the present invention, it is more preferable that the transfer film further has the second transparent resin layer on the curable transparent resin layer, the refractive index of the second transparent resin layer is higher than the refractive index of the curable transparent resin layer, and a step of laminating the second transparent resin layer and the curable transparent resin layer of the transfer film of the present invention on the transparent electrode pattern in this order is provided. The above-described constitution enables the second transparent resin layer and the curable transparent resin layer in the laminate to be collectively transferred and enables laminates having no problem of the transparent electrode patterns being visible to be manufactured with favorable productivity.

Meanwhile, in the method for manufacturing a laminate of the present invention, the second transparent resin layer is produced on the transparent electrode patterns and, in the above-described non-patterned region, on the above-described transparent films directly or through other layers.

<Exposure Step and Development Step>

The method for manufacturing a laminate preferably has an exposure step of exposing the curable transparent resin layer (preferably the second transparent resin layer) which has been transferred onto the base material having the elevation difference and a development step of developing the exposed curable transparent resin layer (preferably the second transparent resin layer).

As examples of the exposure step, the development step, and other steps, it is possible to preferably use the method in Paragraphs "0035" to "0051" of JP2006-23696A in the present invention as well.

The exposure step is a step of exposing the curable transparent resin layer (preferably the second transparent resin layer) which has been transferred onto the transparent electrode patterns.

Specific examples thereof include a method in which a predetermined mask is disposed above the curable transparent resin layer (preferably the second transparent resin layer) which has been formed on the transparent electrode patterns and then the curable transparent resin layer (preferably the second transparent resin layer) is exposed from above the mask through the mask and the temporary support.

Here, as a light source for the exposure, it is possible to appropriately select and use a light source as long as the light source is capable of radiating light in a wavelength range (for example, 365 nm, 405 nm, or the like) with which the curable transparent resin layer (preferably the second transparent resin layer) can be cured. Specific examples thereof include an ultrahigh-pressure mercury lamp, a high-pressure mercury lamp, a metal halide lamp, and the like. The exposure amount is generally approximately 5 to 200 mJ/cm$^2$ and preferably approximately 10 to 100 mJ/cm$^2$.

The method for manufacturing a laminate preferably includes a step of curing the curable transparent resin layer and the second transparent resin layer at the same time and more preferably includes a step of pattern-curing the layers at the same time. For the transfer film of the present invention, it is preferable to laminate the curable transparent resin layer and then laminate the second transparent resin layer without curing the curable transparent resin layer. The curable transparent resin layer and the second transparent resin layer which have been transferred from the transfer film of the present invention obtained as described above can be cured at the same time. Therefore, it is possible to transfer the first and second transparent resin layers onto transparent electrode patterns from the transfer film of the present invention and then develop the layers in desired patterns by means of photolithography.

The method for manufacturing a laminate more preferably includes, after the step of curing the curable transparent resin layer and the second transparent resin layer at the same time, a step of developing and removing the non-cured portions (in the case of light-curing, only non-exposed portions or only exposed portions) of the curable transparent resin layer and the second transparent resin layer.

The development step is a step of developing the exposed curable transparent resin layer (preferably the second transparent resin layer).

In the present invention, the development step is a narrowly-defined development step in which the pattern-exposed curable transparent resin layer (preferably the second transparent resin layer) is pattern-developed using a developer.

The development can be carried out using a developer. The developer is not particularly limited, and it is possible to use well-known developers such as the developer described in JP1993-72724A (JP-H05-72724A). Furthermore, the developer is preferably a developer which performs development behaviors so as to dissolve light-curable resin layer and is preferably, for example, a developer including a compound having a pKa of 7 to 13 at a concentration of 0.05 to 5 mol/L. Meanwhile, in a case in which the curable transparent resin layer and the second transparent resin layer do not form any patterns, the developer is preferably a developer which performs development behaviors so as not to dissolve the non-alkali development-type colored composition layer and is preferably, for example, a developer including a compound having a pKa of 7 to 13 at a concentration of 0.05 to 5 mol/L. To the developer, a small amount of a water-miscible organic solvent may be further added. Examples of the water-miscible organic solvent include methanol, ethanol, 2-propanol, 1-propanol, butanol, diacetone alcohol, ethylene glycol monomethyl ether, ethylene glycol monoethyl ether, ethylene glycol mono-n-butyl ether, pentyl alcohol, acetone, methyl ethyl ketone, cyclohexanone, ε-caprolactone, γ-butyrolactone, dimethylformamide, dimethylacetamide, hexamethylphosphoramide, ethyl lactate, methyl lactate, ε-caprolactam, N-methyl pyrrolidone, and the like. The concentration of the organic solvent is preferably 0.1% by mass to 30% by mass.

In addition, to the developer, it is possible to further add a well-known surfactant. The concentration of the surfactant is preferably 0.01% to 10% by mass.

A method for the development may be any one of puddle development, shower development, shower and spin development, dip development, and the like. Here, in the shower development, a developer is blown onto the exposed curable transparent resin layer (preferably the second transparent resin layer) by means of showering, whereby non-cured portions can be removed. In addition, after the development, it is preferable to blow a cleaning agent or the like by means of showering and removing development residue by rubbing the surface with a brush or the like. The fluid temperature of the developer is preferably 20° C. to 40° C., and the pH of the developer is preferably 8 to 13.

The method for manufacturing a laminate may have other steps such as a post exposure step and a post baking step. In a case in which the curable transparent resin layer (preferably the second transparent resin layer) is a heat-curable transparent resin layer, it is preferable to carry out a post baking step.

Furthermore, patterning exposure or full-surface exposure may be carried out after the peeling of the temporary support or may be carried out before the peeling of the temporary support, which is followed by the peeling of the temporary support. The exposure may be exposure using a mask or digital exposure using a laser.

(Production of Transparent Film)

In a case in which a laminate of the present invention further has a transparent film having a refractive index of 1.6 to 1.78 and a film thickness of 55 to 110 nm on a side opposite to the side on which the curable transparent resin layer (preferably the second transparent resin layer) is formed on the transparent electrode pattern, the transparent film is produced on the transparent electrode pattern directly or through another layer such as the third transparent film.

The method for producing the transparent film is not particularly limited, but the transparent film is preferably produced by means of transferring or sputtering.

Among these, in the laminate of the present invention, the transparent film is preferably produced by transferring the transparent curable resin film formed on the temporary support onto the transparent substrate and more preferably produced by transferring and then curing the transparent curable resin film. Examples of the method for transferring and curing include a method in which the photosensitive film described in the section of the electrostatic capacitance-type input device of the present invention described below is used and lamination, exposure, development, and other steps are carried out in the same manner as in the method for laminating the curable transparent resin layer (preferably the second transparent resin layer) in the method for manufacturing a laminate of the present invention. In this case, the refractive index of the transparent film is preferably adjusted to be in the above-described range by dispersing the above-described metal oxide particles in a light-curable resin layer in the photosensitive film.

Meanwhile, in a case in which the transparent film is an inorganic film, the transparent film is preferably formed by means of sputtering. That is, in the laminate, the transparent film is also preferably formed by means of sputtering.

As the method for sputtering, it is possible to preferably use the method used in JP2010-86684A, JP2010-152809A, and JP2010-257492A.

(Production of Third Transparent Film)

A method for producing the third transparent film is the same as a method for producing a transparent film having a refractive index of 1.6 to 1.78 and a film thickness of 55 to 110 nm on a transparent substrate.

[Laminate]

The laminate of the present invention is a laminate manufactured using the method for manufacturing a laminate of the present invention.

The laminate of the present invention has a transparent electrode pattern, a second transparent resin layer disposed adjacent to the transparent electrode pattern, and a curable transparent resin layer disposed adjacent to the second transparent resin layer, the refractive index of the second transparent resin layer is higher than the refractive index of the curable transparent resin layer, and the refractive index of the second transparent resin layer is 1.6 or higher.

When the above-described constitution is provided, it is possible to solve a problem of the transparent electrode pattern being visible, and the patterning property becomes favorable.

Furthermore, the laminate of the present invention is preferably favorably colored, that is, preferably does not appear yellowish. In addition, the laminate of the present invention preferably has favorable substrate adhesiveness.

<Constitution of Laminate>

The laminate of the present invention preferably further has a transparent film having a refractive index of 1.6 to 1.78 and a film thickness of 55 to 110 nm on a side opposite to the side on which the second transparent resin layer is formed on the transparent electrode pattern from the viewpoint of further improving the visibility of the transparent electrode pattern. Meanwhile, in the present specification, unless particularly otherwise described, "transparent films" refer to "transparent films having a refractive index of 1.6 to 1.78 and a film thickness of 55 to 110 nm".

The laminate of the present invention preferably further has a transparent substrate on a side opposite to the side on which the transparent electrode pattern of a transparent film having a refractive index of 1.6 to 1.78 and a film thickness of 55 to 110 nm is formed.

Figure 11:
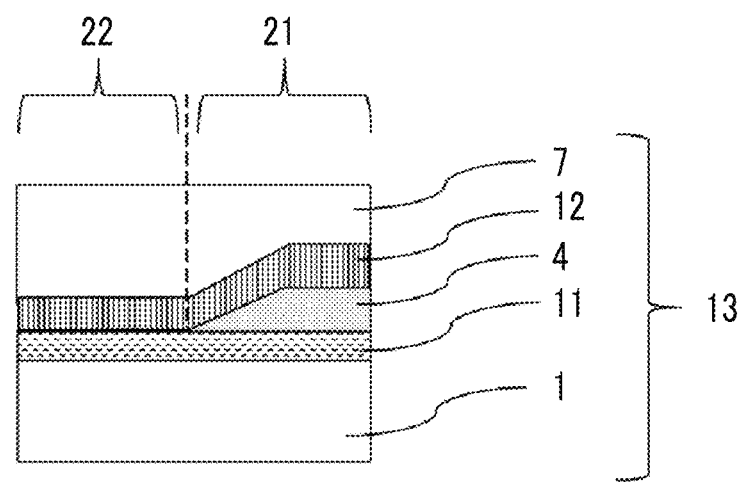
FIG. 11 is a schematic cross-sectional view illustrating an example of the constitution of a laminate of the present invention.

FIG. 11 illustrates an example of the constitution of the laminate of the present invention.

In FIG. 11, the transparent substrate 1 and a transparent film 11 having a refractive index of 1.6 to 1.78 and a film thickness of 55 to 110 nm are provided, and furthermore, a region 21 in which the transparent electrode pattern 4, the second transparent resin layer 12, and the curable transparent resin layer 7 are laminated in this order is provided in the plane. In addition, FIG. 11 illustrates that the laminate includes, in addition to the above-described region, the transparent substrate 1 and a region in which a transparent film 11 including at least two transparent thin films having different refractive indexes are laminated in this order (in the constitution of FIG. 11, a region 22 in which the second transparent resin layer 12 and the curable transparent resin layer 7 are laminated in this order (that is, a non-patterned region 22 in which the transparent electrode pattern is not formed)).

In other words, the transparent electrode pattern-including substrate includes the transparent substrate 1, the transparent film 11 including at least two transparent thin films having different refractive indexes are laminated in this order, and the region 21 in which the transparent electrode pattern 4, the second transparent resin layer 12, and the curable transparent resin layer 7 are laminated in this order in the in-plane direction.

The in-plane direction refers to a direction substantially parallel to the surface parallel to the transparent substrate in the laminate. Therefore, the region in which the transparent electrode pattern 4, the second transparent resin layer 12, and the curable transparent resin layer 7 are laminated in this order being included in the plane means that the orthogonal projection of the region in which the transparent electrode pattern 4, the second transparent resin layer 12, and the curable transparent resin layer 7 are laminated in this order on the surface parallel to the transparent substrate in the laminate is present in a plane parallel to the transparent substrate in the laminate.

Figure 3:
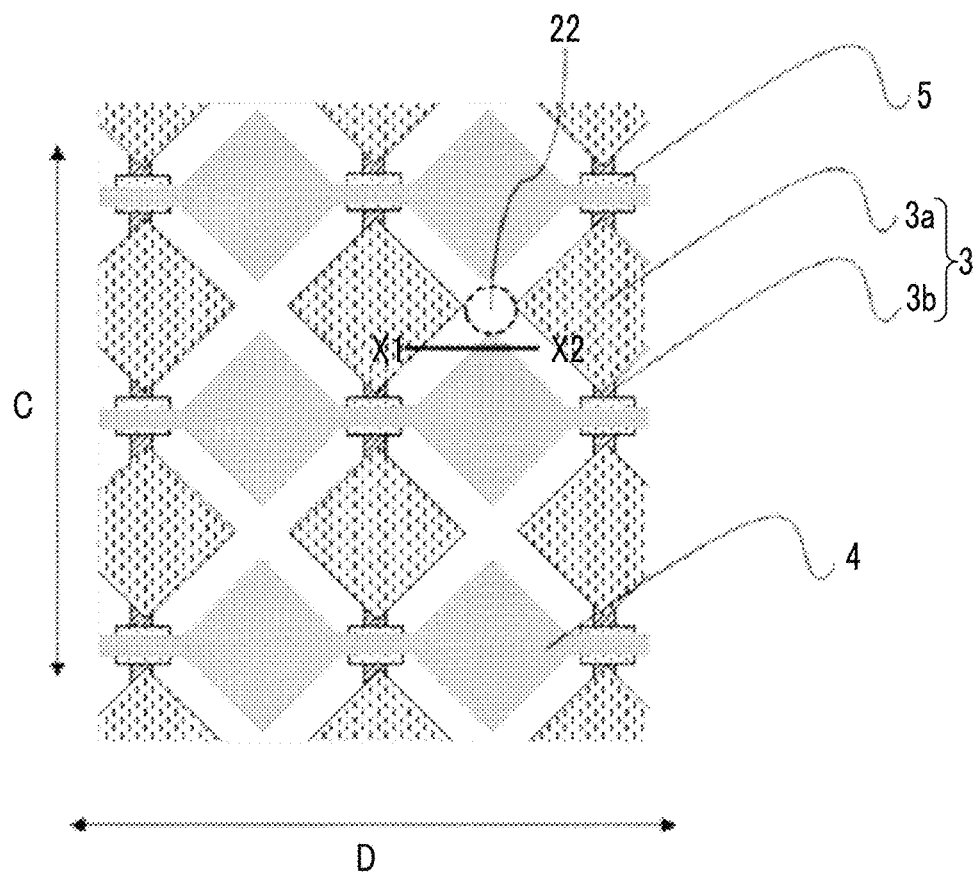
FIG. 3 is an explanatory view illustrating an example of the relationship between a transparent electrode pattern and a non-patterned region in the present invention.

Here, in a case in which the laminate of the present invention is used in an electrostatic capacitance-type input device described below, there are cases in which transparent electrode patterns are respectively provided in two directions that substantially intersect each other (the row direction and the column direction) as the first transparent electrode pattern and the second transparent electrode pattern (for example, refer to FIG. 3). For example, in the constitution of FIG. 3, the transparent electrode pattern in the laminate of the present invention may be the second transparent electrode pattern 4 or a pad portion 3a of the first transparent electrode pattern 3. In other words, in the following description of the laminate of the present invention, there are cases in which the reference signal of the transparent electrode pattern will be representatively represented by "4", but the transparent electrode pattern in the laminate of the present invention is not limited to use as the second transparent electrode pattern 4 in the electrostatic capacitance-type input device of the present invention and may be used as, for example, the pad portion 3a of the first transparent electrode pattern 3.

The laminate of the present invention preferably includes a non-patterned region in which the transparent electrode pattern is not formed. In the present specification, the non-patterned region refers to a region in which the transparent electrode pattern 4 is not formed.

FIG. 11 illustrates an aspect in which the laminate of the present invention includes the non-patterned region 22.

The laminate of the present invention preferably includes a region in which the transparent substrate, the transparent film, and the second transparent resin layer are laminated in this order in the plane in at least a part of the non-patterned region 22 in which the transparent electrode pattern is not formed.

In the laminate of the present invention, the transparent film and the second transparent resin layer are preferably adjacent to each other in the region in which the transparent substrate, the transparent film, and the second transparent resin layer are laminated in this order.

Here, in regions other than the non-patterned region 22, other members may be disposed at arbitrary locations within the scope of the gist of the present invention, and, for example, in a case in which the laminate of the present invention is used in the electrostatic capacitance-type input device described below, it is possible to laminate a mask layer 2, an insulating layer 5, an additional conductive element 6, and the like.

In the laminate of the present invention, the transparent substrate and the transparent film are preferably adjacent to each other.

FIG. 11 illustrates an aspect in which the transparent film 11 is laminated on the transparent substrate 1 so as to be adjacent to each other.

Here, within the scope of the gist of the present invention, a third transparent film may be laminated between the transparent substrate and the transparent film. For example, a third transparent film having a refractive index of 1.5 to 1.52 (not illustrated in FIG. 11) may be included between the transparent substrate and the transparent film.

In the laminate of the present invention, the thickness of the transparent film is preferably 55 to 110 nm, more preferably 60 to 110 nm, and particularly preferably 70 to 90 nm.

Here, the transparent film may have a monolayer structure or a laminate structure of two or more layers. In a case in which the transparent film has a laminate structure of two or more layers, the film thickness of the transparent film refers to the total film thickness of all layers.

In the laminate of the present invention, the transparent film and the transparent electrode pattern are preferably adjacent to each other.

FIG. 11 illustrates an aspect in which the transparent electrode pattern 4 is laminated on a part of the region of the transparent film 11 so as to be adjacent to each other.

As illustrated in FIG. 11, the shape of the end portion of the transparent electrode pattern 4 is not particularly limited and may be a taper shape, and, for example, the end portion may have a taper shape in which the surface on the transparent substrate side is wider than the surface on the side opposite to the transparent substrate.

Here, when the end portion of the transparent electrode pattern has a taper shape, the angle of the end portion of the transparent electrode pattern (hereinafter, also referred to as the taper angle) is preferably 30° or less, more preferably 0.1° to 15°, and particularly preferably 0.5° to 5°.

In the present specification, the taper angle can be obtained using the following method for measuring the taper angle: a microscopic photograph of the end portion of the transparent electrode pattern is taken, the taper portion in the microscopic photograph is approximated to a triangle, and the taper angle is directly measured.

Figure 10:
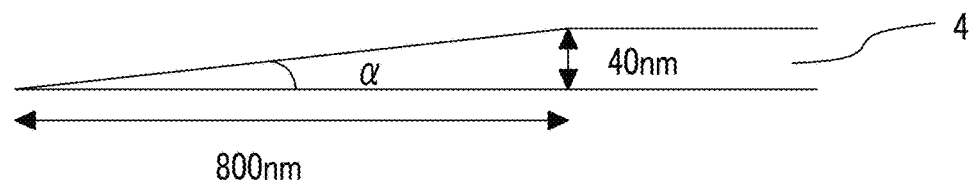
FIG. 10 is an explanatory view illustrating an example of a taper shape of an end portion of the transparent electrode pattern.

FIG. 10 illustrates an example of a case in which the end portion of the transparent electrode pattern has a taper shape. In a triangle obtained by approximating a taper portion in FIG. 10, the bottom surface is 800 nm, the height (the film thickness at the top portion substantially parallel to the bottom surface) is 40 nm, and the taper angle α at this time is approximately 3°. The bottom surface of the triangle obtained by approximating the taper portion is preferably 10 to 3,000 nm, more preferably 100 to 1,500 nm, and particularly preferably 300 to 1,000 nm.

Meanwhile, a preferred range of the height of the triangle obtained by approximating the taper portion is the same as the preferred range of the film thickness of the transparent electrode pattern.

The laminate of the present invention preferably includes a region in which the transparent electrode pattern and the second transparent resin layer are adjacent to each other.

FIG. 11 illustrates an aspect in which the transparent electrode pattern, the second transparent resin layer, and the curable transparent resin layer are adjacent to each other in the region 21 in which the transparent electrode pattern, the second transparent resin layer, and the curable transparent resin layer are laminated in this order.

In addition, in the laminate of the present invention, both sides of the transparent electrode pattern or the non-patterned region 22 in which the transparent electrode pattern is not formed are preferably continuously coated with the transparent film and the second transparent resin layer directly or through other layers.

Here, "being continuously coated" indicates that the transparent film and the second transparent resin layer are not patterned films but continuous films. That is, the transparent film and the second transparent resin layer preferably have no opening portions since the transparent electrode pattern is barely visible.

In addition, the transparent electrode pattern and the non-patterned region 22 are preferably directly coated with the transparent film and the second transparent resin layer compared with the case of being coated through other layers. In a case in which the transparent electrode pattern and the non-patterned region are coated through other layers, examples of "other layers" include the insulating layer 5 included in the electrostatic capacitance-type input device of the present invention described below, a transparent electrode pattern on the second layer in a case in which two or more transparent electrode patterns are included as in the electrostatic capacitance-type input device of the present invention described below, and the like.

FIG. 11 illustrates an aspect in which the second transparent resin layer 12 is laminated. The second transparent resin layer 12 is laminated so as to astride the region in which the transparent electrode pattern 4 on the transparent film 11 is not laminated and the region in which the transparent electrode pattern 4 is laminated. That is, the second transparent resin layer 12 is adjacent to the transparent film 11 and, furthermore, the second transparent resin layer 12 is adjacent to the transparent electrode pattern 4.

In addition, in a case in which the end portion of the transparent electrode pattern 4 has a taper shape, the second transparent resin layer 12 is preferably laminated along the taper shape (at the same slope as the taper angle).

FIG. 11 illustrates an aspect in which the curable transparent resin layer 7 is laminated on the surface on a side opposite to the surface of the second transparent resin layer 12 on which the transparent electrode pattern is formed.

<Material of Laminate>

(Base Material that is Used as Base Material Having Elevation Difference)

A base material that is used as the base material having an elevation difference is preferably a film base material or a transparent substrate.

In a case in which a base material that is used as the base material having an elevation difference is a film base material, the film base material is preferably the following aspect.

As the film base material, a film base material which does not cause optical distortion or has high transparency is more preferably used, and specific examples thereof include polyethylene terephthalate (PET), polyethylene naphthalate, polycarbonate (PC), triacetyl cellulose (TAC), and cycloolefine polymers (COP).

In a case in which a base material that is used as the base material having an elevation difference is a transparent substrate, the transparent substrate is preferably a glass substrate having a refractive index of 1.5 to 1.55. The refractive index of the transparent substrate is particularly preferably 1.5 to 1.52. The transparent substrate is constituted of a light-transmissible substrate such as a glass substrate, and it is possible to use reinforced glass or the like represented by Corning's GORILLA glass. In addition, as the transparent substrate, it is possible to preferably use the materials used in JP2010-86684A, JP2010-152809A, and JP2010-257492A.

(Transparent Electrode Pattern)

The laminate of the present invention preferably has a transparent electrode pattern.

The refractive index of the transparent electrode pattern is preferably 1.75 to 2.1.

The material of the transparent electrode pattern is not particularly limited, and well-known materials can be used. For example, it is possible to produce the transparent electrode pattern using a light-transmissible conductive metal oxide film such as indium tin oxide (ITO) or indium zinc oxide (IZO). Examples of the above-described metal film include ITO films; metal films of Al, Zn, Cu, Fe, Ni, Cr, Mo, and the like; metal oxide films of $SiO_2$ and the like. At this time, the film thickness of the respective elements can be set to 10 to 200 nm. In addition, since amorphous ITO films are turned into crystalline ITO films by means of firing, it is also possible to reduce the electrical resistance. In addition, the first transparent electrode pattern 3, the second transparent electrode pattern 4, and the additional conductive element 6 described below can also be manufactured using a photosensitive film having a light-curable resin layer for which a conductive fiber is used. Additionally, in a case in which the first transparent electrode pattern and the like are formed using ITO or the like, it is possible to refer to Paragraphs "0014" to "0016" of JP4506785B. Among these, the transparent electrode pattern is preferably an ITO film.

In the laminate of the present invention, the transparent electrode pattern is preferably an ITO film having a refractive index of 1.75 to 2.1.

(Additional Conductive Element)

The laminate of the present invention preferably has an additional conductive element other than the transparent electrode pattern.

The additional conductive element is preferably a guidance wire (also referred to as an ejection wire) of the transparent electrode pattern. The material of the additional conductive element is not particularly limited, and well-known materials can be used. In the related art, MAM having a three-layer structure of Mo/Al/Mo has been generally used as the material of the additional conductive element due to the high conductivity and ease of fine processing, but it is possible to preferably use the same material as the material of the transparent electrode pattern, and furthermore, metals such as gold (Au), silver (Ag), copper (Cu), aluminum (Al), molybdenum (Mo), palladium (Pd), platinum (Pt), carbon (C), and iron (Fe) also can be used. When films are formed using conductive paste or conductive ink including the above-described metals and a wet method, it is possible to obtain ejection wires using a less expensive process than deposition methods. The material of the additional conductive element is preferably metal and more preferably copper or aluminum.

(Curable Transparent Resin Layer and Second Transparent Resin Layer)

The preferred ranges of the curable transparent resin layer and the second transparent resin layer in the laminate of the present invention are the same as the preferred ranges of the curable transparent resin layer and the second transparent resin layer of the transfer film of the present invention.

(Transparent Film)

In the laminate of the present invention, the refractive index of the transparent film is 1.6 to 1.78 and preferably 1.65 to 1.74. Here, the transparent film may have a monolayer structure or a laminate structure of two or more layers. In a case in which the transparent film has a laminate structure of two or more layers, the refractive index of the transparent film refers to the refractive index of all layers.

The material of the transparent film is not particularly limited as long as the above-described range of the refractive index is satisfied.

The preferred range of the material of the transparent film and the preferred range of the physical properties such as the refractive index are the same as the preferred ranges of those of the second transparent resin layer.

In the laminate of the present invention, the transparent film and the second transparent resin layer are preferably constituted of the same material from the viewpoint of optical homogeneity.

In the laminate of the present invention, the transparent film is preferably a transparent resin film.

Metal oxide particles, a resin (a binder), and other additives which are used in the transparent resin film are not particularly limited within the scope of the gist of the present invention, and it is possible to preferably use the resin and other additives which are used for the second transparent resin layer of the transfer film of the present invention.

In the laminate of the present invention, the transparent film may be an inorganic film. As the material that is used for the inorganic film, it is possible to preferably use the material which is used for the second transparent resin layer of the transfer film of the present invention.

(Third Transparent Film)

The refractive index of the third transparent film is preferably 1.5 to 1.55 and more preferably 1.5 to 1.52 since the refractive index is close to the refractive index of the transparent substrate and the visibility of the transparent electrode pattern improves.

[Electrostatic Capacitance-type Input Device]

The electrostatic capacitance-type input device of the present invention includes the laminate of the present invention.

The electrostatic capacitance-type input device is preferably produced by transferring the second transparent resin layer and the curable transparent resin layer disposed adjacent to the second transparent resin layer onto the transparent electrode patterns in the electrostatic capacitance-type input device from the transfer film of the present invention.

The electrostatic capacitance-type input device is preferably produced by curing the curable transparent resin layer and the second transparent resin layer which have been transferred from the transfer film of the present invention at the same time and more preferably produced by pattern-curing the curable transparent resin layer and the second transparent resin layer at the same time. Meanwhile, when the curable transparent resin layer and the second transparent resin layer which have been transferred from the transfer film of the present invention are cured at the same time, it is preferable not to peel the protective film from the transfer film of the present invention.

The electrostatic capacitance-type input device is more preferably produced by developing the non-cured portions of the curable transparent resin layer and the second transparent resin layer which have been transferred from the transfer film of the present invention and pattern-cured at the same time and removing the non-cured portions of the curable transparent resin layer and the second transparent resin layer. Meanwhile, it is preferable to cure the curable transparent resin layer and the second transparent resin layer which have been transferred from the transfer film of the present invention at the same time and then peel the protective film from the transfer film of the present invention before the development of the layers. The electrostatic capacitance-type input device of the present invention needs to be connected to a flexible wire formed on a polyimide film at the terminal portion of a guidance wire and is thus preferably not covered with the curable transparent resin layer (and the second transparent resin layer).

Figure 13:
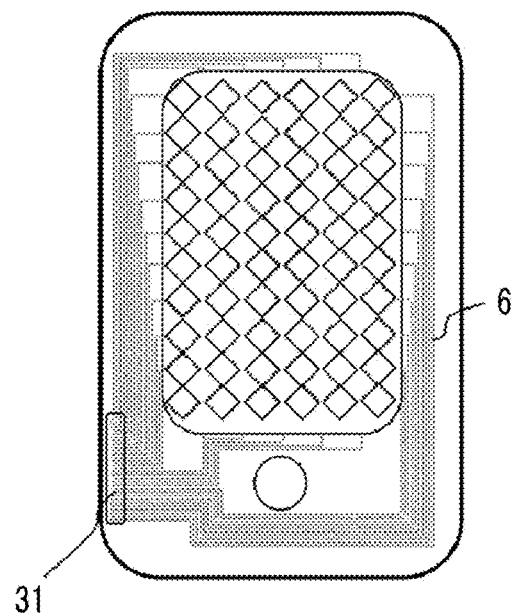
FIG. 13 is a top view illustrating another example of the constitution of the electrostatic capacitance-type input device of the present invention and illustrates an aspect in which the electrostatic capacitance-type input device is pattern-exposed, is not covered with any curable transparent resin layer, and includes a terminal portion (end portion) of a guidance wire.

The above-described aspect is illustrated in FIG. 13. FIG. 13 illustrates an electrostatic capacitance-type input device having the following constitution which includes a guidance wire (the additional conductive element 6) of the transparent electrode pattern and an terminal portion 31 of the guidance wire.

The curable transparent resin layer (and the second transparent resin layer) on the terminal portion 31 of the guidance wire forms a non-cured portion (non-exposed portion) and thus is removed by means of development, whereby the terminal portion 31 of the guidance wire is exposed.

Figure 14:
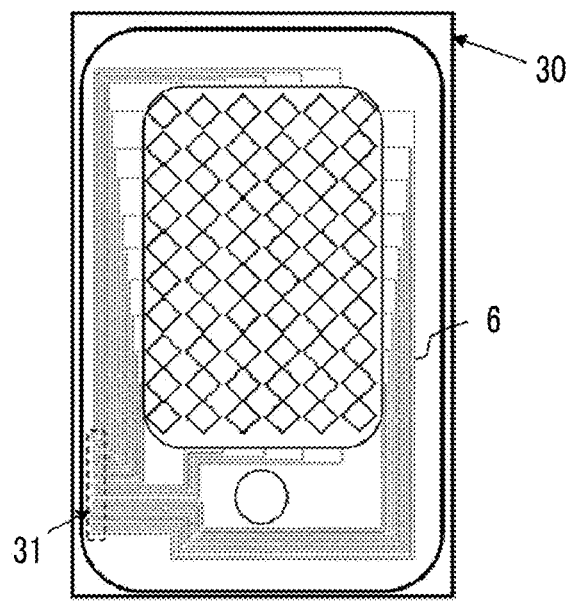
Figure 15:
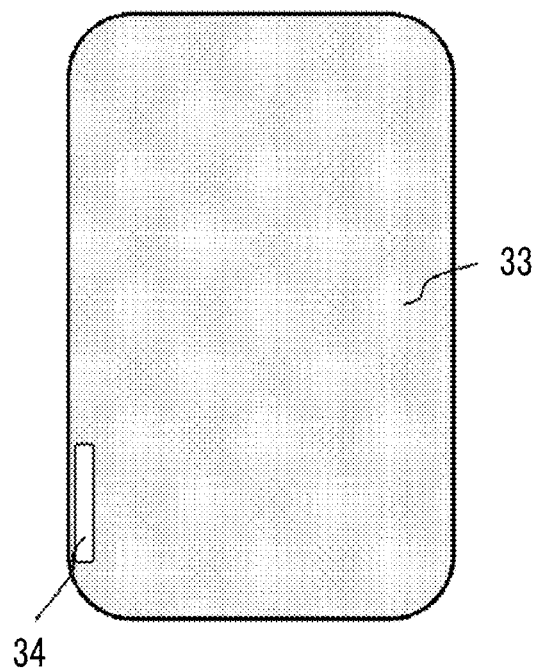
FIG. 15 is a schematic view illustrating an example of a desired pattern in which a curable transparent resin layer and the second transparent resin layer are cured.

Specific exposure and development aspects are illustrated in FIGS. 14 and 15. FIG. 14 illustrates a state in which the transfer film 30 of the present invention having the first and second transparent resin layers is laminated on the transparent electrode pattern in the electrostatic capacitance-type input device using a laminator and is to be cured by means of exposure or the like. In a case in which photolithography is used, that is, in a case in which the transfer film is cured by means of exposure, the electrostatic capacitance-type input device can be obtained by patter-exposing the cured portions (the exposed portions) 33 of the curable transparent resin layer and the second transparent resin layer having a shape illustrated in FIG. 15 using a mask and developing the non-exposed portions. Specifically, in FIG. 15, as the non-cured portions of the curable transparent resin layer and the second transparent resin layer, an opening portion 34 corresponding to the terminal portion of the guidance wire and the cured portions (desired patterns) of the first and second transparent resin layers for preventing the terminal portion (the ejection wire portion) of the guidance wire from being covered, from which the end portion of the transfer film of the present invention having the first and second transparent resin layers protruding outside the contour of the frame portion of the electrostatic capacitance-type input device has been removed, are obtained.

Therefore, it is possible to directly connect the flexible wire produced on the polyimide film to the terminal portion 31 of the guidance wire, and thus it becomes possible to send signals from sensors to electric circuits.

The electrostatic capacitance-type input device of the present invention preferably has a laminate having a transparent electrode pattern, a second transparent resin layer disposed adjacent to the transparent electrode pattern, and a curable transparent resin layer disposed adjacent to the second transparent resin layer, in which the refractive index of the second transparent resin layer is higher than the refractive index of the curable transparent resin layer and the refractive index of the second transparent resin layer is 1.6 or higher.

Hereinafter, the detail of a preferred aspect of the electrostatic capacitance-type input device of the present invention will be described.

The electrostatic capacitance-type input device of the present invention has a front plate (corresponding to the transparent substrate in the laminate of the present invention) and at least the following elements (3) to (5), (7), and (8) on the non-touch surface side of the front plate and preferably has the laminate of the present invention:

(3) multiple first transparent electrode patterns in which multiple pad portions are formed so as to extend in a first direction through a connection portion;

(4) multiple second electrode patterns which are electrically insulated from the first transparent electrode pattern and are made of multiple pad portions formed so as to extend in a direction intersecting the above-described first direction;

(5) an insulating layer that electrically insulates the first transparent electrode pattern and the second electrode pattern;

(7) a second transparent resin layer formed so as to fully or partially cover the elements (3) to (5); and (8) a curable transparent resin layer formed adjacent to the element (7) so as to cover the element.

Here, the second transparent resin layer (7) corresponds to the second transparent resin layer in the laminate of the present invention. In addition, the curable transparent resin layer (8) corresponds to the curable transparent resin layer in the laminate of the present invention. Meanwhile, the curable transparent resin layer is generally preferably a so-called transparent protective layer in well-known electrostatic capacitance-type input devices.

In the electrostatic capacitance-type input device of the present invention, the second electrode pattern (4) may or may not be a transparent electrode pattern but is preferably a transparent electrode pattern.

The electrostatic capacitance-type input device of the present invention preferably further has an additional conductive element other than the first transparent electrode pattern and the second electrode pattern which is electrically connected to at least one of the first transparent electrode pattern (6) and the second electrode pattern.

Here, in a case in which the second electrode pattern (4) is not a transparent electrode pattern and the additional conductive element (6) is not provided, the first transparent electrode pattern (3) corresponds to the elevation difference in the laminate of the present invention.

In a case in which the second electrode pattern (4) is a transparent electrode pattern and the additional conductive element (6) is not provided, at least one of the first transparent electrode pattern (3) and the second electrode pattern (4) corresponds to the elevation difference in the laminate of the present invention.

In a case in which the second electrode pattern (4) is not a transparent electrode pattern and the additional conductive element (6) is provided, at least one of the first transparent electrode pattern (3) and the additional conductive element (6) corresponds to the elevation difference in the laminate of the present invention.

In a case in which the second electrode pattern (4) is a transparent electrode pattern and the additional conductive element (6) is provided, at least one of the first transparent electrode pattern (3), the second electrode pattern (4), and the additional conductive element (6) corresponds to the elevation difference in the laminate of the present invention.

The electrostatic capacitance-type input device of the present invention preferably further has the transparent film (2) between the first transparent electrode pattern (3) and the front plate, between the second electrode pattern (4) and the front plate, or between the additional conductive element (6) and the front plate. Here, the transparent film (2) preferably corresponds to the transparent film having a refractive index of 1.6 to 1.78 and a film thickness of 55 to 110 nm in the laminate of the present invention from the viewpoint of improving the visibility of the transparent electrode pattern.

The electrostatic capacitance-type input device of the present invention preferably has the mask layer (1) and/or a decorative layer as necessary. The mask layer is also provided as a black trim around a region which a finger, a stylus, or the like touches in order to prevent the guidance wire of the transparent electrode pattern from being visible from the touch side or decorate the input device. The decorative layer is provided as a trim around the region which a finger, a stylus, or the like touches in order for decoration, and, for example, a white decorative layer is preferably provided.

The mask layer (1) and/or the decorative layer are preferably provided between the transparent film (2) and the front plate, between the first transparent electrode pattern (3) and the front plate, between the second transparent electrode pattern (4) and the front plate, or between the additional conductive element (6) and the front plate. The mask layer (1) and/or the decorative layer are more preferably provided adjacent to the front plate.

When the electrostatic capacitance-type input device of the present invention includes the second transparent resin layer disposed adjacent to the transparent electrode pattern and the curable transparent resin layer disposed adjacent to the second transparent resin layer, it is possible to prevent the transparent electrode pattern from becoming visible and solve a problem of the visibility of the transparent electrode pattern even in a case in which the electrostatic capacitance-type input device includes a variety of members described above. Furthermore, when a constitution in which the transparent electrode pattern is put between the transparent film having a refractive index of 1.6 to 1.78 and a film thickness of 55 to 110 nm and the second transparent resin layer as described above is provided, it is possible to further solve the problem of the visibility of the transparent electrode pattern.

<Constitution of Electrostatic Capacitance-type Input Device>

First, a preferred constitution of the electrostatic capacitance-type input device of the present invention will be described together with methods for manufacturing the respective members constituting the device.

FIG. 1A is a cross-sectional view illustrating a preferred constitution of the electrostatic capacitance-type input device of the present invention. FIG. 1A illustrates an aspect in which an electrostatic capacitance-type input device 10 is constituted of the transparent substrate (front plate) 1, the mask layer 2, the transparent film 11 having a refractive index of 1.6 to 1.78 and a film thickness of 55 to 110 nm, the first transparent electrode pattern 3, the second transparent electrode pattern 4, the insulating layer 5, the conductive element 6, the second transparent resin layer 12, and the curable transparent resin layer 7.

Figure 1B:
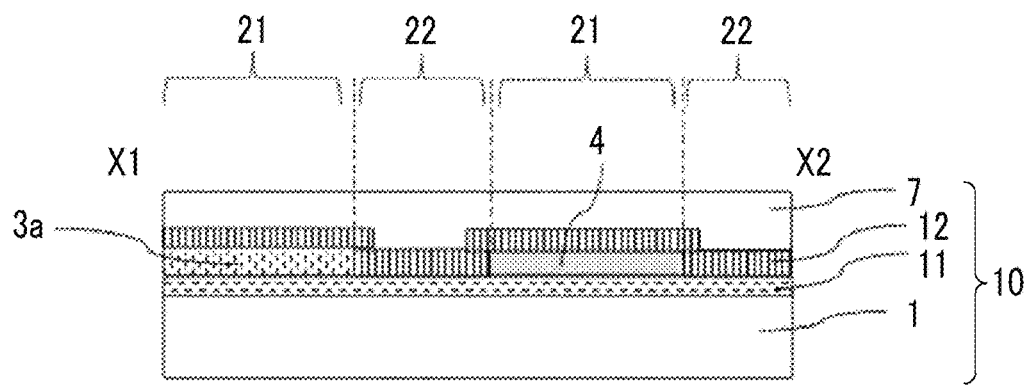
FIG. 1B is a schematic cross-sectional view illustrating another example of the constitution of the electrostatic capacitance-type input device of the present invention.

In addition, FIG. 1B which illustrates a cross-sectional view in a direction of X1-X2 direction in FIG. 3 described below is also, similarly, a cross-sectional view illustrating a preferred constitution of the electrostatic capacitance-type input device of the present invention. FIG. 1B illustrates an aspect in which the electrostatic capacitance-type input device 10 is constituted of the transparent substrate (the front plate) 1, the transparent film 11 having a refractive index of 1.6 to 1.78 and a film thickness of 55 to 110 nm, the first transparent electrode pattern 3, the second transparent electrode pattern 4, the second transparent resin layer 12, and the curable transparent resin layer 7.

For the transparent substrate (the front plate) 1, it is possible to use the materials exemplified as the material of the transparent electrode pattern in the laminate of the present invention, and, in FIG. 1A, the side of the front plate 1 on which the respective elements are provided will be referred to as the non-touch surface side. In the electrostatic capacitance-type input device 10 of the present invention, signals are input by touching the touch surface (the surface opposite to the non-touch surface) of the front plate 1 with a finger or the like.

In addition, the mask layer 2 is provided on the non-touch surface of the front plate 1. The mask layer 2 is a trim-shaped pattern around a display region formed on the non-touch surface side of a touch panel front plate and is formed in order to prevent the guidance wire and the like from being visible.

Figure 2:
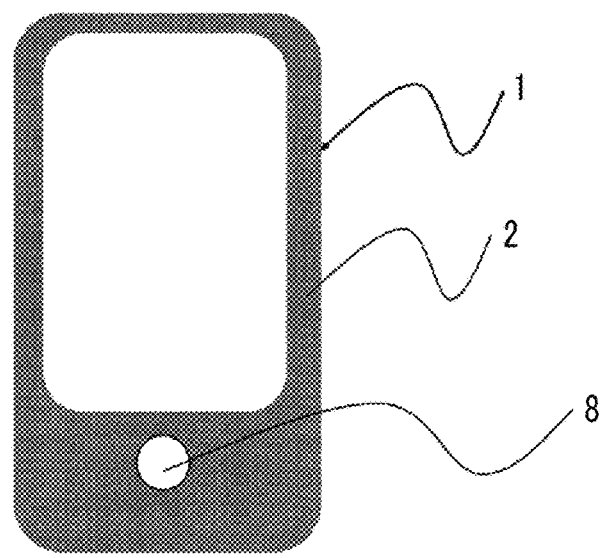
FIG. 2 is an explanatory view illustrating an example of a front plate in the present invention.

In the electrostatic capacitance-type input device 10 of the present invention, the mask layer 2 is provided so as to cover a part of the region (a region other than the input surface in FIG. 2) of the front plate 1 as illustrated in FIG. 2. Furthermore, an opening portion 8 can be provided in a part of the front plate 1 as illustrated in FIG. 2. The opening portion 8 can be provided with a press-type mechanical switch.

On the touch surface of the front plate 1, multiple first transparent electrode patterns 3 in which multiple pad portions are formed so as to extend in the first direction through the a connection portion, multiple second transparent electrode patterns 4 which are electrically insulated from the first transparent electrode pattern 3 and are made of multiple pad portions formed so as to extend in a direction intersecting the above-described first direction, and the insulating layer 5 that electrically insulates the first transparent electrode pattern 3 and the second transparent electrode pattern 4. For the first transparent electrode pattern 3, the second transparent electrode pattern 4, and the conductive element 6 described below, it is possible to use the materials exemplified as the material of the transparent electrode pattern in the laminate of the present invention, and ITO films are preferred.

In addition, it is possible to install at least one of the first transparent electrode pattern 3 and the second transparent electrode pattern 4 so as to astride both regions of the non-touch surface of the front plate 1 and the surface of the mask layer 2 opposite to the front plate 1. FIG. 1A illustrates a view in which the second transparent electrode pattern is installed so as to astride both regions of the non-touch surface of the front plate 1 and the surface of the mask layer 2 opposite to the front plate 1.

As described above, even in a case in which a photosensitive film is laminated so as to astride the mask layer which requires a certain thickness and the rear surface of the front plate, when a photosensitive film having a specific layer constitution described below is used, lamination causing no generation of foam in the boundary with the mask portion becomes possible with a simple process without using an expensive facility such as a vacuum laminator.

The first transparent electrode pattern 3 and the second transparent electrode pattern 4 will be described using FIG. 3. FIG. 3 is an explanatory view illustrating an example of the first transparent electrode pattern and the second transparent electrode pattern in the present invention. As illustrated in FIG. 3, in the first transparent electrode pattern 3, the pad portions 3a are formed so as to extend in the first direction through the connection portion 3b. In addition, the second transparent electrode pattern 4 is electrically insulated from the first transparent electrode pattern 3 using the insulating layer 5 and is constituted of multiple pad portions formed so as to extend in a direction intersecting the first direction (a second direction in FIG. 3). Here, in a case in which the first transparent electrode pattern 3 is formed, the pad portions 3a and the connection portion 3b may be integrally produced or it is also possible to produce only the connection portion 3b and integrally produce (pattern) the pad portions 3a and the second transparent electrode pattern 4. In a case in which the pad portions 3a and the second transparent electrode pattern 4 are integrally produced (patterned), the respective layers are formed so that some of the connection portion 3b and some of the pad portions 3a are coupled together as illustrated in FIG. 3 and the first transparent electrode pattern 3 and the second transparent electrode pattern 4 are electrically insulated from each other by the insulating layer 5.

In addition, in FIG. 3, a region in which the first transparent electrode pattern 3, the second transparent electrode pattern 4, or the conductive element 6 described below are not formed corresponds to the non-patterned region 22 in the laminate of the present invention.

In FIG. 1A, the conductive element 6 is installed on the surface side of the mask layer 2 opposite to the front plate 1. The conductive element 6 is electrically connected to at least one of the first transparent electrode pattern 3 and the second transparent electrode pattern 4 and is a separate element from the first transparent electrode pattern 3 and the second transparent electrode pattern 4.

FIG. 1A illustrates a view in which the conductive element 6 is connected to the second transparent electrode pattern 4.

In addition, in FIG. 1A, the curable transparent resin layer 7 is installed so as to cover all of the respective constituent elements. The curable transparent resin layer 7 may be constituted so as to cover only part of the respective constituent elements. The insulating layer 5 and the curable transparent resin layer 7 may be made of the same material or different materials. As the material constituting the insulating layer 5, it is possible to preferably use the material exemplified as the example of the first or second transparent resin layer in the laminate of the present invention.

<Method for Manufacturing Electrostatic Capacitance-type Input Device>

Figure 4:
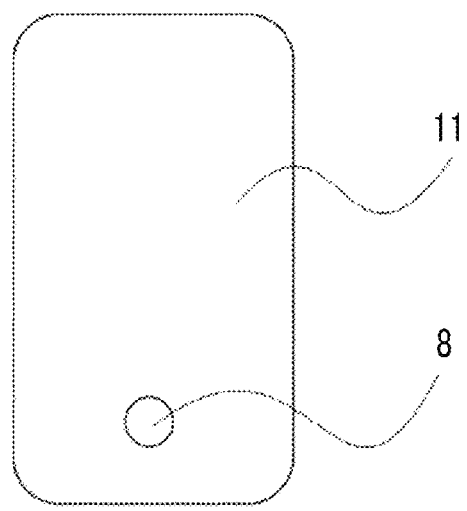
FIG. 4 is a top view illustrating an example of reinforced glass in which an opening portion is formed.
Figure 5:
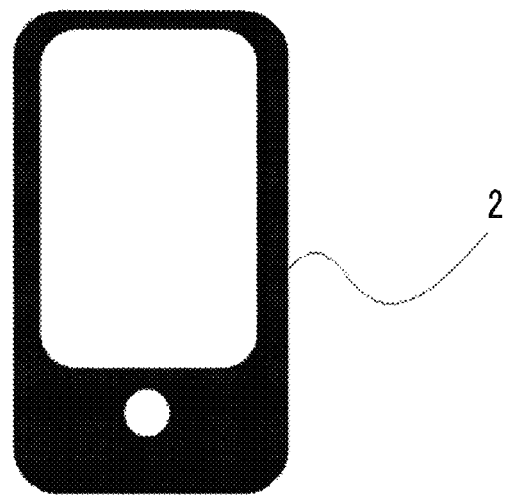
FIG. 5 is a top view illustrating an example of the front plate in which a mask layer is formed.
Figure 6:
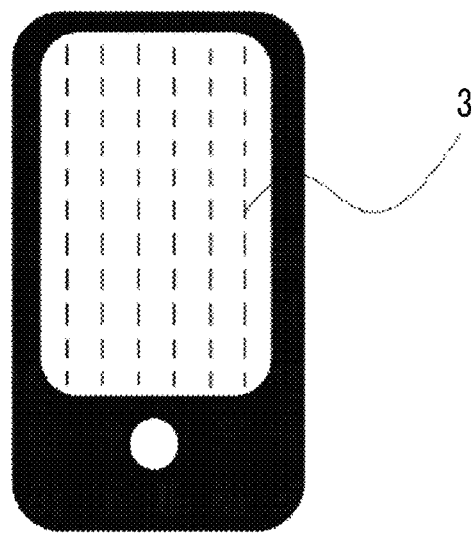
FIG. 6 is a top view illustrating an example of the front plate in which a first transparent electrode pattern is formed.
Figure 7:
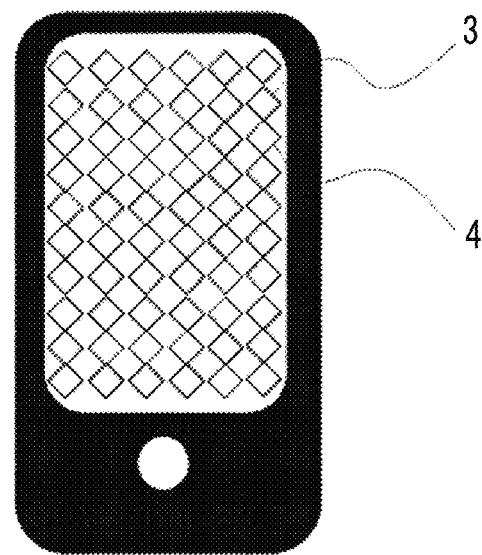
FIG. 7 is a top view illustrating an example of the front plate in which first and second transparent electrode patterns are formed.
Figure 8:
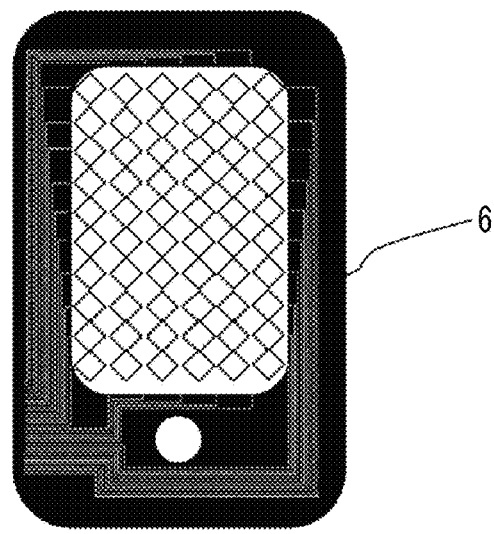
FIG. 8 is a top view illustrating an example of the front plate in which an additional conductive element separate from the first and second transparent electrode patterns is formed.

Examples of an aspect being formed in a process for manufacturing the electrostatic capacitance-type input device of the present invention include aspects of FIGS. 4 to 8. FIG. 4 is a top view illustrating an example of reinforced glass 11 in which the opening portion 8 is formed. FIG. 5 is a top view illustrating an example of the front plate in which the mask layer 2 is formed. FIG. 6 is a top view illustrating an example of the front plate in which the first transparent electrode pattern 3 is formed. FIG. 7 is a top view illustrating an example of the front plate in which the first transparent electrode pattern 3 and the second transparent electrode pattern 4 are formed. FIG. 8 is a top view illustrating an example of the front plate in which the additional conductive element 6 separate from the first and second transparent electrode patterns is formed. These are views illustrating examples in which the following description is specified, and the scope of the present invention is not interpreted to be limited by these drawings.

In the method for manufacturing an electrostatic capacitance-type input device, in a case in which the second transparent resin layer 12 and the curable transparent resin layer 7 are formed, the layers can be formed by transferring the second transparent resin layer and the curable transparent resin layer onto the surface of the front plate 1 on which the respective elements are arbitrarily formed using the transfer film of the present invention.

In the method for manufacturing an electrostatic capacitance-type input device, it is preferable to form at least one element of the mask layer 2, the first transparent electrode pattern 3, the second transparent electrode pattern 4, the insulating layer 5, and the conductive element 6 using the photosensitive film having the temporary support and the light-curable resin layer in this order.

When the respective elements are formed using the transfer film of the present invention or the photosensitive film, even in the substrate (the front plate) having an opening portion, resist components do not leak through the opening portion, and, particularly, in the mask layer in which it is necessary to form a light-blocking pattern up to the boundary line of the front plate, resist components do not flow out (leak) from the glass end, and thus the rear side of the front plate is not contaminated, and it is possible to manufacture touch panels having a reduced thickness and a reduced weight with simple steps.

When the mask layer, the insulating layer, and the conductive light-curable resin layer are used, in a case in which the permanent material of the first transparent electrode pattern, the second transparent electrode pattern, the conductive element, and the like is formed using the photosensitive film, the photosensitive film is laminated on a base material and then is exposed in a pattern shape as necessary, and non-exposed portions in the case of negative-type materials or exposed portions in the case of positive-type materials are removed by carrying out a development treatment, whereby patterns can be obtained. In the development, the thermoplastic resin layer and the light-curable resin layer may be developed and removed using separate fluids or may be removed using the same fluid. Well-known development facilities such as a brush and a high-pressure jet may be combined together as necessary. After the development, post exposure and post baking may be carried out as necessary.

(Photosensitive Film)

The photosensitive film other than the transfer film of the present invention which is preferably used to manufacture the electrostatic capacitance-type input device of the present invention will be described. The photosensitive film has a temporary support and a light-curable resin layer and preferably has a thermoplastic resin layer between the temporary support and the light-curable resin layer. When the mask layer and the like are formed using the photosensitive film having the thermoplastic resin layer, air bubbles are not easily generated in elements formed by transferring the light-curable resin layer, image unevenness or the like is not easily caused in image display devices, and excellent display characteristics can be obtained.

The photosensitive film may be a negative-type material or a positive-type material.

—Layers Other than Light-curable Resin Layer and Production Method—

As the temporary support and the thermoplastic resin layer in the photosensitive film, it is possible to use the thermoplastic resin layer described in Paragraphs "0041" to "0047" of JP2014-108541A. In addition, as the method for producing the photosensitive film, it is possible to use the same method as the production method described in "0041" to "0047" of JP2014-108541A.

—Light-curable Resin Layer—

In the photosensitive film, additives are added to the light-curable resin layer depending on the use of the photosensitive film. That is, in a case in which the photosensitive film is used to form the mask layer, a colorant is added to the light-curable resin layer. In addition, in a case in which the photosensitive film has a conductive light-curable resin layer, a conductive fiber or the like is added to the light-curable resin layer.

In a case in which the photosensitive film is a negative-type material, the light-curable resin layer preferably includes an alkali-soluble resin, a polymerizable compound, and a polymerization initiator or a polymerization initiator system. Furthermore, conductive fibers, colorants, other additives, and the like are used, but the components are not limited thereto.

—Alkali-soluble Resin, Polymerizable Compound, and Polymerization Initiator or Polymerization Initiator System—

As the alkali-soluble resin, the polymerizable compound, and the polymerization initiator or the polymerization initiator system included in the photosensitive film, it is possible to use the same alkali-soluble resin, polymerizable compound, and polymerization initiator or polymerization initiator system as those used for the transfer film of the present invention.

—Conductive Fiber (in the Case of being Used as a Conductive Light-curable Resin Layer)—

In a case in which the photosensitive film on which the conductive light-curable resin layer is laminated is used to form the transparent electrode patterns or the additional conductive element, it is possible to use the following conductive fibers and the like for the light-curable resin layer.

The structure of the conductive fiber is not particularly limited and can be appropriately selected depending on the purposes, but is preferably any one of a solid structure or a hollow structure.

Here, there are cases in which a fiber having a solid structure will be referred to as a "wire" and a fiber having a hollow structure will be referred to as a "tube". In addition, there are cases in which a conductive wire having an average short-axis length of 1 nm to 1,000 nm and an average long-axis length of 1 μm to 100 μm will be referred to as a "nanowire".

In addition, there are cases in which a conductive wire having an average short-axis length of 1 nm to 1,000 nm, an average long-axis length of 0.1 μm to 1,000 μm, and a hollow structure will be referred to as a "nanotube".

The material of the conductive fiber is not particularly limited as long as the material is conductive and can be appropriately selected depending on the purposes, but at least any one of metal and carbon is preferred, and, among these, the conductive fiber is particularly preferably at least any one of metal nanowires, metal nanotubes, and carbon nanotubes.

The materials of the metal nanowire is not particularly limited, and, for example, at least one metal selected from the group consisting of Groups 4, 5, and 6 of the extended periodic table (IUPAC1991) is preferred, at least one metal selected from Groups 2 to 14 is more preferred, at least one metal selected from Groups 2, 8, 9, 10, 11, 12, 13, and 14 is still more preferred, and materials including the above-described metal as a main component are particularly preferred.

Examples of the metal include copper, silver, gold, platinum, palladium, nickel, tin, cobalt, rhodium, iridium, iron, ruthenium, osmium, manganese, molybdenum, tungsten, niobium, tantalum, titanium, bismuth, antimony, lead, alloys thereof, and the like. Among these, metals mainly containing silver or metals containing an alloy of silver and a metal other than silver are preferred since the conductivity is excellent.

The metals mainly containing silver means that the content of silver in the metal nanowire is 50% by mass or more and preferably 90% by mass or more.

Examples of metals used to form the alloys with silver include platinum, osmium, palladium, iridium, and the like. Among these, one metal may be singly used or two or more metals may be jointly used.

The shape of the metal nanowire is not particularly limited and can be appropriately selected depending on the purposes. The shape may be, for example, an arbitrary shape such as a column shape having a polygonal cross-section; however, in applications in which high transparency is required, a column shape or a cross-sectional shape in which the corners of the polygonal of the cross-section are rounded is preferred.

The cross-sectional shape of the metal nanowire can be investigated by applying a water dispersion liquid of the metal nanowire on the base material and observing the cross-section using a transmission electron microscope (TEM).

Figure 9:
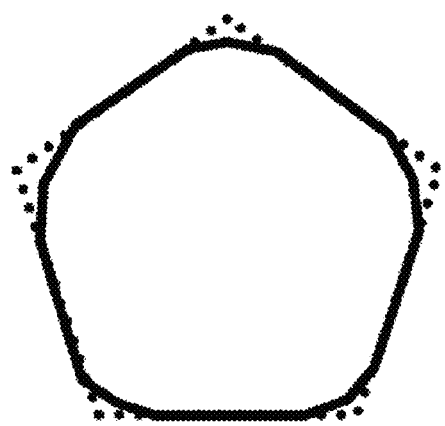
FIG. 9 is an explanatory view illustrating a cross-section of a metal nanowire.

A corner of the cross-section of the metal nanowire refers to a periphery portion of a point at which a line obtained by extending a side of the cross-section and a vertical line drawn from an adjacent side intersect each other. In addition, the "side of the cross-section" refers to a straight line connecting these corners adjacent to each other. In this case, the percentage of the "outer peripheral length of the cross-section" with respect to the total length of the "individual sides" is considered as the degree of sharpness. The degree of sharpness can be represented by, for example, in the cross-section of the metal nanowire as illustrated in FIG. 9, the percentage of the outer peripheral length of the cross-section indicated by a solid line with respect to the outer peripheral length of a pentagon indicated by a dotted line. A cross-sectional shape having a degree of sharpness of 75% or less is defined as a cross-sectional shape having round corners. The degree of sharpness is preferably 60% or less and more preferably 50% or less. When the degree of sharpness exceeds 75%, electrons are localized at this corner, and plasmon absorption increases, and thus the cross-section remains yellowish, which, in some cases, deteriorate transparency. In addition, the linearity of the edge portion of the pattern degrades, and there are cases in which rattling occurs. The lower limit of the degree of sharpness is preferably 30% and more preferably 40%.

The average short-axis length (in some cases, referred to as "the average short-axis diameter" or "the average diameter") of the metal nanowire is preferably 150 nm or less, more preferably 1 nm to 40 nm, still more preferably 10 nm to 40 nm, and particularly preferably 15 nm to 35 nm.

When the average short-axis length is less than 1 nm, the oxidation resistance deteriorates, and there are cases in which the durability deteriorates, and, when the average short-axis length exceeds 150 nm, the metal nanowire causes scattering, and there are cases in which sufficient transparency cannot be obtained.

The average short-axis length of the metal nanowire was obtained by observing 300 metal nanowires using a transmission electron microscope (TEM; manufactured by JEOL Ltd.; JEM-2000FX) and calculating the average value.

Meanwhile, in a case in which the short axis of the metal nanowire is not round, the shortest axis was considered as the short-axis length.

The average long-axis length (in some cases, referred to as "the average length") of the metal nanowire is preferably 1 μm to 40 μm, more preferably 3 μm to 35 μm, and still more preferably 5 μm to 30 μm.

When the average long-axis length is less than 1 μm, it is difficult to form dense networks, and there are cases in which sufficient conductivity cannot be obtained, and, when the average long-axis length exceeds 40 μm, the metal nanowire is too long and is thus tangled during manufacturing, and there are cases in which agglomerates are generated in the manufacturing process.

The average long-axis length of the metal nanowire was obtained by observing 300 metal nanowires using a transmission electron microscope (TEM; manufactured by JEOL Ltd.; JEM-2000FX) and calculating the average value. Meanwhile, in a case in which the metal nanowire is bent, a circle including the bending of the metal nanowire as an arc is considered, and the value computed from the radius and curvature thereof is used as the average long-axis length.

The layer thickness of the conductive light-curable resin layer is preferably 0.1 to 20 μm, more preferably 0.5 to 18 μm, and particularly preferably 1 to 15 μm from the viewpoint of the stability of coating fluids, drying during coating, and the development time during patterning.

The content of the conductive fiber in the total solid contents of the conductive light-curable resin layer is preferably 0.01% to 50% by mass, more preferably 0.05% to 30% by mass, and particularly preferably 0.1% to 20% by mass from the viewpoint of the conductivity and the stability of coating fluids.

—Colorant (in the Case of being Used as the Mask Layer)—

In a case in which the photosensitive film is used as the mask layer, it is possible to use a colorant in the light-curable resin layer. As the colorant that is used in the present invention, it is possible to preferably use well-known colorants (organic pigments, inorganic pigments, dyes, and the like). Furthermore, in the present invention, in addition to black colorants, mixtures of red pigments, blue pigments, green pigments, and the like can be used.

In a case in which the light-curable resin layer is used as a black mask layer, a black colorant is preferably included from the viewpoint of the optical density. Examples of the black colorant include carbon black, titanium carbon, iron oxide, titanium oxide, graphite, and the like, and, among these, carbon black is preferred.

In a case in which the light-curable resin layer is used as a white mask layer, it is possible to use the white pigments described in Paragraphs "0015" or "0114" of JP2005-7765A. In order to use the light-curable resin layer for mask layers having other colors, the pigments or dyes described in Paragraphs "0183" to "0185" of JP4546276B may be mixed into the light-curable resin layer. Specifically, it is possible to preferably use the pigments and dyes described in Paragraphs "0038" to "0054" of JP2005-17716A, the pigments described in Paragraphs "0068" to "0072" of JP2004-361447A, the colorants described in Paragraphs "0080" to "0088" of JP2005-17521A, and the like.

The colorant (preferably a pigment and more preferably carbon black) is desirably used as a dispersion liquid. This dispersion liquid can be prepared by adding a composition obtained by mixing the colorant and a dispersing agent in advance to an organic solvent (or a vehicle) described below and dispersing the composition in the organic solvent. The vehicle refers to a portion of a solvent in which a pigment is dispersed when paint is in a liquid state and includes a liquid component (a binder) that bonds with the pigment so as to form coated films and a component that dissolves and dilutes the above-described liquid component (an organic solvent).

The disperser which is used to disperse the pigment is not particularly limited, and examples thereof include well-known dispersers such as kneaders, roll mills, attritors, super mills, dissolvers, homogenizers, sand mills, and beads mills which are described in p. 438 of "Pigment Dictionary", Kunizou Asakura, vol. 1, Asakura Publishing Co., Ltd., 2000.

Furthermore, the pigment may be finely ground using a friction force by means of the mechanical grinding described in p. 310 of the same publication.

The colorant is preferably a colorant having a number-average particle diameter of 0.001 μm to 0.1 μm and more preferably a colorant of 0.01 μm to 0.08 μm from the viewpoint of the dispersion stability. Furthermore, the "particle diameter" mentioned herein refers to the diameter of a circle having the same area as the particle in an electron micrograph, and the "number-average particle diameter" refers to the average value of 100 particle diameters arbitrarily selected from the particle diameter of a number of particles.

The layer thickness of the light-curable resin layer including the colorant is preferably 0.5 to 10 μm, more preferably 0.8 to 5 μm, and particularly preferably 1 to 3 μm from the viewpoint of the thickness difference from other layers. The content ratio of the colorant in the solid content of the colored photosensitive resin composition is not particularly limited, but is preferably 15% to 70% by mass, more preferably 20% to 60% by mass, and still more preferably 25% to 50% by mass from the viewpoint of sufficiently shortening the development time.

The total solid content mentioned in the present specification refers to the total mass of non-volatile components excluding the solvent and the like from the colored photosensitive resin composition.

Furthermore, in a case in which the insulating layer is formed using the photosensitive film, the layer thickness of the light-curable resin layer is preferably 0.1 to 5 μm, more preferably 0.3 to 3 μm, and particularly preferably 0.5 to 2 μm from the viewpoint of maintaining the insulating property.

—Other Additives—

Furthermore, in the light-curable resin layer, other additives may be used. As the additives, it is possible to use the same additives as those used for the transfer film of the present invention.

In addition, as the solvent used to manufacture the photosensitive film by means of coating, it is possible to use the same solvent as that used for the transfer film of the present invention.

Hitherto, a case in which the photosensitive film is a negative-type material has been mainly described, but the photosensitive film may be a positive-type material. In a case in which the photosensitive film is a positive-type material, for example, the material and the like described in JP2005-221726A are used for the light-curable resin layer, but the components are not limited thereto.

(Formation of Mask Layer and Insulating Layer Using Photosensitive Film)

The mask layer 2 and the insulating layer 5 can be formed by transferring the light-curable resin layer to the front plate 1 or the like using the photosensitive film. For example, in a case in which a black mask layer 2 is formed, the black mask layer can be formed by transferring the black light-curable resin layer on the surface of the front plate 1 using the photosensitive film having a black light-curable resin layer as the light-curable resin layer. In a case in which the insulating layer 5 is formed, the insulating layer can be formed by transferring the light-curable resin layer on the surface of the front plate 1 on which the first transparent electrode pattern has been formed using the photosensitive film having a light-curable resin layer as the light-curable resin layer.

Furthermore, when the photosensitive film having a specific layer constitution in which the thermoplastic resin layer is provided between the light-curable resin layer and the temporary support is used to form the mask layer 2 requiring a light-blocking property, it is possible to prevent the generation of air bubbles during the lamination of the photosensitive film and form a high-quality mask layer 2 or the like from which light does not leak.

(Formation of First and Second Transparent Electrode Patterns and Additional Conductive Element Using Photosensitive Film)

The first transparent electrode pattern 3, the second transparent electrode pattern 4, and the additional conductive element 6 can be formed by an etching treatment, using the photosensitive film having a conductive light-curable resin layer, or using a photosensitive film as a liftoff material.

—Etching Treatment—

In a case in which the first transparent electrode pattern 3, the second transparent electrode pattern 4, and the additional conductive element 6 can be formed by an etching treatment, first, a transparent electrode layer such as ITO is formed on the non-touch surface of the front plate 1 on which the mask layer 2 and the like have been formed by means of sputtering. Next, an etching pattern is formed on the transparent electrode layer by means of exposure and development using the photosensitive film having a light-curable resin layer for etching as the light-curable resin layer. After that, a transparent electrode is patterned by etching the transparent electrode layer, and the etching pattern is removed, whereby the first transparent electrode pattern 3 or the like can be formed.

Even in a case in which the photosensitive film is used as an etching resist (an etching pattern), resist patterns can be obtained in the same manner as in the above-described method. As the etching pattern, it is possible to apply etching and resist peeling using the well-known method described in Paragraphs "0048" to "0054" of JP2010-152155A.

Examples of the method for etching include wet-etching methods which are generally carried out and in which subjects are immersed in etching fluids. As an etching fluid used for wet-etching, an acidic-type etching fluid or an alkali-type etching fluid may be appropriately selected in accordance with etching subjects. Examples of the acidic-type etching fluid include aqueous solutions of an acidic component alone such as hydrochloric acid, sulfuric acid, or hydrofluoric acid, mixed aqueous solutions of an acidic component and a salt such as iron (II) chloride, ammonium chloride, or potassium permanganate, and the like. As the acidic component, a component obtained by combining multiple acidic components may be used. In addition, examples of the alkali-type etching fluid include aqueous solution of an alkali component alone such as a salt of an organic amine such as sodium hydroxide, potassium hydroxide, ammonia, organic amines, or tetramethyl ammonium hydroxide, mixed aqueous solutions of an alkali component and a salt such as potassium permanganate, and the like. As the alkali component, a component obtained by combining multiple alkali components may be used.

The temperature of the etching fluid is not particularly limited, but is preferably 45° C. or lower. In the present invention, a resin pattern that is used as an etching mask (an etching pattern) is formed using the above-described light-curable resin layer and thus exhibit particularly excellent resistance to acidic and alkaline etching fluids in the above-described temperature range. Therefore, the peeling of the resin pattern during the etching step is prevented, and portions free of the resin pattern are selectively etched.

After the etching, a washing step and a drying step may be carried out as necessary in order to prevent line contamination. In the washing step, for example, the base material is washed for 10 to 300 seconds with pure water at normal temperature, and the drying step may be carried out using an air blow at an appropriately-adjusted air blow pressure (approximately 0.1 to 5 kg/cm$^2$).

Next, the method for peeling the resin pattern is not particularly limited, and examples thereof include a method in which the base material is immersed in a peeling fluid for 5 to 30 minutes while being stirred at, for example, 30° to 80° and preferably at 50° to 80°. As described above, the resin pattern that is used as the etching mask in the present invention exhibits excellent chemical resistance at 45° C. or lower; however, when the chemical temperature reaches 50° C. or higher, the resin pattern exhibits a property of being swollen by alkaline peeling fluids. Due to the above-described properties, when the peeling step is carried out using a peeling fluid of 50° C. to 80° C., there are advantages that the step time is shortened and the amount of the peeling residue of the resin pattern decreases. That is, when a difference is provided to the chemical temperature between the etching step and the peeling step, the resin pattern that is used as the etching mask in the present invention exhibits favorable chemical resistance in the etching step and also exhibits a favorable peeling property in the peeling step, whereby two conflict characteristics of the chemical resistance and the peeling property can be satisfied.

Examples of the peeling fluid include peeling fluids obtained by dissolving an inorganic alkali component such as sodium hydroxide or potassium hydroxide or an organic alkali component such as a tertiary amine or quaternary ammonia in water, dimethyl sulfoxide, N-methyl pyrrolidone, or a mixed solution thereof. The resin pattern may be peeled using the above-described peeling fluid and a spray method, a shower method, a puddle method, or the like.

—Photosensitive Film Having Conductive Light-curable Resin Layer—

In a case in which the first transparent electrode pattern 3, the second transparent electrode pattern 4, and the additional conductive element 6 are formed using the photosensitive film having a conductive light-curable resin layer, the first transparent electrode pattern, the second transparent electrode pattern, and the additional conductive element 6 can be formed by transferring the conductive light-curable resin layer to the surface of the front plate 1.

When the first transparent electrode pattern 3 is formed using the photosensitive film having a conductive light-curable resin layer, even in the substrate (the front plate) having an opening portion, resist components do not leak through the opening portion, the rear side of the substrate is not contaminated, and it becomes possible to manufacture touch panels having merits of thickness reduction and weight reduction with simple steps.

Furthermore, when the photosensitive film having a specific layer constitution in which the thermoplastic resin layer is provided between the conductive light-curable resin layer and the temporary support is used to form the first transparent electrode pattern 3 and the like, it is possible to prevent the generation of air bubbles during the lamination of the photosensitive film and form the first transparent electrode pattern 3, the second transparent electrode pattern 4, and the additional conductive element 6 which have excellent conductivity and small resistance.

—Use of Photosensitive Film as Liftoff Material—

In addition, it is also possible to form the first transparent electrode layer, the second transparent electrode layer, and other conductive members using the photosensitive film as a liftoff material.

In this case, desired transparent conductive layer patterns can be obtained by patterning the base material using the photosensitive film, then, forming the transparent conductive layer on the entire surface of the base material, and then dissolving and removing the light-curable resin layer from each of the accumulated transparent electrode layers (a liftoff method).

[Image Display Device]

An image display device of the present invention is an image display device including the electrostatic capacitance-type input device of the present invention as a constituent element.

To the electrostatic capacitance-type input device of the present invention and an image display device including this electrostatic capacitance-type input device as a constituent element, it is possible to apply the constitution disclosed by "Advanced touch panel technology" (published by Techno Times Co., Ltd. on Jul. 6, 2009), "Technology and development of touch panels" edited by Yuji Mitani, CMC Publishing Co., Ltd. (December 2004), FPD International 2009 Forum T-11 lecture textbook, Cypress Semiconductor Corporation application note AN2292, and the like.

EXAMPLES

Hereinafter, the present invention will be more specifically described using examples. Materials, amounts used, proportions, processing contents, processing orders, and the like described in the following examples can be appropriately modified within the scope of the gist of the present invention. Therefore, the scope of the present invention is not limited by specific examples described below. Meanwhile, unless particularly otherwise described, "parts" are mass-based.

Examples 1 to 15 and Comparative Example 1 to 8

<Formation of Curable Transparent Resins>

A coating fluid for a curable transparent resin layer having a formulation shown as Material-1 to Material-13 in Table 1 below was adjusted and applied on a polyethylene terephthalate film (a temporary support) having a thickness shown in Table 2 below using a slit-shaped nozzle so as to reach a desired film thickness shown in Table 2 below, was dried at 100° C. for two minutes, and furthermore, was dried at 120° C. for one minute, thereby forming a curable transparent resin layer.

In addition, the proportion (mass ratio) of the content of a photopolymerizable compound with respect to the content of a binder polymer included in Material-1 to Material-13 was obtained and shown in Table 1 below.

TABLE 1

| | Material | Material-1 | Material-2 | Material-3 | Material-4 | Material-5 | Material-6 | Material-7 | Material-8 | Material-9 | Material-10 | Material-11 | Material-12 | Material-13 |
|---|---|---|---|---|---|---|---|---|---|---|---|---|---|---|
| Photopolymerizable compound | DPHA liquid (dipentaerythritol hexaacrylate: 38%, dipentaerythritol pentaacrylate: 38%, 1-methoxy-2-propylacetate: 24%) | 7.60 | 7.60 | 6.62 | 6.62 | 5.80 | 5.47 | 0.00 | 0.00 | 0.00 | 0.00 | 10.35 | 0.00 | 12.55 |
| | Urethane-based monomer: UK OLIGO UA-32P manufactured by Shin-Nakamura Chemical Co., Ltd. non-volatile component: 75%, 1-methoxy-2-propylacetate: 25%) | 3.60 | 3.60 | 3.10 | 3.10 | 2.90 | 0.00 | 0.00 | 0.00 | 0.00 | 0.00 | 0.00 | 0.00 | 0.00 |
| | Monomer mixture (polymerizable compound (b2-1) described in Paragraph "0111" of JP2012-78528A, n = 1: tripentaerythritol octaacrylate with content ratio of 85%, as impurities, the total of n = 2 and n = 3 is 15%) | 9.60 | 9.60 | 8.81 | 8.81 | 7.30 | 0.00 | 0.00 | 0.00 | 0.00 | 0.00 | 0.00 | 5.56 | 0.00 |
| | Pentaerythritol tetraacrylate (NK ester A-TMMT, manufactured by Shin-Nakamura Chemical Co., Ltd.) | 0.00 | 0.00 | 0.00 | 0.00 | 0.00 | 0.00 | 0.00 | 0.00 | 0.00 | 5.51 | 0.00 | 0.00 | 0.00 |
| | Tetraacrylate of pentaerythritol ethylene oxide adduct (KAYARAD RP-1040 manufactured by Nippon Kayaku Co., Ltd.) | 0.00 | 0.00 | 0.00 | 0.00 | 0.00 | 4.13 | 0.00 | 0.00 | 0.00 | 0.00 | 9.35 | 0.00 | 0.00 |
| | Tricyclodecane dimethanol diacrylate (A-DCP, manufactured by Shin-Nakamura Chemical Co., Ltd.) | 0.00 | 0.00 | 0.00 | 0.00 | 0.00 | 0.00 | 8.31 | 0.00 | 0.00 | 0.00 | 0.00 | 0.00 | 0.00 |
| | Ethoxified bisphenol A diacrylate (A-BPE-10, manufactured by Shin-Nakamura Chemical Co., Ltd.) | 0.00 | 0.00 | 0.00 | 0.00 | 0.00 | 0.00 | 0.00 | 0.00 | 0.00 | 5.51 | 0.00 | 0.00 | 0.00 |
| | Polyethylene glycol #200 diacrylate (A-200, manufactured by Shin-Nakamura Chemical Co., Ltd.) | 0.00 | 0.00 | 0.00 | 0.00 | 0.00 | 0.00 | 0.00 | 0.00 | 0.00 | 0.00 | 0.00 | 7.80 | 0.00 |
| | Ethoxified isocianurate triacrylate (A-9300, manufactured by Shin-Nakamura Chemical Co., Ltd.) | 0.00 | 0.00 | 0.00 | 0.00 | 0.00 | 0.00 | 0.00 | 0.00 | 0.00 | 0.00 | 0.00 | 0.00 | 6.35 |
| | Urethane acrylate U-15HA (manufactured by Shin-Nakamura Chemical Co., Ltd.) | 0.00 | 0.00 | 0.00 | 0.00 | 0.00 | 0.00 | 2.52 | 4.9 | 9.8 | 0.00 | 0.00 | 0.00 | 0.00 |

TABLE 1-continued

| | Material | Material-1 | Material-2 | Material-3 | Material-4 | Material-5 | Material-6 | Material-7 | Material-8 | Material-9 | Material-10 | Material-11 | Material-12 | Material-13 |
|---|---|---|---|---|---|---|---|---|---|---|---|---|---|---|
| Binder polymer | Polymer solution 1 (structural formula P-25 described in Paragraph "0058" of JP2008-146018A: weight-average molecular weight of 35,000, solid content: 45%, 1-methoxy-2-propyl acetate: 15%, 1-methoxy 2-propanol 40%) | 11.80 | 13.30 | 13.30 | 15.20 | 18.10 | 6.70 | 9.60 | 9.60 | 8.60 | 8.90 | 16.5 | 0.00 | 16.52 |
| | Polymer solution 2 (copolymer of methacrylic acid/methyl methacrylate/butyl methacrylate: molecular weight of 60,000, compositional ratio: 30/30/40, non-volatile component: 45%, 1-methoxy-2-propyl acetate 55%) | 0.00 | 0.00 | 0.00 | 0.00 | 0.00 | 0.00 | 0.00 | 0.00 | 0.00 | 0.00 | 0.00 | 9.16 | 0.00 |
| Photopolymerization initiator | Light radical-polymerization initiator: 2-benzyl-2-dimethylamino-1-(4-morpholinophenyl)-butanone (IRGACURE 379, manufactured by BASF) | 0.09 | 0.18 | 0.18 | 0.18 | 0.18 | 0.61 | 0.00 | 0.00 | 0.61 | 0.00 | 0.61 | 0.61 | 0.61 |
| | Light radical-polymerization initiator: 1,2-octanedione, 1-[4-(phenylthio)-2-(O-benzoyloxime)] [IGACURE OXE-01, manufactured by BASF] | 0.00 | 0.00 | 0.00 | 0.00 | 0.00 | 0.00 | 0.00 | 0.00 | 0.00 | 0.00 | 0.00 | 0.00 | 0.00 |
| | Photopolymerization initiator, KAYACURE DETX-S (allyl thioxanthone manufactured by Nippon Kayaku Co., Ltd.) | 0.09 | 0.18 | 0.18 | 0.18 | 0.18 | 0.00 | 0.00 | 0.00 | 0.00 | 0.21 | 0.00 | 0.00 | 0.00 |
| Surfactant | Polymer solution 3 (structural formula represented by General Formula (1) below: weight-average molecular weight of 15,000, non-volatile component: 30 wt %, methyl ethyl ketone: 70 wt %) | 0.03 | 0.03 | 0.03 | 0.03 | 0.03 | 0.03 | 0.03 | 0.03 | 0.03 | 0.03 | 0.03 | 0.03 | 0.03 |
| Solvent | 1-Methoxy-2-propyl acetate | 29.15 | 27.47 | 29.74 | 27.84 | 27.47 | 45.19 | 41.06 | 40.49 | 34.78 | 53.33 | 13.04 | 41.22 | 26.07 |
| | Methyl ethyl ketone | 38.04 | 38.04 | 38.04 | 38.04 | 38.04 | 37.87 | 37.87 | 37.87 | 37.87 | 26.51 | 35.62 | 35.62 | 37.87 |
| Total (parts by mass) | | 100 | 100 | 100 | 100 | 100 | 100 | 100 | 100 | 100 | 100 | 100 | 100 | 100 |
| Photopolymerizable compound/binder polymer | | 0.759 | 0.673 | 0.601 | 0.526 | 0.380 | 0.645 | 0.508 | 0.534 | 0.948 | 0.557 | 0.537 | 0.656 | 0.515 |
| Melt viscosity at 100° C. (ηc (×10³ Pa · s)) | | 0.76 | 1.72 | 3.28 | 5.24 | 8.92 | 1.85 | 5.62 | 4.95 | 0.58 | 4.82 | 4.95 | 1.88 | 5.52 |

Meanwhile, "wt %" in Table 1 is identical to "% by mass".

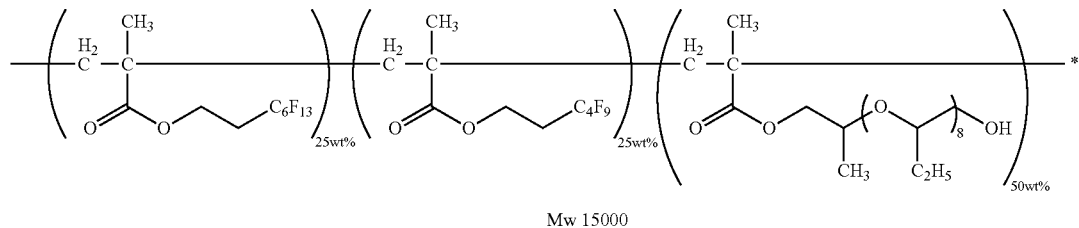

General Formula (1)

Mw 15000

<Evaluation of Transfer Films>

(Evaluation of Refractive Indexes of Curable Transparent Resin Layers)

The average refractive indexes of the curable transparent resin layers with respect to light rays having a wavelength of 400 to 750 nm were obtained and shown in Table 2 below.

(Measurement of Melt Viscosity ηc of Curable Transparent Resin Layers at 100° C.)

In the measurement of the melt viscosity ηc of the curable transparent resin layer at 100° C., the melt viscosity of the curable transparent resin layer can be measured, for example, in the following manner. The solvent was removed from the coating fluid for the curable transparent resin layer by means of drying at the atmosphere and at a reduced pressure so as to produce a measurement sample, PIBERON (DD-III type: manufactured by Toyo Baldwin Co., Ltd.) was used as a measurement instrument, the melt viscosity was measured under conditions of a measurement start temperature of 50° C., a measurement end temperature of 150° C., a temperature increase rate of 5° C./minute, and a vibration number of 1 Hz/deg, and the measurement value at 100° C. was used. The obtained results are shown in Tables 1 and 2 below.

<Pressing of Protective Films>

After the curable transparent resin layer and a second transparent resin layer were provided on a temporary support in the above-described manner so as to obtain a dried film thickness in the following table, finally, a protective film (a polypropylene film having a thickness of 12 μm) was pressed.

A transfer film in which the temporary support, the curable transparent resin layer, and the protective film had been integrated together was produced in the above-described manner. The obtained transfer films were used as transfer films of Examples 1 to 15 and Comparative Examples 1 to 8. The constitution of the transfer films of Examples 1 to 15 and Comparative Examples 1 to 8 is illustrated in FIG. 16. In the transfer films 30 of Examples 1 to 15 and Comparative Examples 1 to 8, the temporary support 26 and the curable transparent resin layer 7 were in direct contact with each other, and furthermore, the protective film 29 was provided.

<Manufacturing of Laminate>

The method for manufacturing a laminate will be described on the basis of FIGS. 17 and 18.

A copper conductive element which had an elevation, which constituted an elevation difference, having a thickness of 100 nm and a rectangular shape (with a vertical length of 2 cm and a horizontal length of 5 cm) when seen from the above of a film base material in a case in which the lamination direction 42 was considered as the machine direction was formed on the film base material. Therefore, a base material 43 having an elevation difference in which an elevation 41 constituting an elevation difference was the copper conductive element, the lower portion 41c of the elevation constituting the elevation difference was the film base material 1A, and the upper portion 41a of the elevation constituting an elevation difference was the upper portion of the copper conductive element was obtained.

In the base material having an elevation difference, the side portion 41b of the elevation constituting an elevation difference had an inclined structure in which the upper portion of the elevation was narrower than the lower portion of the elevation (a so-called taper shape), and the angle formed by the side portion of the elevation constituting the elevation difference and the substrate was approximately 78°. In addition, when seen from the above of the film base material, the width of the side portion of the elevation constituting the elevation difference was as long as 20 nm.

On the base material having an elevation difference which had been obtained using the above-described method, the curable transparent resin layer of the transfer film of each of Examples 1 to 15 and Comparative Examples 1 to 8 was continuously laminated from the lamination direction 42 illustrated in FIG. 17 so as to cover the entire elevation difference, and the curable transparent resin layer was laminated thereon (a rubber roller temperature of 100° C., a linear pressure of 100 N/cm, and a transportation speed of 2.0 m/minute). Meanwhile, this lamination method include one elevation difference-ascending step of laminating the curable transparent resin layer from the lower portion of the elevation constituting the elevation difference to the upper portion of the elevation in this order and one elevation difference-descending step of laminating the curable transparent resin layer from the upper portion of the elevation constituting the elevation difference to the lower portion of the elevation in this order, respectively.

<Evaluation of Laminates>

(Incorporation of Air Bubbles During Lamination on Base Material Having Elevation Difference)

The number of air bubbles incorporated into a region along the elevation difference was observed using an optical microscope and was evaluated according to the following standards. The region along the elevation difference refers to a portion in contact with the lower end of the side portion of the elevation constituting the elevation difference in a direction perpendicular to the lamination direction of the transfer film. FIG. 17 illustrates an example of the region 44 along the elevation difference, but the region along the elevation difference is not limited to the region indicated by the reference signal 44 and is present along the four sides of the periphery of the elevation 41 constituting the elevation difference in FIG. 17.

A: The number of air bubbles in the region along the elevation difference was less than five.

B: The number of air bubbles in the region along the elevation difference was five or more and less than 30.

C: The number of air bubbles in the region along the elevation difference was 30 or more and less than 100.

D: The number of air bubbles in the region along the elevation difference was 100 or more.

TABLE 2

|  | Temporary support | | Curable transparent resin layer | | | Melt viscosity $\eta c$ at 100° C. ($\times 10^3$ Pa·s) | Incorporation of air bubbles during lamination on base material having elevation difference |
|---|---|---|---|---|---|---|---|
|  | Kind (thickness) | Bending stiffness [N·mm²] | Material | Thickness | Refractive index | | |
| Example 1 | PET film (16 μm) | $1.4 \times 10^{-3}$ | Material-2 | 8 μm | 1.51 | 1.72 | B |
| Example 2 | PET film (25 μm) | $5.2 \times 10^{-3}$ | Material-3 | 5 μm | 1.51 | 3.28 | B |
| Example 3 | PET film (28 μm) | $7.3 \times 10^{-3}$ | Material-4 | 5 μm | 1.53 | 5.24 | A |
| Example 4 | PET film (20 μm) | $2.7 \times 10^{-3}$ | Material-5 | 6 μm | 1.51 | 8.92 | A |
| Example 5 | PET film (20 μm) | $2.7 \times 10^{-3}$ | Material-6 | 7 μm | 1.51 | 1.85 | B |
| Example 6 | PET film (28 μm) | $7.3 \times 10^{-3}$ | Material-7 | 8 μm | 1.51 | 5.62 | A |
| Example 7 | PET film (16 μm) | $1.4 \times 10^{-3}$ | Material-8 | 9 μm | 1.51 | 4.95 | A |
| Example 8 | PET film (25 μm) | $5.2 \times 10^{-3}$ | Material-10 | 10 μm | 1.52 | 4.82 | A |
| Example 9 | PET film (16 μm) | $1.4 \times 10^{-3}$ | Material-11 | 12 μm | 1.52 | 4.95 | A |
| Example 10 | PET film (16 μm) | $1.4 \times 10^{-3}$ | Material-12 | 6 μm | 1.52 | 1.88 | B |
| Example 11 | PET film (16 μm) | $1.4 \times 10^{-3}$ | Material-13 | 6 μm | 1.52 | 5.52 | A |
| Example 12 | PET film (38 μm) | $1.8 \times 10^{-2}$ | Material-6 | 7 μm | 1.51 | 1.85 | C |
| Example 13 | PET film (16 μm) | $1.4 \times 10^{-3}$ | Material-6 | 7 μm | 1.51 | 1.85 | B |
| Example 14 | PET film (16 μm) | $1.4 \times 10^{-3}$ | Material-7 | 8 μm | 1.51 | 5.62 | A |
| Example 15 | PET film (25 μm) | $5.2 \times 10^{-3}$ | Material-8 | 16 μm | 1.51 | 4.95 | A |
| Comparative Example 1 | PET film (50 μm) | $4.1 \times 10^{-2}$ | Material-1 | 5 μm | 1.51 | 0.76 | D |
| Comparative Example 2 | PET film (50 μm) | $4.1 \times 10^{-2}$ | Material-1 | 8 μm | 1.51 | 0.76 | D |
| Comparative Example 3 | PET film (38 μm) | $1.8 \times 10^{-2}$ | Material-1 | 5 μm | 1.51 | 0.76 | D |
| Comparative Example 4 | PET film (16 μm) | $1.4 \times 10^{-3}$ | Material-1 | 4.5 μm | 1.51 | 0.76 | D |
| Comparative Example 5 | PET film (16 μm) | $1.4 \times 10^{-3}$ | Material-1 | 3 μm | 1.51 | 0.76 | D |
| Comparative Example 6 | PET film (75 μm) | $1.4 \times 10^{-1}$ | Material-2 | 5 μm | 1.51 | 1.72 | D |
| Comparative Example 7 | PET film (125 μm) | $6.5 \times 10^{-1}$ | Material-5 | 8 μm | 1.51 | 8.92 | D |
| Comparative Example 8 | PET film (16 μm) | $1.4 \times 10^{-3}$ | Material-9 | 8 μm | 1.51 | 0.58 | D |

It was found from Table 2 that, in the transfer film of the present invention, the temporary support and the curable transparent resin layer were in direct contact with each other and it was possible to prevent the incorporation of air bubbles during lamination on the base material having an elevation difference.

On the other hand, it was found from Comparative Examples 1 and 2 that, when a transfer film in which the thickness of the temporary support was above the upper limit value specified in the present invention and the melt viscosity $\eta c$ of the curable transparent resin layer measured at 100° C. was below the lower limit value specified in the present invention was used, a number of air bubbles incorporated during lamination on the base material having an elevation difference.

It was found from Comparative Examples 3 and 8 that, when a transfer film in which the melt viscosity $\eta c$ of the curable transparent resin layer measured at 100° C. was below the lower limit value specified in the present invention was used, a number of air bubbles incorporated during lamination on the base material having an elevation difference.

It was found from Comparative Examples 4 and 5 that, when a transfer film in which the thickness of the curable transparent resin layer was below the lower limit value specified in the present invention and the melt viscosity $\eta c$ of the curable transparent resin layer measured at 100° C. was below the lower limit value specified in the present invention was used, a number of air bubbles incorporated during lamination on the base material having an elevation difference.

It was found from Comparative Examples 6 and 7 that, when a transfer film in which the thickness of the temporary support was above the upper limit value specified in the present invention was used, a number of air bubbles incorporated during lamination on the base material having an elevation difference.

Meanwhile, in Examples 1 to 15, it was confirmed that, in a case in which the transportation speed was set to 4.0 m/minute during the lamination of the transfer film of the present invention, the number of air bubbles incorporated into the region along the elevation difference was almost the same as that in a case in which the transportation speed was 2.0 m/minute.

Examples 101 to 110

<Formation of Curable Transparent Resin Layers>

A coating fluid for a curable transparent resin layer having a formulation shown as Material-1 to Material-13 in Table 1 was adjusted and applied on a polyethylene terephthalate film (a temporary support) having a thickness shown in Table 4 below using a slit-shaped nozzle so as to reach a desired film thickness shown in Table 4 below, was dried at 100° C. for two minutes, and furthermore, was dried at 120° C. for one minute, thereby forming a curable transparent resin layer.

<Formation of Second Transparent Resin Layers>

Next, a coating fluid for a second transparent resin layer having a formulation shown as Material-40 to Material-49 in Table 3 below was adjusted and applied on the curable transparent resin layer under adjustment so as to obtain a desired film thickness shown in Table 4 below, was dried at 80° C. for one minute, and furthermore, was dried at 110° C. for one minute, thereby forming a second transparent resin layer.

TABLE 3

| Material | Material-40 | Material-41 | Material-42 | Material-43 | Material-44 | Material-45 | Material-46 | Material-47 | Material-48 | Material-49 |
|---|---|---|---|---|---|---|---|---|---|---|
| NANOUSE OZ-S30M: $ZrO_2$ particles, methanol dispersion liquid (non-volatile component: 30.5%), manufactured by Nissan Chemical Industries, Ltd. | 4.33 | 4.33 | 4.02 | 4.33 | 4.20 | 0.00 | 4.33 | 4.52 | 4.71 | 4.89 |
| NANOUSE ZR-3013FN: $ZrO_2$ particles, methanol dispersion liquid (non-volatile component: 30.5%), manufactured by Nissan Chemical Industries, Ltd. | 0.00 | 0.00 | 0.00 | 0.00 | 0.00 | 4.33 | 0.00 | 0.00 | 0.00 | 0.00 |
| Polymerizable compound of Structural Formula 1 below | 0.00 | 0.00 | 0.00 | 0.00 | 0.31 | 0.00 | 0.00 | 0.00 | 0.00 | 0.00 |
| Ammonia water (25%) | 7.84 | 7.84 | 7.84 | 7.84 | 7.84 | 7.84 | 7.84 | 7.84 | 7.84 | 7.84 |
| Copolymer resin of methacrylic acid/methyl methacrylate (Mw: 15,000, compositional ratio = 40/60, non-volatile component: 99.8%) | 0.66 | 0.00 | 0.00 | 0.00 | 0.00 | 0.00 | 0.00 | 0.00 | 0.00 | 0.00 |
| Copolymer resin of methacrylic acid/allyl methacrylate (Mw: 25,000, compositional ratio = 40/60, non-volatile component: 99.8%) | 0.00 | 0.66 | 0.66 | 0.00 | 0.00 | 0.00 | 0.66 | 0.66 | 0.66 | 0.66 |
| Copolymer resin of methacrylic acid/benzyl methacrylate (Mw: 30,000, compositional ratio = 30/70, non-volatile component: 99.8%) | 0.00 | 0.00 | 0.00 | 0.66 | 0.66 | 0.00 | 0.00 | 0.00 | 0.00 | 0.00 |
| 10% Aqueous solution of polyvinyl alcohol resin (PVA205C, degree of saponification: 88 mol %, degree of polymerization: 1,750, 10% aqueous solution obtained using resin manufactured by polyvinyl alcohol Kuraray Co., Ltd.) | 0.00 | 0.00 | 0.00 | 0.00 | 0.00 | 0.00 | 0.00 | 0.00 | 0.00 | 0.00 |
| Hydroxyalkylamide-curable carboxyl group-containing polyester resin, FINETECH FINEDIC (manufactured by DIC Corporation) | 0.00 | 0.00 | 0.00 | 0.00 | 0.00 | 0.66 | 0.00 | 0.00 | 0.00 | 0.00 |
| Cellulose resin (HPC-L, manufactured by Nippon Soda Co., Ltd.) | 0.00 | 0.00 | 0.00 | 0.00 | 0.00 | 0.00 | 0.00 | 0.00 | 0.00 | 0.00 |
| Phosphoric acid monomer (JPA-514, manufactured by Johoku Chemical Co., Ltd.) | 0.00 | 0.00 | 0.29 | 0.00 | 0.00 | 0.00 | 0.00 | 0.00 | 0.00 | 0.00 |
| Phosphoric acid polymer (polyphosmer MHB-10, manufactured by DAP Co., Ltd., non-volatile component: 30.4%, water: 69.6%) | 0.00 | 0.29 | 0.00 | 0.00 | 0.00 | 0.00 | 0.00 | 0.00 | 0.00 | 0.29 |

TABLE 3-continued

| Material | Material-40 | Material-41 | Material-42 | Material-43 | Material-44 | Material-45 | Material-46 | Material-47 | Material-48 | Material-49 |
|---|---|---|---|---|---|---|---|---|---|---|
| Benzimidazole (manufactured by Wako Pure Chemical Industries, Ltd.) | 0.00 | 0.00 | 0.00 | 0.05 | 0.00 | 0.00 | 0.00 | 0.00 | 0.00 | 0.00 |
| Water-soluble photopolymerization initiator IRGACURE 2959 (manufactured by BASF SE) | 0.00 | 0.00 | 0.00 | 0.00 | 0.04 | 0.00 | 0.00 | 0.00 | 0.00 | 0.00 |
| Ion exchange water | 70.58 | 70.29 | 70.60 | 70.53 | 70.35 | 70.58 | 27.17 | 6.98 | 81.69 | 69.72 |
| Methanol | 16.59 | 16.59 | 16.59 | 16.59 | 16.59 | 16.59 | 60.00 | 80.00 | 5.10 | 16.59 |
| Total (parts by mass) | 100 | 100 | 100 | 100 | 100 | 100 | 100 | 100 | 100 | 100 |
| pH at 25° C. | 8.2 | 7.9 | 7.8 | 8.2 | 7.8 | 7.9 | 7.3 | 7.6 | 7.8 | 7.9 |

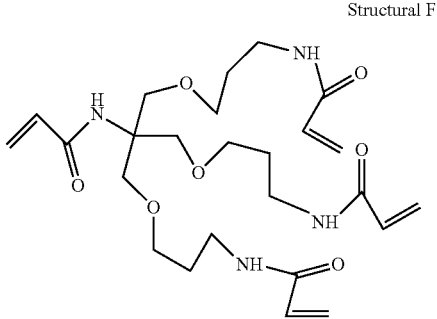

Structural Formula 1

$ZrO_2$ used in zirconia dispersion liquids in Table 3 has a refractive index of 2.2 and an average particle diameter of 12 nm.

<Evaluation>

The refractive indexes and thicknesses of the curable transparent resin layers and the second transparent resin layers and the melt viscosity of the curable transparent resin layers were measured using the same methods as in Example 1. The obtained results are shown in Table 4 below.

<Pressing of Protective Films>

After the curable transparent resin layer and the second transparent resin layer were provided on a temporary support in the above-described manner so as to obtain a dried film thickness in the following table, finally, a protective film (a polypropylene film having a thickness of 12 μm) was pressed.

A transfer film in which the temporary support, the curable transparent resin layer, the second transparent resin layer, and the protective film had been integrated together was produced in the above-described manner. The obtained transfer films were used as transfer films of Examples 101 to 110.

<Manufacturing of Laminate>

A transparent electrode pattern having a thickness of 100 nm was formed on the film base material, and a base material having an elevation difference was provided in the same manner as in Example 1.

The transfer film of Example 101 was laminated (a rubber roller temperature of 100° C., a linear pressure of 100 N/cm, and a transportation speed of 2.0 m/minute) on the base material having an elevation difference in the same manner as in Example 1 except for the fact that, in Example, 1, the transfer film of each of Examples 101 to 110 was used instead of the transfer film of Example 1.

<Evaluation of Laminates>

(Incorporation of Air Bubbles During Lamination on Base Material Having Elevation Difference)

The incorporation of air bubbles during lamination on the base material having an elevation difference was evaluated in the same manner as in Example 1. The obtained results are shown in Table 4 below.

TABLE 4

| | Temporary support | Curable transparent resin layer | | | | Second transparent resin layer | | | Incorporation of air bubbles during lamination on base material having elevation difference |
|---|---|---|---|---|---|---|---|---|---|
| | Kind (thickness) | Material | Thickness | Refractive index | Melt viscosity ηc at 100° C. ($\times 10^3$ Pa·s) | Material | Thickness | Refractive index | |
| Example 101 | PET film (38 μm) | Material-2 | 8 μm | 1.51 | 1.72 | Material-40 | 98 nm | 1.65 | C |
| Example 102 | PET film (16 μm) | Material-3 | 5 μm | 1.51 | 3.78 | Material-41 | 83 nm | 1.66 | B |
| Example 103 | PET film (16 μm) | Material-4 | 5 μm | 1.53 | 5.24 | Material-42 | 87 nm | 1.61 | B |
| Example 104 | PET film (16 μm) | Material-5 | 6 μm | 1.51 | 8.92 | Material-43 | 103 nm | 1.65 | A |
| Example 105 | PET film (25 μm) | Material-6 | 7 μm | 1.51 | 1.85 | Material-44 | 96 nm | 1.63 | B |
| Example 106 | PET film (28 μm) | Material-7 | 8 μm | 1.51 | 5.62 | Material-45 | 110 nm | 1.65 | A |
| Example 107 | PET film (20 μm) | Material-10 | 10 μm | 1.52 | 4.82 | Material-46 | 95 nm | 1.65 | A |

TABLE 4-continued

| | Temporary support Kind (thickness) | Curable transparent resin layer | | | Melt viscosity $\eta c$ at 100° C. ($\times 10^3$ Pa·s) | Second transparent resin layer | | | Incorporation of air bubbles during lamination on base material having elevation difference |
|---|---|---|---|---|---|---|---|---|---|
| | | Material | Thickness | Refractive index | | Material | Thickness | Refractive index | |
| Example 108 | PET film (20 μm) | Material-11 | 12 μm | 1.52 | 4.95 | Material-47 | 103 nm | 1.67 | A |
| Example 109 | PETfilm (28 μm) | Material-12 | 6 μm | 1.52 | 1.88 | Material-48 | 85 nm | 1.69 | B |
| Example 110 | PETfilm (16 μm) | Material-8 | 9 μm | 1.51 | 4.95 | Material-49 | 89 nm | 1.71 | A |

It was found from Table 4 that, in the transfer film of the present invention, the temporary support and the curable transparent resin layer were in direct contact with each other and it was possible to prevent the incorporation of air bubbles during lamination on the base material having an elevation difference.

Meanwhile, in Examples 101 to 110, it was confirmed that, in a case in which the transportation speed was set to 4.0 m/minute during the lamination of the transfer film of the present invention, the number of air bubbles incorporated into the region along the elevation difference was almost the same as that in a case in which the transportation speed was 2.0 m/minute.

Examples 201 to 210: Production of Laminates

Laminates including a transparent electrode pattern were produced using the transfer films of Examples 101 to 110, which had been obtained above, according to the following method.

<1. Formation of Transparent Film>

A transparent film having a refractive index of 1.60 and a film thickness of 80 nm, for which T1 shown in Table 1 was used, was produced on a glass transparent substrate (a glass substrate) having a refractive index of 1.51 according to the following method.

(Production of Transfer Material)

A coating fluid for a thermoplastic resin layer made of the following formulation H1 was applied on a polyethylene terephthalate film (a temporary support) having a thickness of 75 μm using a slit-shaped nozzle and was dried, thereby forming a thermoplastic resin layer. Next, a coating fluid for an interlayer made of the following formulation P1 was applied on the thermoplastic resin layer and was dried, thereby forming an interlayer.

Furthermore, a coating fluid T1 for a transparent curable composition was applied and dried, thereby forming a transparent resin layer. The thermoplastic resin layer having a dried film thickness of 15.1 μm, the interlayer having a dried film thickness of 1.6 μm, and the transparent resin layer having a dried film thickness of 80 nm were provided on the temporary support in the above-described manner.

Finally, a protective film (a polypropylene film having a thickness of 12 μm) was pressed on the transparent resin layer. A transfer material in which the temporary support, the thermoplastic resin layer, the interlayer (an oxygen-blocking film), the transparent resin layer, and the protective film had been integrated together was produced in the above-described manner.

(Coating Fluid for Thermoplastic Resin Layer: Formulation H1)

Methanol: 11.1 parts by mass

Propylene glycol monomethyl ether acetate: 6.36 parts by mass

Methyl ethyl ketone: 52.4 parts by mass

Methyl methacrylate/2-ethylhexyl acrylate/benzyl methacrylate/methacrylic acid copolymer (copolymerization compositional ratio (molar ratio)=55/11.7/4.5/28.8, a weight-average molecular weight=100,000, Tg (glass transition temperature)≈70° C.): 5.83 parts by mass Styrene/acrylic acid copolymer (copolymerization compositional ratio (molar ratio)=63/37, a weight-average molecular weight=10,000, Tg≈100° C.): 13.6 parts by mass Monomer 1 (trade name: BPE-500, manufactured by Shin-Nakamura Chemical Co., Ltd.): 9.1 parts by mass Fluorine-based polymer: 0.54 parts by mass The fluorine-based polymer is a copolymer of $C_6F_{13}CH_2CH_2OCOCH{=}CH_2$ (40 parts), $H(OCH(CH_3)CH_2)_7OCOCH{=}CH_2$ (55 parts), and $H(OCHCH_2)_7OCOCH{=}CH_2$ (5 parts) and is a solution of 30% by mass of methyl ethyl ketone having a weight-average molecular weight of 30,000 (trade name: MEGAFAC F-780F, manufactured by DIC Corporation).

(Coating Fluid for Interlayer: Formulation P1)

Polyvinyl alcohol: 32.2 parts by mass (trade name: PVA205, manufactured by Kuraray Co., Ltd., a degree of saponification=88%, a degree of polymerization 550)

Polyvinyl pyrrolidone: 14.9 parts by mass (trade name: K-30, manufactured by ISB Corporation)

Distilled water: 524 parts by mass

Methanol: 429 parts by mass

TABLE 5

(Coating fluid for transparent curable composition: Formulation T1)

| Material | Parts by mass |
|---|---|
| NANON 5 Z010: $ZrO_2$ particles MEK dispersion liquid (non-volatile component: 30%) manufactured by Solar Co., Ltd. | 2.08 |
| DPHA liquid (dipentaerythritol hexaacrylate: 38%, dipentaerythritol pentaacrylate: 38%, 1-methoxy-2-propylacetate: 24%) | 0.29 |

TABLE 5-continued (Coating fluid for transparent curable composition: Formulation T1)

| Material | Parts by mass |
|---|---|
| Monomer mixture (polymerizable compound (b2-1) described in Paragraph "0111" of JP2012-78528A, n = 1: tripentaerythritol octaacrylate with content ratio of 85%, as impurities, the total of n = 2 and n = 3 is 15%) | 0.36 |
| Urethane-based monomer: UK OLIGO UA-32P manufactured by Shin-Nakamura Chemical Co, Ltd., non-volatile component: 75%, 1-methoxy-2-propylacetate: 25% | 0.14 |
| Polymer solution 1 (structural formula P-25 described in Paragraph "0061" of JP2008-146018A, weight-average molecular weight of 35,000, solid content: 45%, 1-methoxy-2-propyl acetate: 15%, 1-methoxy 2-propanol: 40%) | 1.89 |
| Light radical-polymerization initiator: 2-benzyl-2-dimethylamino-1-(4-morpholinophenyl)-butanone (Irgacure 379, manufactured by BASF SE) | 0.03 |
| Photopolymerization initiator: KAYACURE DETX-S (alkyl thioxanthone manufactured by Nippon Kayaku Co., Ltd.) | 0.03 |
| Surfactant (trade name: MEGAFACE F-784F, manufactured by DIC Corporation) | 0.010 |
| 1-Methoxy-2-propyl acetate | 38.73 |
| Methyl ethyl ketone | 56.8 |
| Total (parts by mass) | 100 |

(Formation of Transparent Film)

After the transparent resin layer was transferred onto the glass transparent substrate together with the thermoplastic resin, the interlayer, and the PET temporary support using the transfer material from which the protective film had been peeled, the PET temporary support was peeled. Next, the full surface of the subject was exposed from the thermoplastic resin layer side with i rays at 40 mJ/cm$^2$ using a proximity-type exposure having an ultrahigh-pressure mercury lamp (manufactured by Hitachi High Technologies Electronic Engineering Co., Ltd.). Next, the subject was shower-developed at 30° C. and a flat nozzle pressure of 0.04 MPa for 60 seconds using a triethanol amine-based developer (containing 30% of triethanol amine, a liquid obtained by diluting T-PD2 (trade name, manufactured by Fujifilm Corporation) ten times with pure water (by mixing 1 part of T-PD2 and 9 parts of pure water)), thereby removing the thermoplastic resin and the interlayer. Subsequently, the liquid was drained by blowing the air to the top surface (the transparent resin layer side) of the glass transparent substrate, then, pure water was blown for ten seconds by means of showering, the subject was cleaned by means of pure-water showering, and the number of liquid pockets on the glass transparent substrate was decreased by blowing the air. Next, a heating treatment (post baking) was carried out on the glass transparent substrate at 230° C. for 60 minutes so as to heat and cure the transparent resin layer, thereby producing a transparent film, and a substrate having the transparent film laminated on the glass transparent substrate was obtained.

<2. Formation of Transparent Electrode Pattern>

The substrate having the transparent film laminated on the glass transparent substrate, which had been obtained above, was introduced into a vacuum chamber and an ITO thin film having a thickness of 100 nm and a refractive index of 1.82 was formed by means of DC magnetron sputtering (conditions: the temperature of the base material: 250° C., the argon pressure: 0.13 Pa, and the oxygen pressure: 0.01 Pa) using an ITO target (indium:lead=95:5 (molar ratio)) in which the content ratio of SnO$_2$ was 10% by mass, thereby obtaining a front plate in which the transparent electrode layer had been formed. The surface electrical resistance of the ITO thin film was 80Ω/□.

(Production of Photosensitive Film E1 for Etching)

A coating fluid for a thermoplastic resin layer having the formulation H1 was applied on a polyethylene terephthalate film (a temporary support) having a thickness of 75 µm using a slit-shaped nozzle and was dried, thereby forming a thermoplastic resin layer. Next, the coating fluid for an interlayer made of the above-described formulation P1 was applied on the thermoplastic resin layer and was dried, thereby forming an interlayer.

Furthermore, a coating fluid for a light-curable resin layer for etching (a formulation E1) was applied and dried, thereby forming a light-curable resin layer for etching. Therefore, a laminate including the thermoplastic resin layer having a dried film thickness of 15.1 µm, the interlayer having a dried film thickness of 1.6 µm, and the light-curable resin layer for etching having a film thickness of 2.0 µm was obtained on the temporary support in the above-described manner. Finally, a protective film (a polypropylene film having a thickness of 12 µm) was pressed on the light-curable resin layer for etching. A transfer material in which the temporary support, the thermoplastic resin layer, the interlayer (an oxygen-blocking film), and the light-curable resin layer for etching had been integrated together was produced in the above-described manner.

(Coating Fluid for Light-curable Resin Layer for Etching: Formulation E1)

Methyl methacrylate/styrene/methacrylic acid copolymer (copolymerization composition (% by mass)=31/40/29, a weight-average molecular weight=60,000, acid value: 163 mgKOH/g): 16 parts by mass Monomer 1 (trade name: BPE-500, manufactured by Shin-Nakamura Chemical Co., Ltd.): 5.6 parts by mass Tetraethyleneoxide monomethacrylate 0.5 mol adduct of hexamethylene diisocynate: 7 parts by mass Cyclohexanedimethanol monoacrylate as a compound having one polymerizable group in the molecule: 2.8 parts by mass 2-Chloro-N-butyl acridone: 0.42 parts by mass 2,2-Bis(olt-chlorophenyl)-4,4',5,5'-tetraphenyl biimidazole: 2.17 parts by mass Malachite green oxalate: 0.02 parts by mass Leuco crystal violet: 0.26 parts by mass Phenothiazine: 0.013 parts by mass Surfactant (trade name: MEGAFAC F-780F, manufactured by DIC Corporation): 0.03 parts by mass Methyl ethyl ketone: 40 parts by mass 1-Methoxy-2-propanol: 20 parts by mass Meanwhile, the viscosity of the coating fluid for the light-curable resin layer for etching (the formulation E1) at 100° C. after the removal of the solvent was 2,500 Pa·sec.

(Formation of Transparent Electrode Pattern)

The front plate in which the transparent electrode layer had been formed was cleaned, and the photosensitive film E1 for etching, from which the protective film had been removed, was laminated thereon (a base material temperature of 130° C., a rubber roller temperature of 120° C., a linear pressure of 100 N/cm, and a transportation speed of 2.2 m/minute). After the temporary support was peeled, the distance between the surface of an exposure mask (a silica exposure mask having a transparent electrode pattern) and the light-curable resin layer for etching was set to 200 μm, and the pattern was exposed at an exposure amount of 50 mJ/cm$^2$ (i rays).

Next, a development treatment was carried out at 25° C. for 100 seconds using a triethanol amine-based developer (containing 30% of triethanol amine, a liquid obtained by diluting T-PD2 (trade name, manufactured by Fujifilm Corporation) ten times with pure water) and a cleaning treatment was carried out at 33° C. for 20 seconds using a surfactant-containing cleaning fluid (a liquid obtained by diluting T-SD3 (trade name, manufactured by Fujifilm Corporation) ten times with pure water). The cleaned front plate was rubbed with a rotary brush and, furthermore, residue was removed by spraying ultrapure water onto the front plate from an ultrahigh-pressure cleaning nozzle. Next, a post baking treatment was carried out at 130° C. for 30 minutes, thereby obtaining the front plate in which the transparent electrode layer and the light-curable resin layer pattern for etching were formed.

The front plate in which the transparent electrode layer and the light-curable resin layer pattern for etching were formed was immersed in an etching tank filled with an ITO etchant (an aqueous solution of hydrochloric acid and potassium chloride, a liquid temperature of 30° C.), a treatment (an etching treatment) was carried out for 100 seconds, and the transparent electrode layer in exposed regions which were not covered with the light-curable resin layer for etching was dissolved and removed, thereby obtaining a transparent electrode layer pattern-including front plate to which the light-curable resin layer pattern for etching was added.

Next, the transparent electrode layer pattern-including front plate to which the light-curable resin layer pattern for etching was added was immersed in a resist peeling tank filled with a resist peeling fluid (N-methyl-2-pyrrolidone, ethanolamine, a surfactant (trade name: SURFYNOL 465, manufactured by Air Products and Chemicals, Inc.), a liquid temperature of 45° C.), a treatment (a peeling treatment) was carried out for 200 seconds, and the light-curable resin layer for etching was removed, thereby obtaining a substrate having the transparent film and the transparent electrode pattern formed on the glass transparent substrate.

After the end portion of the transparent electrode pattern was coated with Pt (in a thickness of approximately 20 nm) so as to impart conductivity and protect the surface, the shape of the end portion of the transparent electrode pattern was observed (a secondary electronic image, an accelerated voltage of 20 kV) using a Nova200-type FIB/SEM complex machine manufactured by FEI Company.

The formed ITO pattern had a taper shape as illustrated in FIG. 10, and the taper angle α was approximately 3°.

<3. Formation of Curable Transparent Resin Layer and Second Transparent Resin Layer>

The transfer film of any of Examples 101 to 110, from which the protective film had been removed, was laminated on the substrate having the transparent film and the transparent electrode pattern formed on the glass transparent substrate, which had been obtained above (a rubber roller temperature of 110° C., a linear pressure of 100 N/cm, and a transportation speed of 2.0 m/minute). The distance between the surface of an exposure mask (a silica exposure mask having a pattern for forming an overcoat) and the temporary support was set to 125 μm, and the pattern was exposed at an exposure amount of 100 mJ/cm$^2$ (i rays) through the temporary support. After the temporary support was peeled, a cleaning treatment was carried out at 32° C. for 60 seconds using a 2% aqueous solution of sodium carbonate. The cleaned front plate was rubbed with a rotary brush and, furthermore, residue was removed by spraying ultrapure water onto the front plate from an ultrahigh-pressure cleaning nozzle. Subsequently, moisture on the base material was removed by blowing the air, and a post baking treatment was carried out at 145° C. for 30 minutes, thereby producing a laminate in which the transparent film, the transparent electrode pattern, the second transparent resin layer, and the curable transparent resin layer were continued on the glass transparent substrate in this order.

Therefore, a laminate in which the transparent film, the transparent electrode pattern, the second transparent resin layer, and the curable transparent resin layer were laminated on the glass transparent substrate in this order was obtained. The obtained laminate was used as laminates in Examples 201 to 210.

<Evaluation of Laminates>

(Incorporation of Air Bubbles During Lamination on Base Material Having Elevation Difference)

In the manufacturing of the laminates of Examples 201 to 210 in which the transparent electrode pattern served as an elevation difference within the scope of the present invention and no additional conductive element was provided, the incorporation of air bubbles during lamination on the base material having an elevation difference was evaluated in the same manner as in Example 1. The obtained results have the same tendency as that in Examples 101 to 110, and it was found that, in the transfer film of the present invention, the temporary support and the curable transparent resin layer were in direct contact with each other and it was possible to prevent the incorporation of air bubbles during lamination on the base material having an elevation difference.

The laminates in the respective examples also did not have any problem of the transparent electrode pattern being visible.

[Manufacturing of Electrostatic Capacitance-Type Input Devices of Examples 301 to 310]

[Formation of Mask Layer]

<Production of Photosensitive Film K1 for Forming Mask Layer>

A coating fluid for a thermoplastic resin layer made of the formulation H1 was applied on a polyethylene terephthalate film (a temporary support) having a thickness of 75 μm using a slit-shaped nozzle and was dried, thereby forming a thermoplastic resin layer. Next, a coating fluid for an interlayer made of the above-described formulation P1 was applied on the thermoplastic resin layer and was dried, thereby forming an interlayer. Furthermore, a coating fluid for a black light-curable resin layer made of the following formulation K1 was applied and dried, thereby forming a black light-curable resin layer. The thermoplastic resin layer having a dried film thickness of 15.1 μm, the interlayer having a dried film thickness of 1.6 μm, and the black light-curable resin layer having a dried film thickness of 2.2 μm so as to obtain an optical density of 4.0 were provided on the temporary support in the above-described manner, and, finally, a protective film (a polypropylene film having a thickness of 12 μm) was pressed thereon. A transfer material in which the temporary support, the thermoplastic resin layer, the interlayer (an oxygen-blocking film), and the black light-curable resin layer had been integrated together was produced in the above-described manner, and the sample was named as a photosensitive film K1 for forming a mask layer.

(Coating Fluid for Black Light-curable Resin Layer: Formulation K1)

K pigment dispersion 1: 31.2 parts by mass
R pigment dispersion 1 (the following composition): 3.3 parts by mass
MMPGAc (propylene glycol monomethyl ether acetate, manufactured by Daicel Chemical industries, Ltd.): 6.2 parts by mass
Methyl ethyl ketone (manufactured by TonenGeneral Sekiyu K.K.): 34.0 parts by mass
Cyclohexanone (manufactured by Kanto Denka Kogyo Co., Ltd.): 8.5 parts by mass
Binder 2 (a random copolymer of benzyl methacrylate and methacrylic acid in a molar ratio of 78/22, a weight-average molecular weight of 38,000): 10.8 parts by mass
Phenothiazine (manufactured by Tokyo chemical Industry Co., Ltd.): 0.01 parts by mass
A propylene glycol monomethyl ether acetate solution (76% by mass) of dipentaerythritol hexaacrylate (DPHA, manufactured by Nippon Kayaku Co., Ltd.): 5.5 parts by mass
2,4-Bis(trichloromethyl)-6-[4'-(N,N-bis(ethoxycarbonyl-methyl)amino-3'-bromophneyl]-s-triazine: 0.4 parts by mass
Surfactant (trade name: MEGAFAC F-780F, manufactured by DIC Corporation): 0.1 parts by mass Meanwhile, the viscosity of the coating fluid for the black light-curable resin layer made of the formulation K1 at 100° C. after the removal of the solvent was 10,000 Pa·sec.

(Composition of K Pigment Dispersion 1)
Carbon black (trade name: Nipex35, manufactured by Evonik Industries): 13.1% by mass
The following dispersant 1: 0.65% by mass
Binder 1 (a random copolymer of benzyl methacrylate and methacrylic acid in a molar ratio of 72/28, a weight-average molecular weight of 37,000): 6.72 parts by mass
Propylene glycol monomethyl ether acetate: 79.53% by mass Dispersant 1

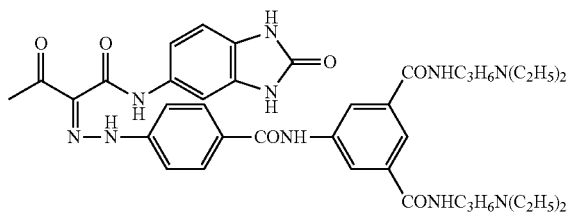

—Composition of R Pigment Dispersion 1—
Pigment (C. I. (Colour Index International) Pigment Red 177): 18% by mass
Binder 1 (a random copolymer of benzyl methacrylate and methacrylic acid in a molar ratio of 72/28, a weight-average molecular weight of 37,000): 12 parts by mass
Propylene glycol monomethyl ether acetate: 70% by mass <Formation of Mask Layer>

Next, reinforced glass (300 mm×400 mm×0.7 mm) having an opening portion (15 mmϕ) was cleaned using a rotary brush having nylon hairs while a glass cleaning agent having a temperature adjusted to 25° C. was blown thereto by means of showering for 20 seconds, was cleaned by means of pure water showering, and then was cleaned by means of pure water showering by blowing a silane coupling liquid (a 0.3% by mass aqueous solution of N-β(aminoethyl)γ-aminopropyltrimethoxysilane, trade name: KBM603, manufactured by Shin-Etsu Chemical Co., Ltd.) by means of showering for 20 seconds. This base material was heated at 140° C. for two minutes in a base material-preheating device.

The protective film was removed from the photosensitive film K1 for forming the mask layer, which had been obtained above, and the photosensitive film was superimposed on the obtained silane-coupled glass base material so that the surface of the black light-curable resin layer, which was exposed after the removal of the protective film, and the surface of the silane-coupled glass base material came into contact with each other and was laminated on the base material which had been heated at 140° C. using a laminator (manufactured by Hitachi Industries Co., Ltd. (Lamic II-type)) at a rubber roller temperature of 130° C., a linear pressure of 100 N/cm, and a transportation speed of 2.2 m/minute. Subsequently, the polyethylene terephthalate temporary support was peeled at the interface with the thermoplastic resin layer, thereby removing the temporary support. After the peeling of the temporary support, the distance between the surface of the exposure mask and the black light-curable resin layer was set to 200 μm in a state in which the base material and a exposure mask (a silica exposure mask having a trim pattern) stood upright using a proximity-type exposure having an ultrahigh-pressure mercury lamp (manufactured by Hitachi High Technologies Electronic Engineering Co., Ltd.), and the pattern was exposed at an exposure amount of 70 mJ/cm² (i rays).

Next, shower development was carried out at 33° C. and a flat nozzle pressure of 0.1 MPa for 60 seconds using a triethanol amine-based developer (containing 30% of triethanol amine, a liquid obtained by diluting T-PD2 (trade name, manufactured by Fujifilm Corporation) ten times with pure water) and the thermoplastic resin layer and the interlayer were removed. Subsequently, the liquid was drained by blowing the air to the top surface of the glass base material, then, the subject was cleaned by means of pure-water showering by blowing pure water for ten seconds by means of showering, and the number of liquid pockets on the base material was decreased by blowing the air.

After that, the shower pressure was set to 0.1 MPa at 32° C. using a sodium carbonate/sodium hydrogen carbonate-based developer (a liquid obtained by diluting T-CD1 (trade name, manufactured by Fujifilm Corporation) with pure water five times), development was carried out for 45 seconds, and the subject was cleaned with pure water.

Subsequently, a surfactant-containing cleaning fluid (a liquid obtained by diluting T-SD3 (trade name, manufactured by Fujifilm Corporation) ten times with pure water) was blown at 33° C. and a cone-type nozzle pressure of 0.1 MPa for 20 seconds, and residue was removed by rubbing the formed pattern image using a rotary brush having softer nylon hairs. Furthermore, residue was removed by spraying the fluid at a pressure of 9.8 MPa in an ultrahigh-pressure cleaning nozzle.

Next, post exposure was carried out in the atmosphere at an exposure amount of 1,300 mJ/cm², and furthermore, a post baking treatment was carried out at 240° C. for 80 minutes, thereby obtaining a front plate in which a mask layer having an optical density of 4.0 and a film thickness of 2.0 µm was formed.

[Transparent Film]

A transparent film was produced on the front plate in which the mask layer had been formed in the same manner as in the production of the transparent film on the glass transparent substrate in the formation of the laminate.

[Formation of First Transparent Electrode Pattern]

<Formation of Transparent Electrode Layer>

The front plate having the mask layer and the transparent film was introduced into a vacuum chamber and an ITO thin film having a thickness of 40 nm was formed by means of DC magnetron sputtering (conditions: the temperature of the base material: 250° C., the argon pressure: 0.13 Pa, and the oxygen pressure: 0.01 Pa) using an ITO target (indium:lead=95:5 (molar ratio)) in which the content ratio of $SnO_2$ was 10% by mass, thereby obtaining a front plate in which the transparent electrode layer had been formed. The surface electrical resistance of the ITO thin film was 80Ω/□.

<Production of Photosensitive Film E1 for Etching>

The photosensitive film E1 for etching was obtained in the same manner as in the production of the photosensitive film K1 for forming the mask layer except for the fact that, in the production of the photosensitive film K1 for forming the mask layer, the coating fluid for the black light-curable resin layer was changed to the coating fluid for the light-curable resin layer for etching made of the formulation E1 (the film thickness of the light-curable resin layer for etching was 2.0 µm).

(Coating Fluid for Light-curable Resin Layer for Etching: Formulation E1)

Methyl methacrylate/styrene/methacrylic acid copolymer (copolymerization composition (% by mass)=31/40/29, a weight-average molecular weight=60,000, acid value: 163 mgKOH/g): 16 parts by mass Monomer 1 (trade name: BPE-500, manufactured by Shin-Nakamura Chemical Co., Ltd.): 5.6 parts by mass Tetraethyleneoxide monomethacrylate 0.5 mol adduct of hexamethylene diisocynate: 7 parts by mass Cyclohexanedimethanol monoacrylate as a compound having one polymerizable group in the molecule: 2.8 parts by mass 2-Chloro-N-butyl acridone: 0.42 parts by mass 2,2-Bis(olt-chlorophenyl)-4,4',5,5'-tetraphenyl biimidazole: 2.17 parts by mass Malachite green oxalate: 0.02 parts by mass Leuco crystal violet: 0.26 parts by mass Phenothiazine: 0.013 parts by mass Surfactant (trade name: MEGAFAC F-780F, manufactured by DIC Corporation): 0.03 parts by mass Methyl ethyl ketone: 40 parts by mass 1-Methoxy-2-propanol: 20 parts by mass Meanwhile, the viscosity of the coating fluid for the light-curable resin layer for etching made of the formulation E1 at 100° C. after the removal of the solvent was 2,500 Pa·sec.

<Formation of First Transparent Electrode Pattern>

The front plate in which the mask layer, the transparent film, and the transparent electrode layer had been formed was cleaned in the same manner as in the formation of the mask layer, and then the photosensitive film E1 for etching, from which the protective film had been removed, was laminated thereon (a base material temperature of 130° C., a rubber roller temperature of 120° C., a linear pressure of 100 N/cm, and a transportation speed of 2.2 m/minute). After the temporary support was peeled, the distance between the surface of an exposure mask (a silica exposure mask having a transparent electrode pattern) and the light-curable resin layer for etching was set to 200 pun, and the pattern was exposed at an exposure amount of 50 mJ/cm² (i rays).

Next, a development treatment was carried out at 25° C. for 100 seconds using a triethanol amine-based developer (containing 30% of triethanol amine, a liquid obtained by diluting T-PD2 (trade name, manufactured by Fujifilm Corporation) ten times with pure water) and a cleaning treatment was carried out at 33° C. for 20 seconds using a surfactant-containing cleaning fluid (a liquid obtained by diluting T-SD3 (trade name, manufactured by Fujifilm Corporation) ten times with pure water). The cleaned front plate was rubbed with a rotary brush and, furthermore, residue was removed by spraying ultrapure water onto the front plate from an ultrahigh-pressure cleaning nozzle. Next, a post baking treatment was carried out at 130° C. for 30 minutes, thereby obtaining the front plate in which the transparent electrode layer and the light-curable resin layer pattern for etching were formed.

The front plate in which the transparent electrode layer and the light-curable resin layer pattern for etching were formed was immersed in an etching tank filled with an ITO etchant (an aqueous solution of hydrochloric acid and potassium chloride, a liquid temperature of 30° C.), a treatment (an etching treatment) was carried out for 100 seconds, and the transparent electrode layer in exposed regions which were not covered with the light-curable resin layer for etching was dissolved and removed, thereby obtaining a transparent electrode layer pattern-including front plate to which the light-curable resin layer pattern for etching was added.

Next, the transparent electrode layer pattern-including front plate to which the light-curable resin layer pattern for etching was added was immersed in a resist peeling tank filled with a resist peeling fluid (N-methyl-2-pyrrolidone, ethanolamine, a surfactant (trade name: SURFYNOL 465, manufactured by Air Products and Chemicals, Inc.), a liquid temperature of 45° C.), a treatment was carried out for 200 seconds, and the light-curable resin layer for etching was removed, thereby obtaining a front plate having the mask layer, the transparent film, and the first transparent electrode pattern.

[Formation of Insulating Layer]

<Production of Photosensitive Film W1 for Forming Insulating Layer>

A photosensitive film W1 for forming an insulating layer was obtained in the same manner as in the production of the photosensitive film K1 for forming the mask layer except for the fact that, in the production of the photosensitive film K1 for forming the mask layer, the coating fluid for the black light-curable resin layer was changed to the coating fluid for an insulating layer made of the following formulation W1 (the film thickness of the insulating layer was 1.4 µm).

(Coating Fluid for Insulating Layer: Formulation W1)

1-Methoxy-2-propanol of binder 3 (a glycidyl methacrylate adduct (d) of a cyclohexyl methacrylate (a)/methyl methacrylate (b)/methacrylic acid copolymer (c) (composition (% by mass): a/b/c/d=46/1/10/43, a weight-average molecular weight: 36,000, acid value: 66 mgKOH/g)), methyl ethyl ketone solution (solid content: 45%): 12.5 parts by mass A propylene glycol monomethyl ether acetate solution (76% by mass) of dipentaerythritol hexaacrylate (DPHA, manufactured by Nippon Kayaku Co., Ltd.): 1.4 parts by mass Urethane-based monomer (trade name: NK OLIGO UA-32P, manufactured by Shin-Nakamura Chemical Co., Ltd., a non-volatile component: 75%, propylene glycol monomethyl acetate: 25%): 0.68 parts by mass Tripentaerythritol octaacrylate (trade name: V#802, manufactured by Osaka Organic Chemical Industry Ltd.): 1.8 parts by mass Diethyl thioxanthone: 0.17 parts by mass.

2-(Dimethylamino)-2-[(4-methylphenyl)methyl]-1-[4-(4-morpholinyl)phenyl]-1-butanone (trade name: IRGA-CURE 379, manufactured by BASF): 0.17 parts by mass Dispersant (trade name: SOLSPERSE 20000, manufactured by Lubrizol): 0.19 parts by mass Surfactant (trade name: MEGAFAC F-780F, manufactured by DIC Corporation): 0.05 parts by mass Methyl ethyl ketone: 23.3 parts by mass MMPGAc (propylene glycol monomethyl ether acetate, manufactured by Daicel Chemical industries, Ltd.): 59.8 parts by mass Meanwhile, the viscosity of the coating fluid for forming the insulating layer made of the formulation W1 at 100° C. after the removal of the solvent was 4,000 Pa·sec.

The mask layer, the transparent film, and the first transparent electrode pattern-including front plate were cleaned and silane-coupled in the same manner as in the formation of the mask layer, and then the photosensitive film W1 for forming the insulating layer, from which the protective film had been removed, was laminated (a base material temperature of 100° C., a rubber roller temperature of 120° C., a linear pressure of 100 N/cm, and a transportation speed of 2.3 m/minute). After the temporary support was peeled, the distance between the surface of an exposure mask (a silica exposure mask having a pattern for the insulating layer) and the insulating layer was set to 100 μm, and the pattern was exposed at an exposure amount of 30 mJ/cm² (i rays).

Next, a development treatment was carried out at 33° C. for 60 seconds using a triethanol amine-based developer (containing 30% of triethanol amine, a liquid obtained by diluting T-PD2 (trade name, manufactured by Fujifilm Corporation) ten times with pure water), furthermore, a development treatment was carried out at 25° C. for 50 seconds using a sodium carbonate/sodium hydrogen carbonate-based developer (a liquid obtained by diluting T-CD1 (trade name, manufactured by Fujifilm Corporation) with pure water five times), and a cleaning treatment was carried out at 33° C. for 20 seconds using a surfactant-containing cleaning fluid (a liquid obtained by diluting T-SD3 (trade name, manufactured by Fujifilm Corporation) ten times with pure water). The cleaned front plate was rubbed with a rotary brush and, furthermore, residue was removed by spraying ultrapure water onto the front plate from an ultrahigh-pressure cleaning nozzle. Next, a post baking treatment was carried out at 230° C. for 60 minutes, thereby obtaining the front plate in which the mask layer, the transparent film, the first transparent electrode pattern, and the insulating layer pattern were formed.

[Formation of Second Transparent Electrode Pattern]

<Formation of Transparent Electrode Layer>

A DC magnetron sputtering treatment (conditions: the temperature of the base material: 50° C., the argon pressure: 0.13 Pa, and the oxygen pressure: 0.01 Pa) was carried out on the front plate in which the mask layer, the transparent film, the first transparent electrode pattern, and the insulating layer pattern were formed in the same manner as in the formation of the first transparent electrode pattern so as to form an ITO thin film having a thickness of 80 nm, thereby obtaining a front plate in which the transparent electrode layer had been formed. The surface electrical resistance of the ITO thin film was 110Ω/□.

A front plate in which the mask layer, the transparent film, the first transparent electrode pattern, the insulating layer pattern, the transparent electrode layer, and the light-curable resin layer pattern for etching had been formed was obtained using the photosensitive film E1 for etching in the same manner as in the formation of the first transparent electrode pattern (a post baking treatment: 130° C. for 30 minutes).

Furthermore, etching (30° C. for 50 seconds) was carried out in the same manner as in the formation of the first transparent electrode pattern, and then the light-curable resin layer pattern for etching was removed (45° C. for 200 seconds), thereby obtaining a front plate in which the mask layer, the transparent film, the first transparent electrode pattern, the insulating layer pattern, and the second transparent electrode pattern had been formed.

[Formation of Additional Conductive Element Other than First and Second Transparent Electrode Patterns]

A DC magnetron sputtering treatment was carried out on the front plate in which the mask layer, the transparent film, the first transparent electrode pattern, the insulating layer pattern, and the second transparent electrode pattern had been formed in the same manner as in the formation of the first and second transparent electrode patterns, thereby obtaining a front plate in which an aluminum (Al) thin film having a thickness of 200 nm was formed.

A front plate in which the mask layer, the transparent film, the first transparent electrode pattern, the insulating layer pattern, the second transparent electrode pattern, and the light-curable resin layer pattern for etching had been formed was obtained using the photosensitive film E1 for etching in the same manner as in the formation of the first and second transparent electrode patterns (a post baking treatment: 130° C. for 30 minutes).

Furthermore, etching (30° C. for 50 seconds) was carried out in the same manner as in the formation of the first transparent electrode pattern, and then the light-curable resin layer pattern for etching was removed (45° C. for 200 seconds), thereby obtaining a front plate in which the mask layer, the transparent film, the first transparent electrode pattern, the insulating layer pattern, the second transparent electrode pattern, and the additional conductive element other than the first and second transparent electrode patterns had been formed.

[Curable Transparent Resin Layer and Second Transparent Resin Layer]

A film was produced by transferring the curable transparent resin layer and the second transparent resin layer from the transfer film of each of the example in the same manner as in the manufacturing of the laminates of the respective examples except for the fact that, in the manufacturing of the laminates of the respective examples, the front plate in which the mask layer, the transparent film, the first transparent electrode pattern, the insulating layer pattern, the second transparent electrode pattern, and the additional conductive element other than the first and second transparent electrode patterns had been formed was used instead of the substrate on which the transparent film and the transparent electrode pattern had been formed on the glass transparent substrate, thereby obtaining an electrostatic capacitance-type input device (a front plate) of each of the examples in which the mask layer, the transparent film, the first transparent electrode pattern, the insulating layer pattern, the second transparent electrode pattern, the additional conductive element other than the first and second transparent electrode patterns, the curable transparent resin layer, and the second transparent resin layer had been formed in this order on the glass transparent substrate. Meanwhile, the second transparent resin layer and the curable transparent resin layer were patterned by means of pattern-exposure and development so as not to be formed on portions in which the mask layer had been formed and above the terminal portion of the guidance wire.

[Production of Image Display Device (Touch Panel)]

The electrostatic capacitance-type input device (the front plate) of each of the examples which had been previously manufactured was attached to a liquid crystal display device manufactured using the method described in JP2009-47936A, thereby producing an image display device of each of the examples including the electrostatic capacitance-type input device as a constituent element using a well-known method.

<<Evaluation of Front Plate and Image Display Device>>

In the manufacturing of the laminates of Examples 301 to 310 in which the transparent electrode pattern was an elevation difference outside the scope of the present invention and the additional conductive element was an elevation difference within the scope of the present invention, the incorporation of air bubbles during lamination on the base material having the elevation difference was evaluated in the same manner as in Example 1. The obtained results had the same tendency as that in Examples 101 to 110, and it was found that, in the transfer film of the present invention, the temporary support and the curable transparent resin layer were in direct contact with each other and it was possible to prevent the incorporation of air bubbles during lamination on the base material having an elevation difference.

The electrostatic capacitance-type input devices and the image display devices of the respective examples did not have any problem of the transparent electrode pattern being visible.

In the respective steps described above, the front plate in which the mask layer, the transparent film, the first transparent electrode pattern, the insulating layer pattern, the second transparent electrode pattern, the additional conductive element other than the first and second transparent electrode patterns, the curable transparent resin layer, and the second transparent resin layer had been formed did not contaminate the opening portion and the rear surface (the non-touch surface), was easily cleaned, and had no problems of contaminating other members.

In addition, the mask layer did not have any pin holes and was excellent in terms of light-shielding properties.

In addition, the first transparent electrode pattern, the second transparent electrode pattern, and the additional conductive element other than the first and second transparent electrode patterns did not have any problem with conductivity, and the first transparent electrode pattern and the second transparent electrode pattern were insulated from each other.

Furthermore, the curable transparent resin layer also did not have any defects such as air bubbles, and image display devices having excellent display characteristics were obtained.

EXPLANATION OF REFERENCES

1: transparent substrate (front plate)
1A: film base material
2: mask layer
3: transparent electrode pattern (first transparent electrode pattern)
3a: pad portion
3b: connection portion
4: transparent electrode pattern (second transparent electrode pattern)
5: insulating layer
6: additional conductive element
7: curable transparent resin layer (which preferably has any functions of an overcoat layer or a transparent protective layer)
8: opening portion
10: electrostatic capacitance-type input device
11: transparent film
12: second transparent resin layer (refractive index-adjusted layer, which may have a function of a transparent insulating layer)
13: laminate
21: region in which the transparent electrode pattern, the second transparent resin layer, and the curable transparent resin layer are laminated in this order
22: non-patterned region
α: taper angle
26: temporary support
29: protective peeling layer (protective film)
30: transfer film
31: terminal portion of guidance wire
33: cured portions of curable transparent resin layer and second transparent resin layer
34: opening portion corresponding to the terminal portion of the guidance wire (non-cured portions of the curable transparent resin layer and the second transparent resin layer)
41: elevation constituting elevation difference
41a: upper portion of elevation
41b: side portion of elevation
41c: lower portion of elevation
42: lamination direction
43: base material having elevation difference
44: region along elevation difference
C: first direction
D: second direction
θ: angle formed between side portion of elevation constituting elevation difference and substrate

What is claimed is:

1. A transfer film comprising:
a temporary support having a thickness of 38 μm or less; and
a curable transparent resin layer disposed on the temporary support in a direct-contact manner,
wherein the thickness of the curable transparent resin layer is 5μm or more,
the curable transparent resin layer includes a binder polymer, a polymerizable compound, and a polymerization initiator, and
the melt viscosity ηc of the curable transparent resin layer measured at 100° C. is $1.0 \times 10^3$ Pa·s to $8.92 \times 10^3$ Pa·s.

2. The transfer film according to claim 1,
wherein the melt viscosity ηc of the curable transparent resin layer measured at 100° C. is $3.0 \times 10^3$ Pa·s to $8.92 \times 10^3$ Pa·s.

3. The transfer film according to claim 1,
wherein the melt viscosity ηc of the curable transparent resin layer measured at 100° C. is $4.0 \times 10^3$ Pa·s to $8.92 \times 10^3$ Pa·s.

4. The transfer film according to claim 1, further comprising:
a second transparent resin layer on the curable transparent resin layer, wherein the refractive index of the second transparent resin layer is higher than the refractive index of the curable transparent resin layer.

5. A method for manufacturing a laminate, comprising:
a step of laminating the curable transparent resin layer of the transfer film according to claim 1 on a base material having an elevation difference so as to continuously cover at least an upper portion of an elevation constituting the elevation difference and a lower portion of the elevation,
wherein the thickness of the elevation constituting the elevation difference is 100 nm or more.

6. The method for manufacturing a laminate according to claim 5, further comprising:
a step of continuously laminating the curable transparent resin layer from one direction of the base material constituting the elevation difference toward on the upper portion of the elevation constituting the elevation difference and the lower portion of the elevation;
an elevation difference-ascending step of laminating the curable transparent resin layer from the lower portion of the elevation constituting the elevation difference to the upper portion of the elevation in this order; and
an elevation difference-descending step of laminating the curable transparent resin layer from the upper portion of the elevation constituting the elevation difference to the lower portion of the elevation in this order.

7. The method for manufacturing a laminate according to claim 5,
wherein a side portion of the elevation constituting the elevation difference has an inclined structure in which the upper portion of the elevation is narrower than the lower portion of the elevation, and
an angle formed by the side portion of the elevation constituting the elevation difference and the base material is 5° to 90°.

8. The method for manufacturing a laminate according to claim 5,
wherein the elevation constituting the elevation difference includes a conductive element.

9. The method for manufacturing a laminate according to claim 8,
wherein the upper portion of the elevation constituting the elevation difference is an upper portion of the conductive element and the lower portion of the elevation constituting the elevation difference is the base material.

10. The method for manufacturing a laminate according to claim 5,
wherein the base material having the elevation difference includes a transparent electrode pattern and
the method further comprising a step of laminating the curable transparent resin layer on the transparent electrode pattern.

11. The method for manufacturing a laminate according to claim 10,
wherein, in addition to the transparent electrode pattern, an additional conductive element is included and
the elevation constituting the elevation difference is the additional conductive element.

12. The method for manufacturing a laminate according to claim 10,
wherein the elevation constituting the elevation difference is the transparent electrode pattern.

13. The method for manufacturing a laminate according to claim 10,
wherein the transfer film further has a second transparent resin layer on the curable transparent resin layer,
the refractive index of the second transparent resin layer is higher than the refractive index of the curable transparent resin layer, and
the method further comprising a step of laminating the second transparent resin layer and the curable transparent resin layer of the transfer film on the transparent electrode pattern in this order.

14. A laminate manufactured using the method for manufacturing a laminate according to claim 5.

15. An electrostatic capacitance-type input device comprising:
the laminate according to claim 14.

16. An image display device comprising:
the electrostatic capacitance-type input device according to claim 15 as a constituent element.

* * * * *